(12) United States Patent
Meyer et al.

(10) Patent No.: US 7,187,548 B2
(45) Date of Patent: Mar. 6, 2007

(54) POWER CONVERTER HAVING IMPROVED FLUID COOLING

(75) Inventors: Andreas A. Meyer, Richmond Heights, OH (US); Lawrence D. Radosevich, Muskego, WI (US); Bruce C. Beihoff, Wauwatosa, WI (US); Dennis L. Kehl, Milwaukee, WI (US); Daniel G. Kannenberg, Waukesha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 924 days.

(21) Appl. No.: 10/252,318

(22) Filed: Dec. 23, 2002

(65) Prior Publication Data

US 2003/0151893 A1 Aug. 14, 2003

Related U.S. Application Data

(60) Provisional application No. 60/349,259, filed on Jan. 16, 2002.

(51) Int. Cl.
*H05K 7/20* (2006.01)
*F28F 7/00* (2006.01)

(52) U.S. Cl. .................... 361/699; 165/80.4
(58) Field of Classification Search .............. None
See application file for complete search history.

(56) References Cited

U.S. PATENT DOCUMENTS

| | | | |
|---|---|---|---|
| 3,857,044 A | 12/1974 | Papoi et al. | 307/9 |
| 3,918,084 A | 11/1975 | Schierz | 257/714 |
| 4,628,412 A | 12/1986 | Nigorikawa | 361/424 |
| 4,651,066 A | 3/1987 | Gritter et al. | 318/139 |
| 4,757,240 A | 7/1988 | Mizobuchi et al. | 318/52 |
| 4,758,926 A | 7/1988 | Herrell et al. | 361/699 |
| 4,893,590 A | 1/1990 | Kashimura et al. | 123/41.31 |
| 4,899,256 A | 2/1990 | Sway-Tin | 361/715 |
| 5,001,547 A | 3/1991 | Romano | 257/712 |
| 5,091,823 A | 2/1992 | Kanbara et al. | 361/384 |
| 5,111,280 A | 5/1992 | Iversen | 357/82 |
| 5,172,784 A | 12/1992 | Varela, Jr. | 180/65.4 |

(Continued)

FOREIGN PATENT DOCUMENTS

DE 003933956 A1 4/1991

(Continued)

OTHER PUBLICATIONS

RD 417012A "Convector" Abstract Jan. 1999.

*Primary Examiner*—Greg Thompson
(74) *Attorney, Agent, or Firm*—Patrick S. Yoder; Alexander M. Gerasimow

(57) ABSTRACT

A thermal support may receive one or more power electronic circuits. The support may aid in removing heat from the circuits through fluid circulating through the support, which may be controlled in a closed-loop manner. Interfacing between circuits, circuit mounting structure, and the support provide for greatly enhanced cooling. The support may form a shield from both external EMI/RFI and from interference generated by operation of the power electronic circuits. Features may be provided to permit and enhance connection of the circuitry to external circuitry, such as improved terminal configurations. Modular units may be assembled that may be coupled to electronic circuitry via plug-in arrangements or through interface with a backplane or similar mounting and interconnecting structures.

72 Claims, 40 Drawing Sheets

U.S. PATENT DOCUMENTS

| | | | | |
|---|---|---|---|---|
| 5,274,317 | A | 12/1993 | Utley et al. | 318/802 |
| 5,280,228 | A | 1/1994 | Kanouda et al. | 318/803 |
| 5,289,363 | A | 2/1994 | Ferchau et al. | 363/141 |
| 5,291,388 | A | 3/1994 | Heinrich | 363/98 |
| 5,291,960 | A | 3/1994 | Brandenburg et al. | 180/65.2 |
| 5,293,070 | A | 3/1994 | Burgess et al. | 257/714 |
| 5,333,676 | A | 8/1994 | Mizuno | 165/294 |
| 5,347,211 | A | 9/1994 | Jakubowski | 323/351 |
| 5,349,498 | A | 9/1994 | Tanzer et al. | 361/689 |
| 5,406,154 | A | 4/1995 | Kawaguchi et al. | 310/67 R |
| 5,481,433 | A | 1/1996 | Carter | 361/690 |
| 5,485,350 | A | 1/1996 | Hecht et al. | 361/692 |
| 5,491,622 | A | 2/1996 | Carosa | 363/56 |
| 5,497,289 | A | 3/1996 | Sugishima et al. | 361/709 |
| 5,504,378 | A | 4/1996 | Lindberg et al. | 307/10.1 |
| 5,504,655 | A | 4/1996 | Underwood et al. | 361/707 |
| 5,508,594 | A | 4/1996 | Underwood et al. | 318/139 |
| 5,508,908 | A | 4/1996 | Kazama et al. | 363/141 |
| 5,510,725 | A | 4/1996 | Schantz, Jr. et al. | 324/768 |
| 5,517,063 | A | 5/1996 | Schantz, Jr. et al. | 307/9.1 |
| 5,517,401 | A | 5/1996 | Kinoshita et al. | 363/98 |
| 5,528,446 | A | 6/1996 | Sankaran et al. | 361/25 |
| 5,539,254 | A | 7/1996 | Eytcheson et al. | 257/691 |
| 5,549,172 | A | 8/1996 | Mutoh et al. | 180/65.1 |
| 5,563,447 | A | 10/1996 | Lake et al. | 257/724 |
| 5,600,222 | A | 2/1997 | Hall et al. | 320/2 |
| 5,606,239 | A | 2/1997 | Schumann | 361/699 |
| 5,608,616 | A | 3/1997 | Umeda et al. | 363/132 |
| 5,614,803 | A | 3/1997 | Morioka et al. | 318/801 |
| 5,619,107 | A | 4/1997 | Shinohara et al. | 318/139 |
| 5,627,758 | A | 5/1997 | Lansberry et al. | 364/481 |
| 5,631,821 | A | 5/1997 | Muso | 363/141 |
| 5,632,351 | A | 5/1997 | Ishiyama | 180/65.1 |
| 5,633,784 | A | 5/1997 | Bouton | 361/716 |
| 5,659,235 | A | 8/1997 | Yamada et al. | 318/801 |
| 5,687,066 | A | 11/1997 | Cook | 363/89 |
| 5,698,955 | A | 12/1997 | Nii | 318/139 |
| 5,717,584 | A | 2/1998 | Rajashekara et al. | 363/98 |
| 5,725,048 | A | 3/1998 | Burk et al. | 165/42 |
| 5,739,664 | A | 4/1998 | Deng et al. | 318/808 |
| 5,740,015 | A | 4/1998 | Donegan et al. | 361/699 |
| 5,744,896 | A | 4/1998 | Kessinger, Jr. et al. | 310/268 |
| 5,751,058 | A | 5/1998 | Matsuki | 257/692 |
| 5,757,624 | A | 5/1998 | Kawaguchi | 363/15 |
| 5,778,526 | A | 7/1998 | Vinciarelli et al. | 29/840 |
| 5,801,442 | A | 9/1998 | Hamilton et al. | 257/714 |
| 5,808,448 | A | 9/1998 | Naito | 322/13 |
| 5,808,868 | A | 9/1998 | Drekmeier | 361/704 |
| 5,811,957 | A | 9/1998 | Bose et al. | 318/802 |
| 5,820,172 | A | 10/1998 | Brigham et al. | 290/40 C |
| 5,828,192 | A | 10/1998 | Kawaguchi et al. | 318/139 |
| 5,831,409 | A | 11/1998 | Lindberg et al. | 318/801 |
| 5,831,847 | A | 11/1998 | Love | 363/141 |
| 5,836,381 | A | 11/1998 | Osakabe et al. | 165/104.21 |
| 5,836,774 | A | 11/1998 | Tan et al. | 439/76.1 |
| 5,841,634 | A | 11/1998 | Visser | 361/699 |
| 5,872,332 | A | 2/1999 | Verma | 174/35 |
| 5,872,711 | A | 2/1999 | Janko | 363/144 |
| 5,874,818 | A | 2/1999 | Schuurman | 318/439 |
| 5,883,496 | A | 3/1999 | Esaki et al. | 320/132 |
| 5,892,279 | A | 4/1999 | Nguyen | 257/712 |
| 5,895,974 | A | 4/1999 | Eytcheson et al. | 257/723 |
| 5,896,283 | A | 4/1999 | Usami | 363/98 |
| 5,914,582 | A | 6/1999 | Takamoto et al. | 318/801 |
| 5,914,860 | A | 6/1999 | Janko | 361/710 |
| 5,917,248 | A | 6/1999 | Seguchi et al. | 290/31 |
| 5,920,161 | A | 7/1999 | Obara et al. | 318/139 |
| 5,923,085 | A | 7/1999 | Donegan et al. | 257/712 |
| 5,930,135 | A | 7/1999 | Janko | 363/144 |
| 5,945,746 | A | 8/1999 | Tracewell et al. | 307/43 |
| 5,962,996 | A | 10/1999 | Goto et al. | 318/4 |
| 5,963,442 | A | 10/1999 | Yoshida et al. | 363/98 |
| 5,966,291 | A | 10/1999 | Baumel et al. | 361/707 |
| 5,973,923 | A | 10/1999 | Jitaru | 361/704 |
| 6,000,912 | A | 12/1999 | Takada et al. | 417/32 |
| 6,031,751 | A | 2/2000 | Janko | 363/144 |
| 6,046,921 | A | 4/2000 | Tracewell et al. | 363/141 |
| 6,075,114 | A | 6/2000 | Umetsu et al. | 528/272 |
| 6,081,425 | A | 6/2000 | Cheng | 361/704 |
| 6,141,219 | A | 10/2000 | Downing et al. | 361/704 |
| 6,163,457 | A | 12/2000 | Berth et al. | 361/704 |
| 6,166,900 | A | 12/2000 | Flynn et al. | 361/685 |
| 6,166,903 | A | 12/2000 | Ranchy et al. | 361/690 |
| 6,166,937 | A | 12/2000 | Yamamura et al. | 363/141 |
| 6,206,708 | B1 | 3/2001 | Chen et al. | 439/82 |
| 6,215,679 | B1 | 4/2001 | Yamane et al. | 363/132 |
| 6,215,682 | B1 | 4/2001 | Akamatsu | 363/141 |
| 6,236,566 | B1 | 5/2001 | Regnier et al. | 361/699 |
| 6,257,310 | B1 | 7/2001 | Janko | 164/61 |
| 6,326,760 | B1 | 12/2001 | Cardoletti et al. | 318/700 |
| 6,326,761 | B1 | 12/2001 | Tareilus | 318/722 |
| 6,362,964 | B1 * | 3/2002 | Dubhashi et al. | 361/707 |
| 6,377,457 | B1 | 4/2002 | Seshan et al. | 361/690 |
| 6,414,867 | B2 | 7/2002 | Suzuki et al. | 363/141 |
| 6,433,274 | B1 | 8/2002 | Doss et al. | 174/50 |
| 6,442,023 | B2 | 8/2002 | Cettour-Rose et al. | 361/690 |
| 6,462,976 | B1 | 10/2002 | Olejniczak et al. | 363/147 |
| 6,493,249 | B2 | 12/2002 | Shirakawa et al. | 363/147 |
| 6,496,393 | B1 | 12/2002 | Patwardhan | 363/70 |
| 6,501,653 | B1 | 12/2002 | Landsgestell et al. | 361/699 |
| 6,522,528 | B2 | 2/2003 | Yamane | 361/601 |
| 6,522,544 | B1 | 2/2003 | Kimoto et al. | 361/704 |
| 6,529,394 | B1 | 3/2003 | Joseph et al. | 363/141 |
| 6,573,616 | B2 | 6/2003 | Yamane | 307/10.1 |
| 6,578,626 | B1 | 6/2003 | Calaman et al. | 165/80.4 |
| 6,588,647 | B2 | 7/2003 | Yamada et al. | 228/112.1 |
| 6,616,469 | B2 | 9/2003 | Goodwin et al. | 439/196 |
| 6,636,429 | B2 | 10/2003 | Maly et al. | 361/818 |
| 6,643,302 | B1 | 11/2003 | Nishikawa et al. | 372/35 |
| 6,661,659 | B2 | 12/2003 | Tamba et al. | 361/699 |
| 6,678,182 | B2 | 1/2004 | Joseph et al. | 363/141 |
| 6,853,541 | B2 | 2/2005 | Anheuer et al. | 361/602 |
| 6,867,970 | B2 | 3/2005 | Muller et al. | 361/695 |
| 6,909,607 | B2 * | 6/2005 | Radosevich et al. | 361/699 |
| 6,965,514 | B2 * | 11/2005 | Beihoff et al. | 361/699 |
| 6,982,877 | B2 * | 1/2006 | Vinson et al. | 361/719 |
| 7,016,192 | B2 * | 3/2006 | Beihoff et al. | 361/689 |
| 2001/0012212 | A1 | 8/2001 | Ikeda | 363/141 |
| 2002/0011327 | A1 | 1/2002 | Fukazu et al. | 165/80.4 |

FOREIGN PATENT DOCUMENTS

| | | |
|---|---|---|
| EP | 0180856 A2 | 5/1986 |
| EP | 0356991 A2 | 3/1990 |
| EP | 0822647 A1 | 2/1998 |
| EP | 1047294 A1 | 10/2000 |
| EP | 1206029 A2 | 5/2002 |
| JP | 405328654 A | 12/1993 |
| JP | 408126346 A | 5/1996 |
| JP | 409019163 A | 1/1997 |
| JP | 02001284513 A | 10/2001 |
| WO | WO 94/03925 | 2/1994 |
| WO | WO 00/17994 | 3/2000 |
| WO | WO 00/21187 | 4/2000 |

* cited by examiner

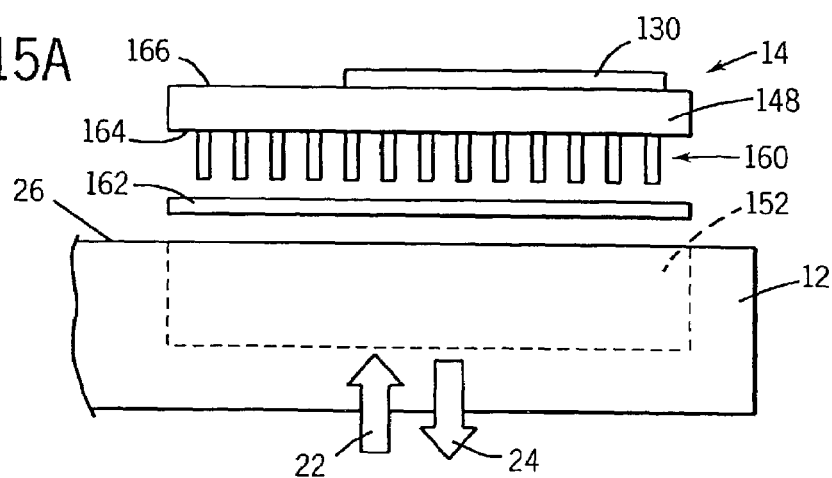
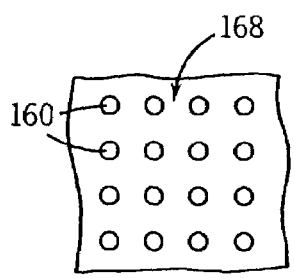
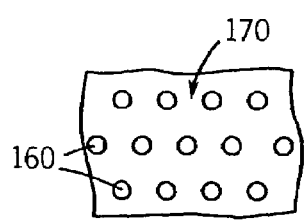
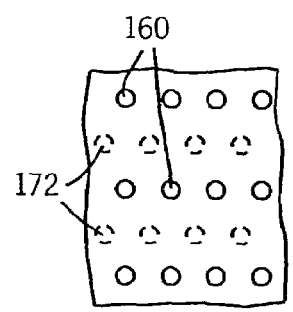
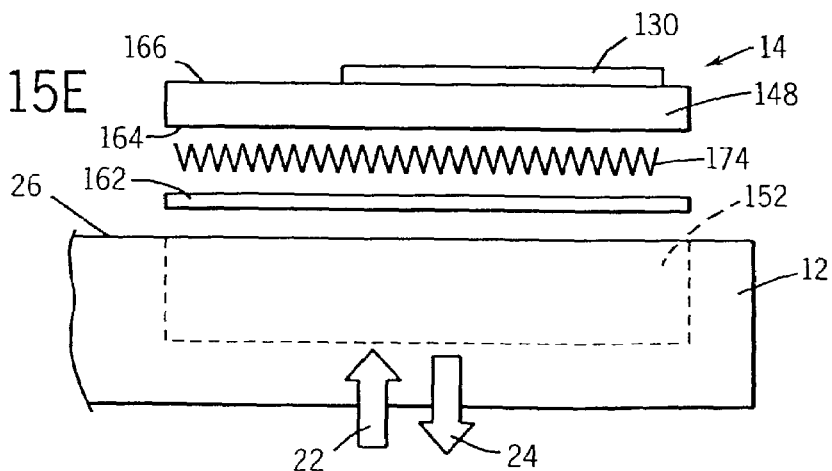

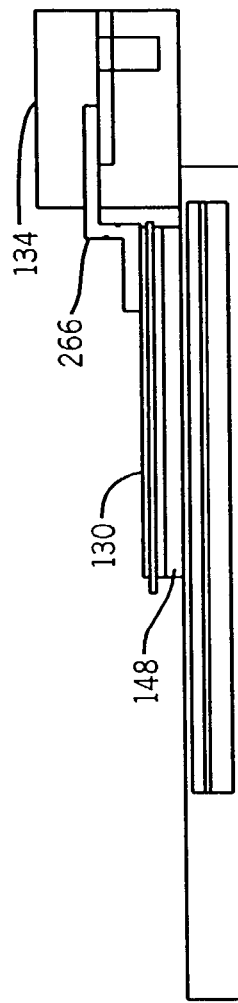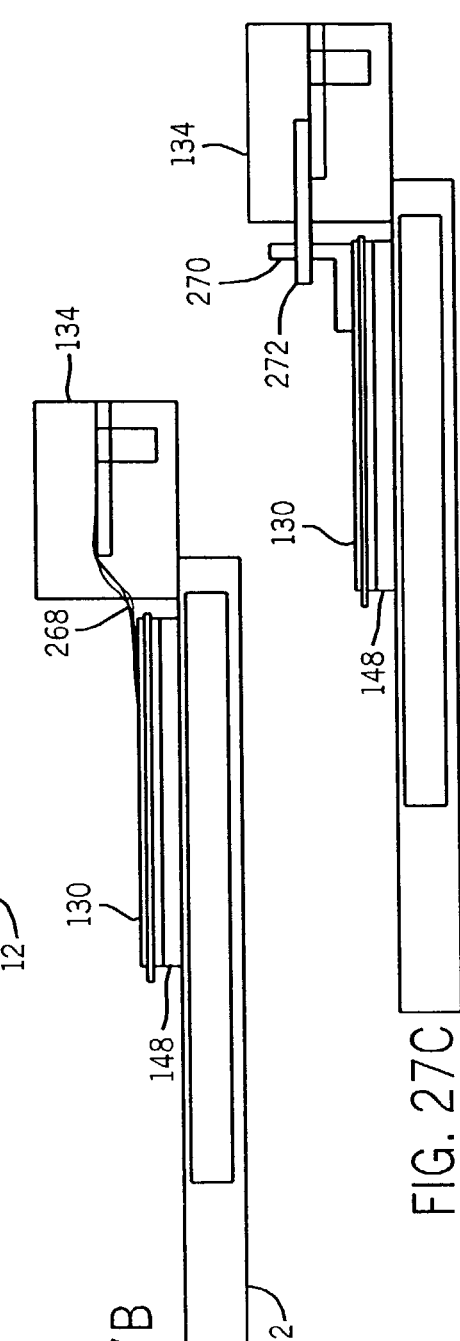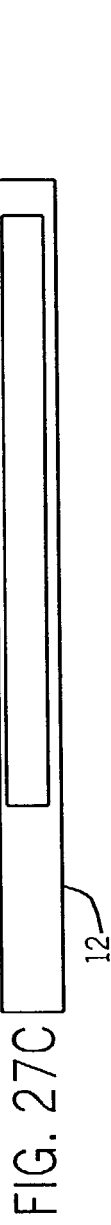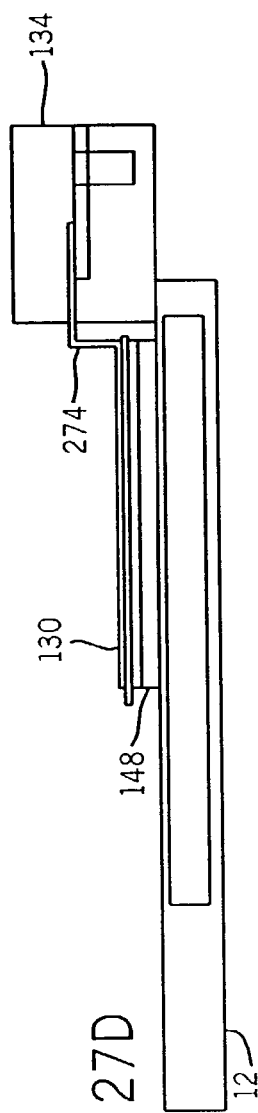

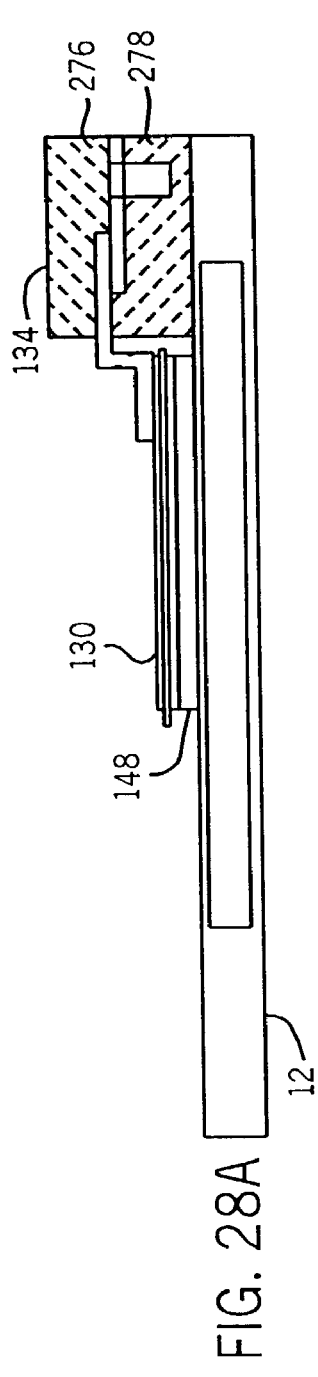
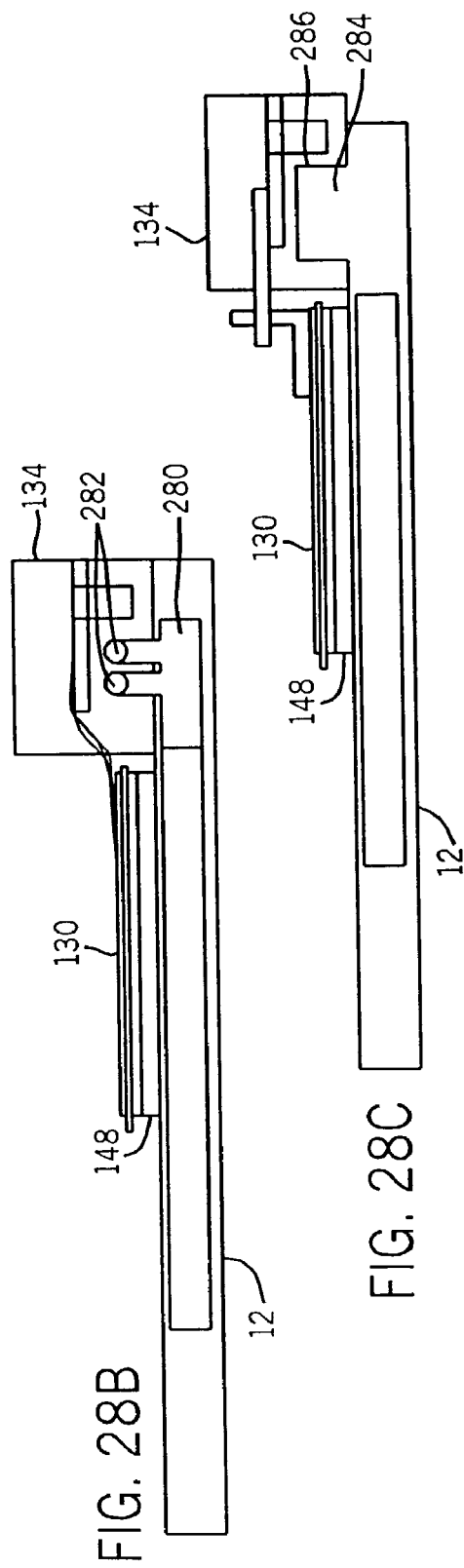
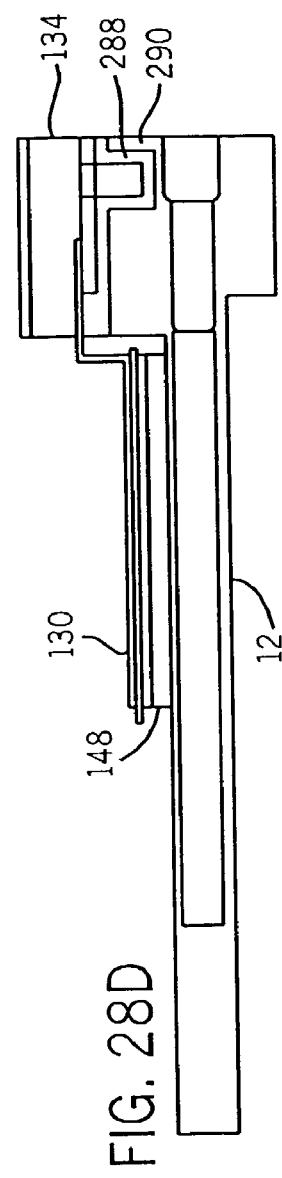
FIG. 28A
FIG. 28B
FIG. 28C
FIG. 28D

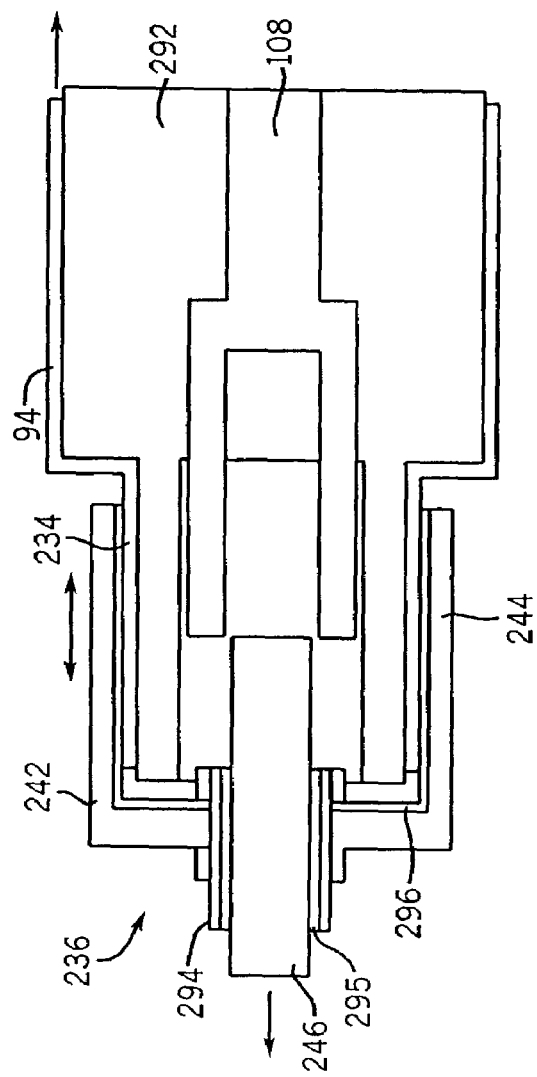
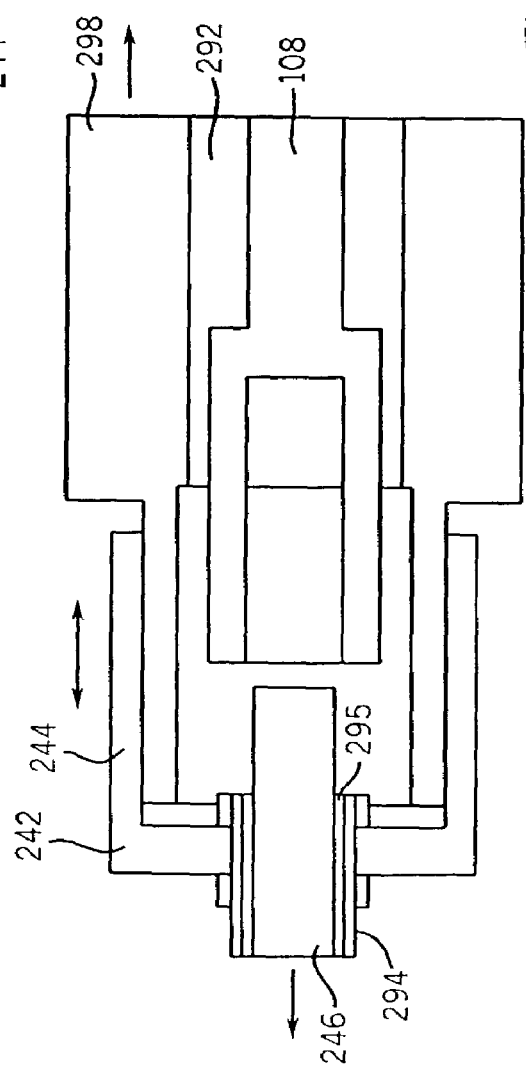

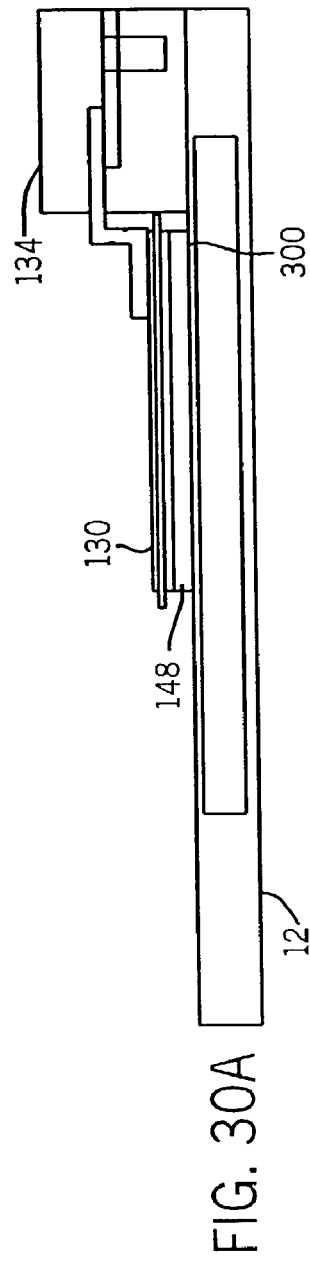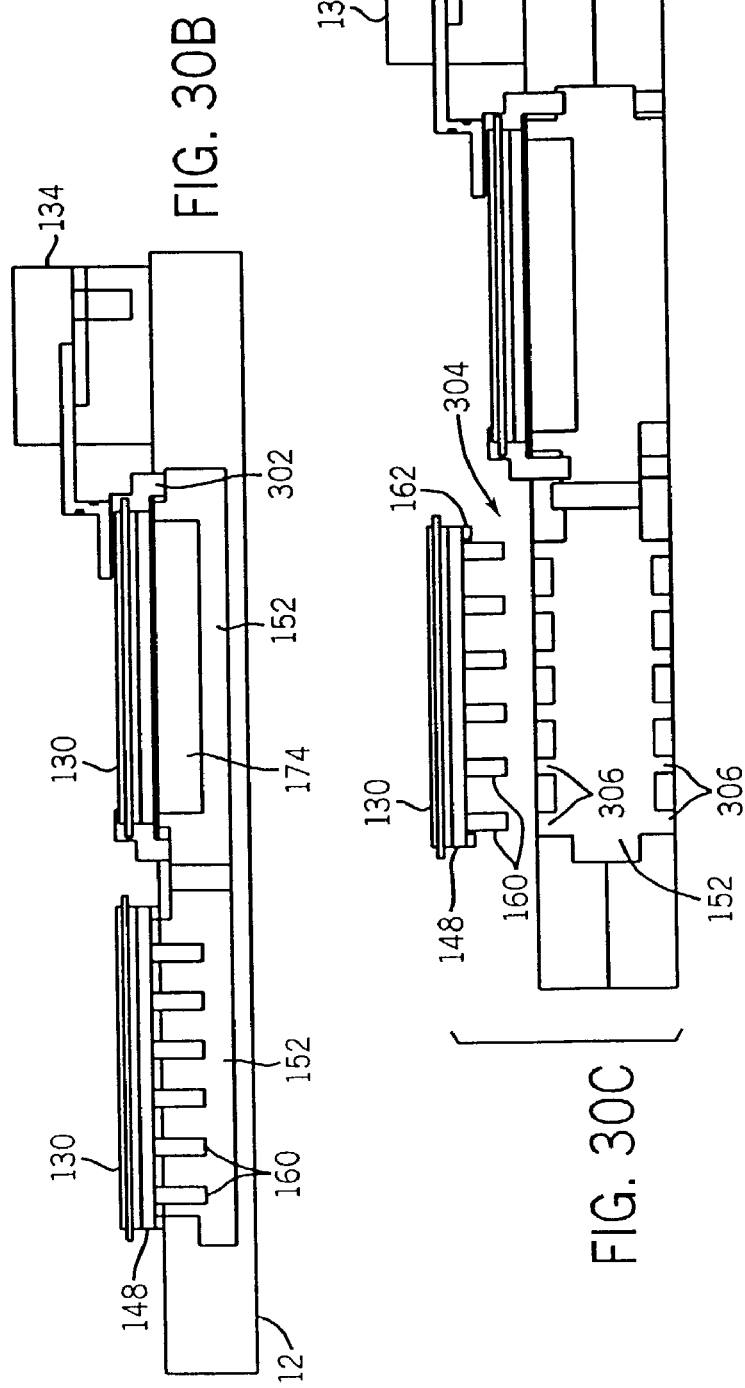

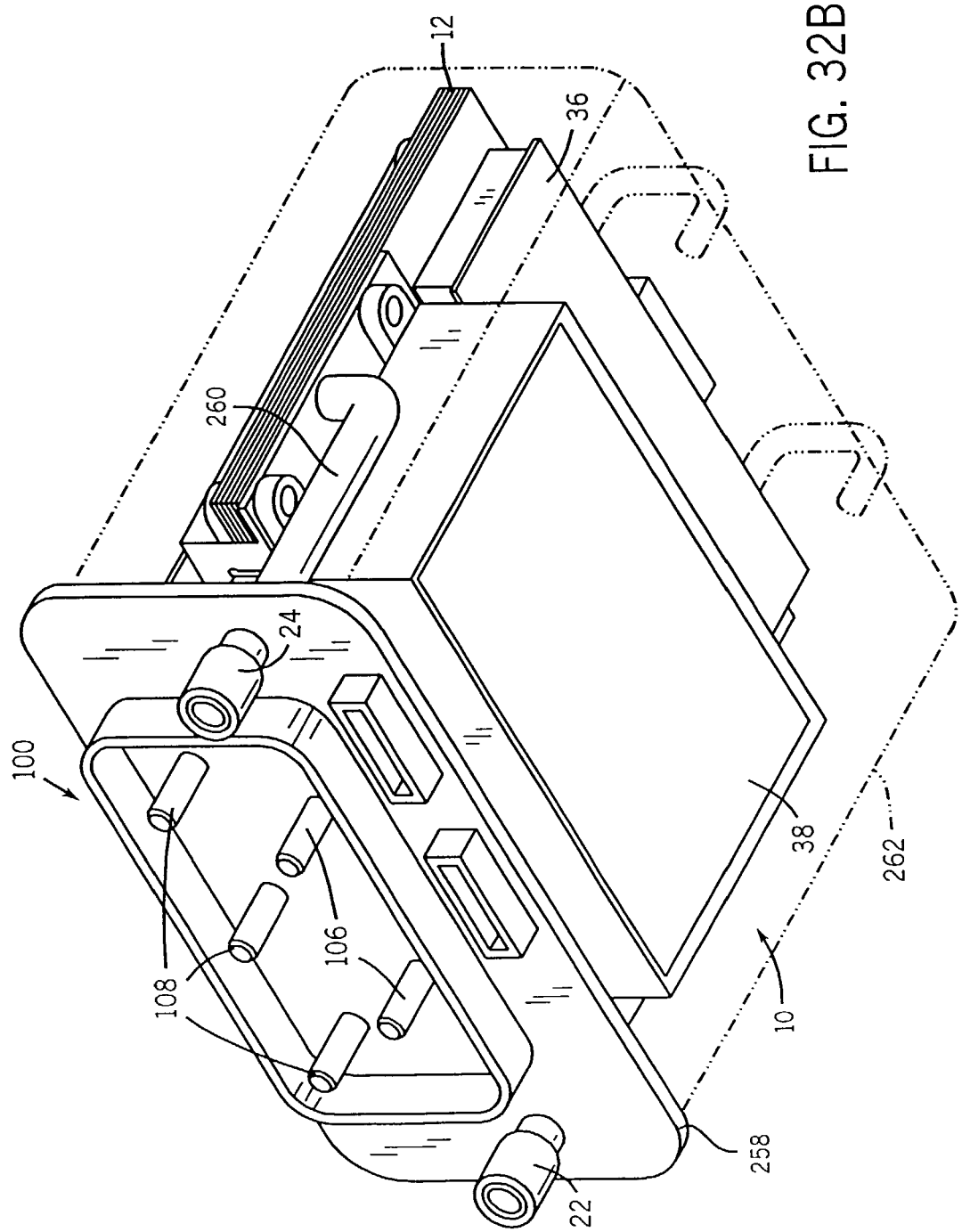

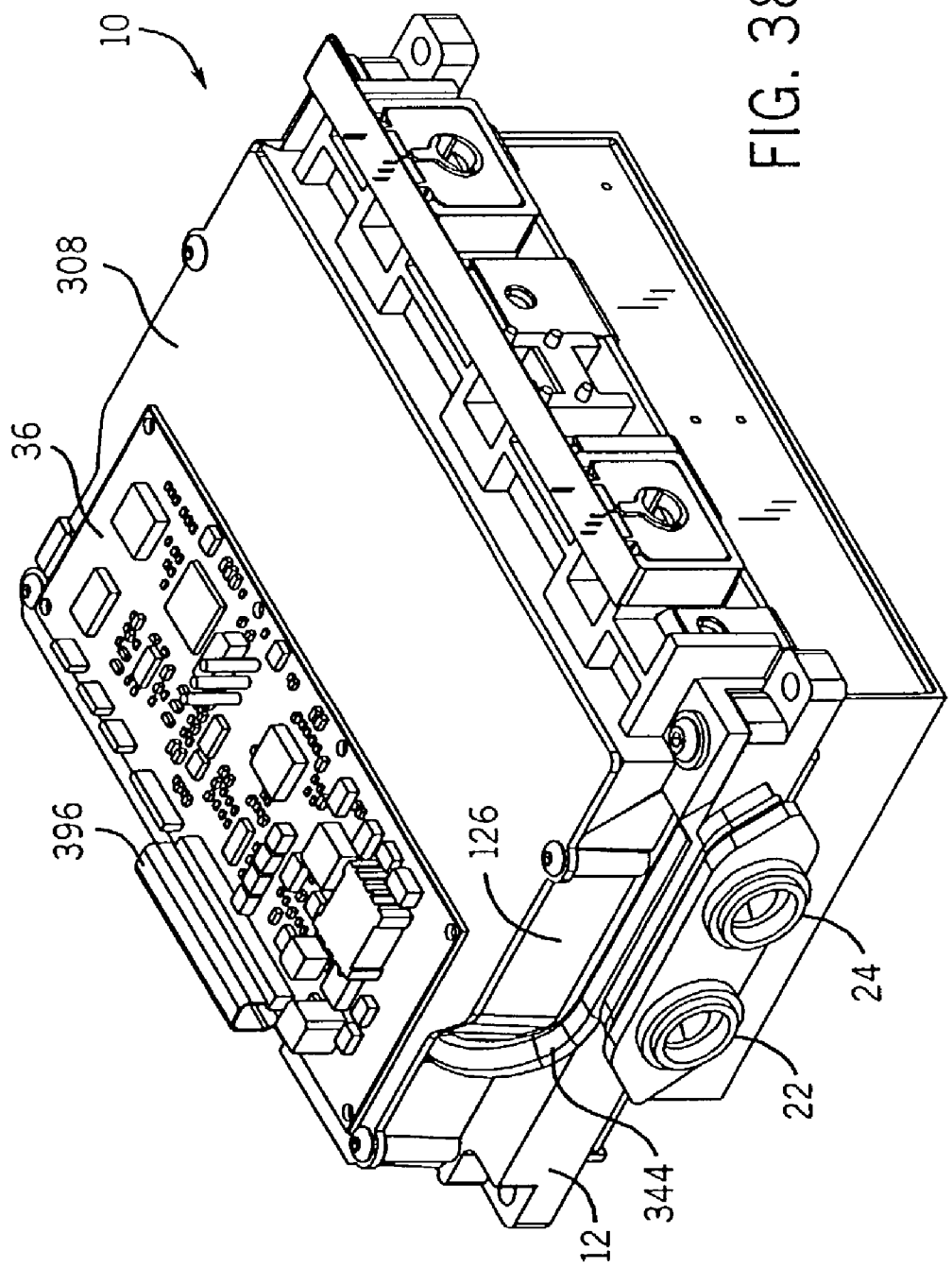

POWER CONVERTER HAVING IMPROVED FLUID COOLING

CROSS-REFERENCE TO RELATED APPLICATIONS

This application claims the benefit of U.S. Provisional Application No. 60/349,259, filed Jan. 16, 2002.

GOVERNMENT LICENSE RIGHTS

This invention was made with Government support under Cooperative Agreement No. DE-FC02-99EE50571 awarded by the Department of Energy. The Government has certain rights in this invention.

BACKGROUND OF THE INVENTION

The present technique relates to power electronic devices and their incorporation into modules and systems. More particularly, the technique relates to the configuration, packaging and thermal management of power electronic devices, particularly in modular power converter.

A wide array of applications are known for power electronic devices, such as power switches, transistors, and the like. For example, in industrial applications, silicon controlled rectifiers (SCRs), insulated gate bipolar transistors (IGBTs), field effect transistors (FETs), and so forth are used to provide power to loads. In certain applications, for example, arrays of power switches are employed to convert direct current power to alternating current waveforms for application to loads. Such applications include motor drives. However, many more applications exist for inverter circuitry and other circuitry incorporating such devices. Other settings include electric vehicle applications grid tie inverters, DC to DC converters, AC to AC power Converters, and many other solid state power conversion elements that require a packaged power device switch topology. In electric vehicles, a source of direct current is typically available from a battery or power supply system incorporating a battery or other direct or rotating energy converter. Power electronic devices are employed to convert this power to alternating current waveforms for driving one or more electric motors. The motors serve to drive power transmission elements to propel the vehicle. While numerous constraints exist in such settings which differ from those of industrial settings, numerous problems and difficulties are shared in all such applications.

Demands made on power electronic devices typically include their reliability, power output, size and weight limits, and requirements regarding the environmental conditions under which they must operate. Where size and weight constraints force reductions in the packaging dimensions, difficulties arise in appropriately placing the power electronic devices, and drive and control circuitry associated with the devices to sufficiently remove heat generated during their operation. Where size, cost and weight are less important, large heat sinks and heat dissipation devices may be employed utilizing any fluid that can be accommodated by choice of materials that are compatible. However, as packaging sizes are reduced, more efficient and effective techniques are needed. Electrical and electronic constraints also impose difficulties on package design. For example, reduction of inductance in the circuits and circuit layout is commonly a goal, while solutions for reducing inductance may be difficult to realize. Shielding from electromagnetic interference originating both within the package and outside the package may be important, depending upon the surrounding environment. Similarly, appropriate interfacing with external circuitry, and the facility to install, service and replace power electronics packages may be important in certain applications. It has typically been necessary in many instances to configure the power electronic element to match closely the specific needs of the application and by doing so meet cost, size, performance targets that can be achieved by no other means. Finally, certain environments, such as vehicle environments, impose a wide range of difficult operating conditions, including large temperature spans, vibration and shock loading, and so forth.

There is a need, therefore, for improved techniques in packaging of power electronic devices. There is a particular need for techniques which offer highly efficient and cost-effective power capabilities in small, robust, and thermally managed configurations.

SUMMARY OF THE INVENTION

The present technique provides power electronics modules designed to respond to such needs. The technique makes use of novel packaging, thermal management, interconnect, and grounding shielding approaches which both improve performance, and offer smaller, lighter and more efficient configurations of the power electronic devices and their drive circuitry. The technique offers multiple facets for such packaging and thermal management which can be adapted to a variety of settings, including industrial power electronics applications, vehicular applications, and so forth. Many of the embodiments of the present technique permit utilization of standardized cells designed to be reconfigured into a number of optimum configurations matching key application requirements.

The features of the technique offer modular packaging around a thermal management system, generally including a thermal support. Power electronic devices may be mounted directly to the support for removal of heat. The arrangement of the devices, and their interconnection with incoming and outgoing power conductors may vary, and may make use of the thermal support for extraction of heat and for mounting of various components. A number of improved power device assemblies, their attachment means to the thermal support are accommodated with the scope of the present technique. The support and thermal management system may provide for closed-loop control of flow of a coolant used to extract heat. Moreover, interfaces and cooling structures around and within the coolant flow provide greatly enhanced cooling.

In an exemplary embodiment, a modular power converter is featured, although other types of power electronic circuitry, various converting circuitry, drives, and so forth, may be adapted in the package. Incoming power conductors interface with the power electronics circuitry, which converts the incoming power to desired output power, such as alternating current waveforms. The incoming and outgoing power conductor configurations and arrangements may facilitate installation of the module into enclosures or vehicular mounting spaces, with plug-in connections being offered for both power and control. Coolant may be routed through the thermal base via additional connections. Exemplary coolant configurations are envisaged that effectively extract heat by close and thermally matched mounting of power electronics and other electronic devices immediately adjacent to heat removal surfaces. Locations, positioning and interconnection of control, drive, and power electronic circuitry facilitate close packaging of these elements. Shielding from electromagnetic interference may be facilitated through the use of a shielding support, which may be a thermal support and, where desired, additional external shielding and closures. Optimum power device temperature and EMI regulation means may be accommodated in the intrinsic features of the support such that they work in close harmony with electrical power switching elements or other circuitry and their thermomechanical attachment to both the inputs, outputs and the support, EMI-management and thermal-management system.

The present technique offers a wide range of improvements in power electronics packaging and management. The improvements reside both in the particular configuration of the packages, the configuration of the package components and the interrelationship and layout of the components, their interfaces, and their operational interdependence. The technique also offers more effective shielding from EMI/RFI. Moreover, better high frequency grounds may be achieved by low inductance connection means integrated into the support. Connections may be cooled by means of integrated bus structure in contact with electrically insulating but thermally conductive features in or integrated with the support and coolant circulating system.

BRIEF DESCRIPTION OF THE DRAWINGS

The foregoing and other advantages and features of the invention will become apparent upon reading the following detailed description and upon reference to the drawings in which:

FIGS. 27A–27D are diagrammatical representations of alternative terminal and terminal assembly connection arrangements for use in a module in accordance with the present technique;

FIGS. 28A–28D are diagrammatical representations of alternative terminal and terminal assembly cooling arrangements for use in a module in accordance with the present technique;

FIGS. 29A and 29B are diagrammatical representations of alternative terminal and plug configurations for EMI shielding and grounding for a module in accordance with the present technique;

FIGS. 30A–30C are diagrammatical representations of alternative power electronics substrate mounting arrangements for interfacing with heat removal structures in the module;

FIG. 31A is a diagrammatical prospective view of an alternative power and control low inductance shield and ground arrangement for use in the module, while

FIG. 32A is a diagrammatical elevational view of an alternative plug-in module arrangement based upon the modules such as those illustrated in the previous Figures, while FIG. 32B is a perspective view of an exemplary implementation of the plug-in module arrangement;

FIGS. 38A and 38B are exemplary configurations of modules adapted for cooling of circuitry through indirect conduction to the thermal support.

DETAILED DESCRIPTION OF SPECIFIC EMBODIMENTS

Before detailing specific embodiments of the inventive technique as presently contemplated, certain definitional notes are in order. Firstly, reference is made in the present disclosure to power devices and subassemblies incorporating such devices. Such devices may include a range of components, such as power electronic switches (e.g. IGBTs, FETs) of various power ratings. The devices may also include gate driver circuitry for such components, sensing and monitoring circuitry, protection circuitry, filtering circuitry, and so forth. The devices may be provided in the subassemblies in various groupings, both integrally and separate from supporting substrates and/or thermal expansion coefficient members and heat transfer elements. Reference is also made herein to energy storage and conditioning circuitry. Such circuitry may vary in composition depending upon the particular configuration of the associated power electronic devices and circuits. For example, in inverter drive applications as discussed below, the energy storage and conditioning circuitry may include one or more capacitors, capacitor/inductor circuits or networks. Filtering circuitry may also be included for signal conditioning. In other applications, such as medium frequency welding, the energy storage and conditioning circuitry may include one or more transformers. Finally, while reference is made herein to a thermal support used in conjunction with power devices and other circuitry, various configurations and functions may be attributed to the support. For example, as described below, the support may provide both mechanical and electrical support for the various components, as well as offer integrated and highly efficient cooling of some or all of the components. Moreover, the support may provide electrical and shielding functions, such as for EMI and RFI shielding both of external fields that may affect the components as well as fields that may be generated by the components during operation. Thermal regulating components and circuits may also be incorporated into or associated with the support.

Figure 1:
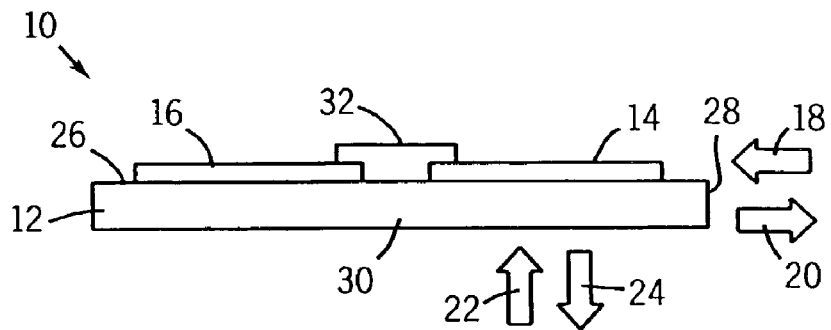
FIG. 1 is a diagrammatical representation of a power electronics module in accordance with certain aspects of the present technique.

Turning now to the drawings, and referring first to FIG. 1, an exemplary power electronics module 10 is illustrated. Module 10 includes a thermal support 12 on which power electronic circuit 14 is disposed. As described in greater detail below, thermal support 12 may include a range of thermal management features, such as porting for routing of coolant for extracting heat from circuit 14. Similarly, circuit 14 may include a wide range of functional circuitry, such as inverter circuitry, converter circuitry, and so forth which is mounted on support 12 for mechanical and electrical support, improved EMI/RFI shielding and high frequency grounding, as well as for extraction of heat generated during its operation. In the embodiment of FIG. 1, module 10 further includes control and driver circuitry, designated generally by reference numeral 16. Incoming power, as indicated by arrow 18 is applied to circuitry 14 and outgoing power 20 is routed from the circuitry to external devices (not shown). Similarly, in the diagrammatical representation of FIG. 1, coolant 22 is applied to the thermal support 12 to extract heat from the power electronic circuit 14 and from the thermal support, as well as from the control and driver circuitry 16. Outgoing coolant 24 is routed from the thermal support to carry heat away to a cooling system (not shown). In the embodiment of FIG. 1, both the power electronic circuit 14 and the control and driver circuitry 16 are mounted on a side 26 of the thermal support 12. Both incoming and outgoing power are routed to the circuitry at an edge 28 of the thermal support. Finally, interconnections 32 are provided between the control and driver circuitry 16 and the power electronic circuit 14 for control of operation of the circuitry as described more fully below.

Figure 2:
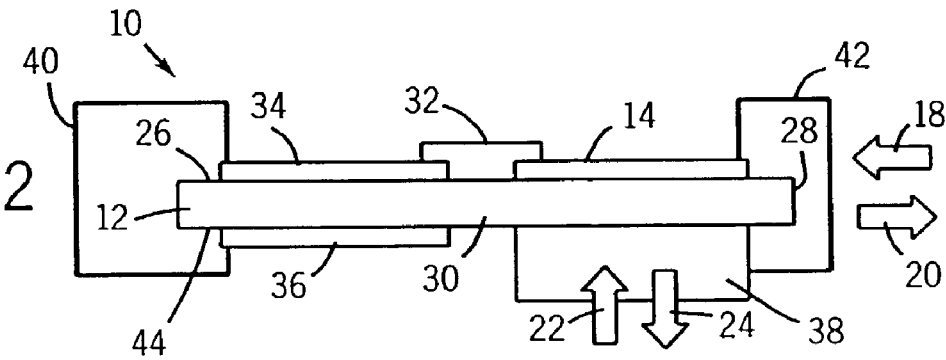
FIG. 2 is a diagrammatical representation of a variation of the module of FIG. 1 including additional circuitry supported on a thermal base.

FIG. 2 illustrates an exemplary alternative configuration of a power module 10 in which components are mounted on both sides of the thermal support. In the embodiment of FIG. 2, power electronic circuit 14 is again mounted to side 26 of the thermal support 12. In the embodiment of FIG. 2, however, driver circuitry 34 for controlling functioning of the power electronic circuit is mounted to the same side 26 of the thermal support, while control circuitry 36 is separated from the driver circuitry. Energy storage and conditioning circuitry, as indicated generally at reference numeral 38, is also mounted on the thermal base. As before, interconnections 32 between driver circuitry 34 and power electronic circuit 14 are provided, as are similar connections 40 between the control circuitry and the driver circuitry, and interconnections 42 between the power electronic circuit 14 and the energy storage and conditioning circuitry 38. As will be noted, in the embodiment of FIG. 2, the geometry, layout and space utilization of the thermal support are adapted such that the control circuitry 36 and the energy storage and conditioning circuitry 38 are mounted on a lower side 44 of the thermal support 12. All such components may therefore be mechanically and electrically supported on the thermal support, while receiving cooling via coolant flow as indicated by arrows 22 and 24.

Figure 3:
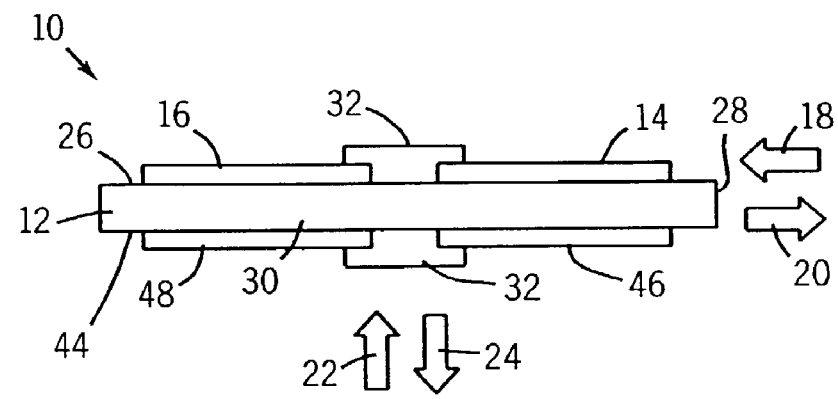
FIG. 3 is a further diagrammatical representation of a power electronics module having power electronic devices mounted to two sides of a thermal base.

FIG. 3 illustrates a further exemplary configuration of a module 10 wherein power electronic circuits are mounted on both sides of the thermal support. Thus, as shown in FIG. 3, a thermal support 12 serves for mechanical and electrical mounting of both power electronic circuit 14, and control and a driver circuitry 16 with the necessary interconnections 32 being provided between these circuits. A second power electronic circuit 46, and second control and driver circuitry 48 are provided on the opposite side of the thermal support 12 thus making the use of the cooling fluid nearly significantly more effective as it would be with only one side of the heat exchanger used for active cooling. Thus, heat may be extracted from both power electronic circuits bus work, input output terminals, energy storage elements and support electronics by virtue of coolant flow through or around the thermal support.

Figure 4:
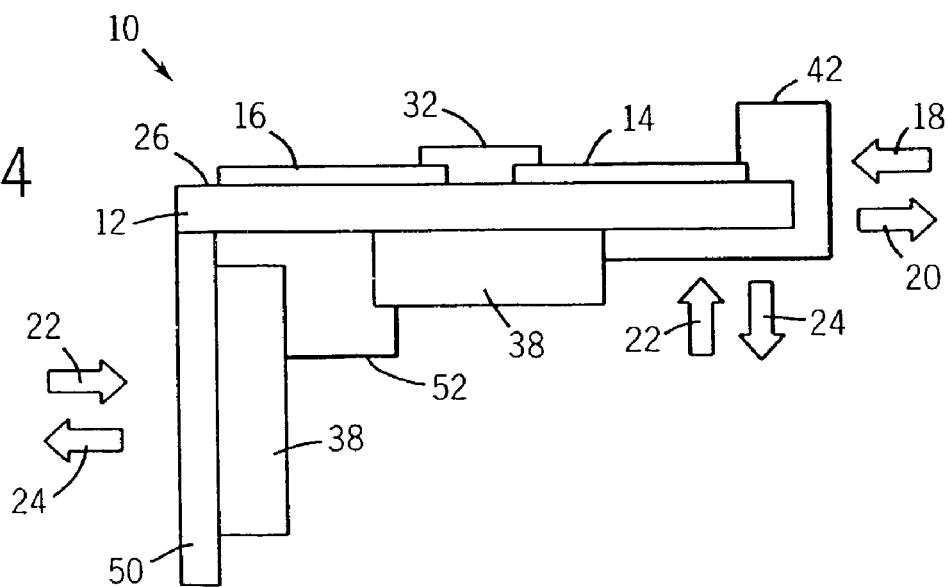
FIG. 4 is a diagrammatical representation of a power electronics module having multiple thermal bases.

FIG. 4 illustrates a further exemplary configuration of a module 10. In the exemplary configuration of FIG. 4, power electronic circuit 14 is again mounted to a side of the thermal support 16 along with control and driver circuitry 16. Energy storage and conditioning circuitry 38 is mounted on an opposite side of the thermal support. In this alternative configuration, a second thermal support 50 is secured to the first thermal support 12, and itself supports additional energy storage and conditioning circuitry 38. As will be appreciated by those skilled in the art, the particular circuitry supported on the one or more additional thermal supports may vary depending upon the system needs. Accordingly, capacitor circuitry, power electronic circuitry, driver circuitry, control circuitry, energy storage components, inductors, filters, braking resistors, and so forth, or any other ancillary circuitry may be provided on the additional thermal support. Moreover, in the embodiment of FIG. 4, coolant is routed separately to the second thermal support 50. A modular system of stacking interconnect, thermal connection, and support features may be provided such that thermal base, power terminal assemblies can interconnect in parallel and series combinations to form larger and differently rated power converters using the core thermal-electrical base described. Depending upon thermal management needs and available plumbing, however, coolant could be routed to one of the thermal supports alone, or coolant could be routed internally between the thermal supports. Similarly, interconnection 52 made between the energy storage and conditioning circuitry 38 of FIG. 4 could include a range of interconnections between functional circuitry, including power electronic circuits, and their associated drive and control circuits.

Figure 5:
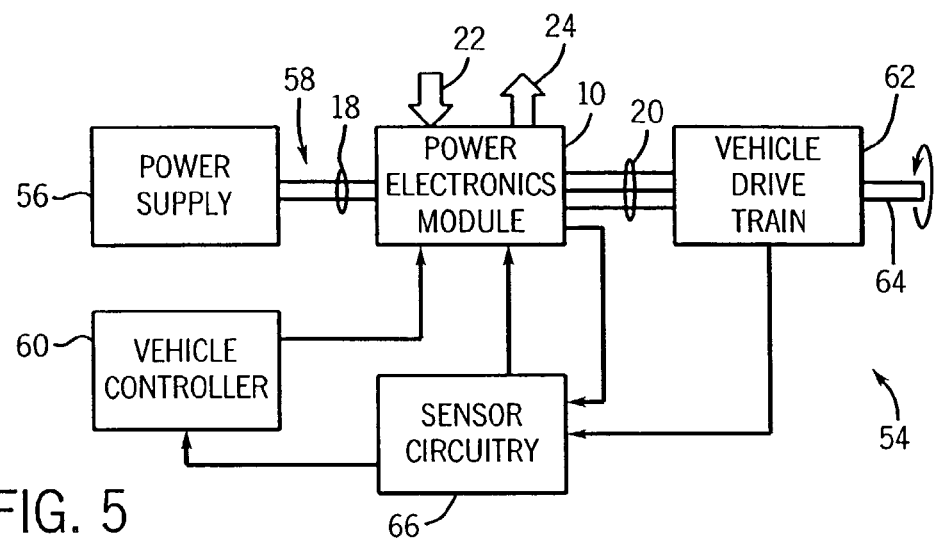
FIG. 5 is a block diagram of certain functional circuitry in an exemplary application of a power electronics module in accordance with aspects of the present technique for a vehicle drive.
Figure 6:
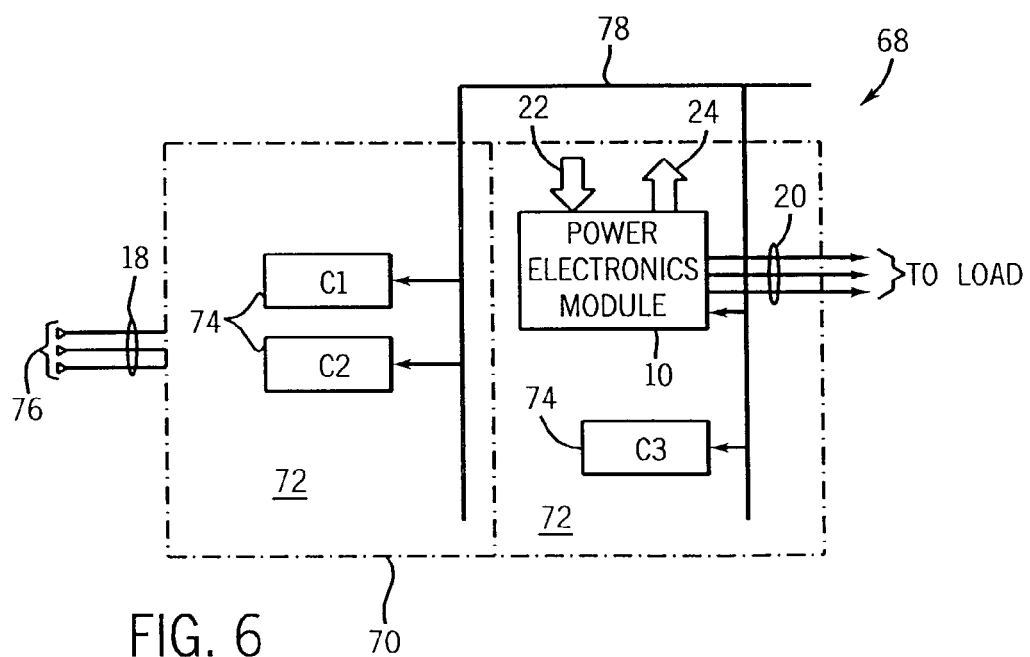
FIG. 6 is a diagram of a power electronics module in accordance with aspects of the present technique employed in an enclosure, such as in a vehicle or industrial setting.

The exemplary configurations of FIGS. 1–4 can be adapted to support a wide range of functional power electronic circuits. FIGS. 5 and 6 illustrate exemplary applications of the power electronics modules. In the illustration of FIG. 5, a vehicle drive 54 is provided, such as a drive for an automobile or other mobile application. The vehicle drive 54, which may include the functional circuits of FIG. 5 as well as a wide array of additional support, control, feedback and other interrelated components, will generally include a power supply 56 which provides the power needed for driving the vehicle. In a typical application the power supply 56 may include one or more batteries, generators or alternators, fuel cells, utility source, alternators, voltage regulators, and so forth. Power supply 56 applies power, typically in the form of direct current via direct current conductors 58 to the power electronics module 10. Control circuitry 60 provides control signals for regulating operation of the power electronics module, such as for speed control, torque control, acceleration, braking, and so forth. Based upon such control signals, power electronics module 10 outputs alternating current waveforms along output conductors, as indicated generally at reference numeral 20 in FIG. 5. The output power is then applied to a vehicle drive train as indicated generally at reference numeral 62. As will be appreciated by those skilled in the art, such drive trains will typically include one or more alternating current electric motors which are driven in rotation based upon the frequency and power levels of the signals applied by the power electronics module 10. The vehicle drive train may also include power transmission elements, shafts, gear trains, and the like, ultimately designed to drive one or more output shafts 64 in rotation. Sensor circuitry 66 is provided for sensing operating characteristics of both the vehicle, the drive train, and the power electronics module. The sensor circuitry 66 typically collects such signals and applies them to the control circuitry, such as for regulation of speeds, torques, power levels, temperatures, flow rates of coolants, and the like.

FIG. 6 illustrates a further application of a power electronics module 10 in an industrial or mobile setting. In an industrial setting, the power electronics module 10 may be applied for application of power to various loads, such as electric motors, drives, valving, actuators, and so forth. In the system, designated generally by reference numeral 68, an enclosure 70 is provided that may be divided into bays 72. Within each bay various components are mounted and interconnected for regulating operation of processes, such as manufacturing, material handling, chemical processes, and the like. The components, designated generally by reference numeral 74, are mounted within the bays and receive power via an alternating current bus 76. A control network 78 applies control signals for regulating operation of the components 74 and of the power electronics module 10. An enclosure, such as enclosure 70 may be included in various industrial settings, such as in motor control centers, assembly line or process controls, and so forth. However, such enclosures may also be provided in a vehicular setting, such as for driving one or more drive trains of an automobile, utility vehicle, transport or other vehicle.

Figure 7A:
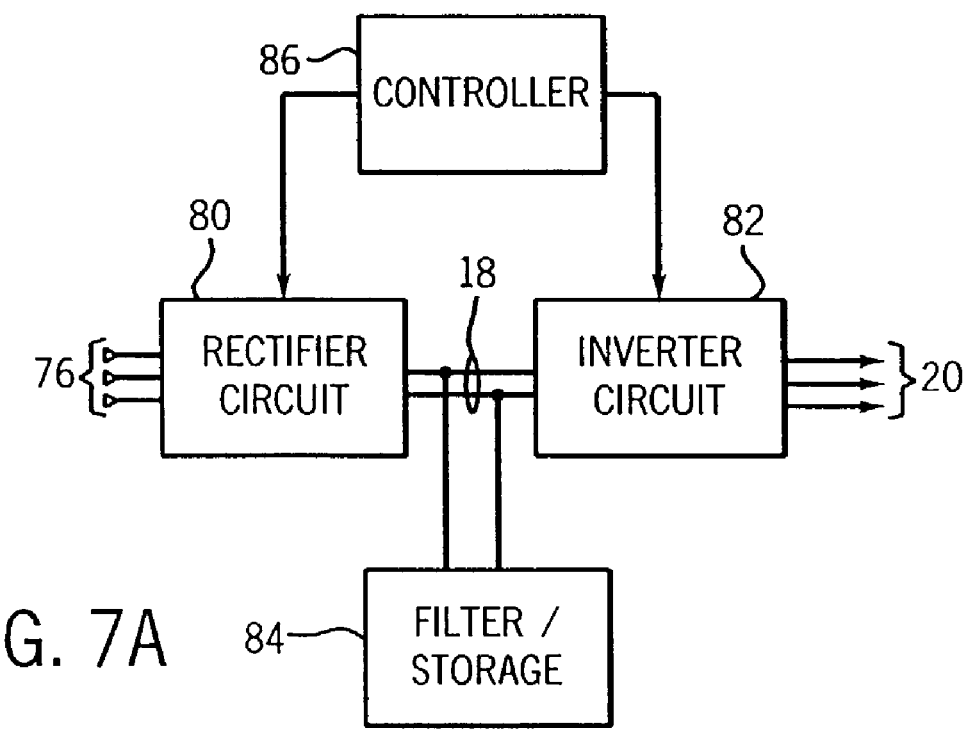
FIGS. 7A and 7B are block diagrams of functional circuitry which may be supported in a package in accordance with the present techniques, including an inverter drive and a converter drive.
Figure 7B:
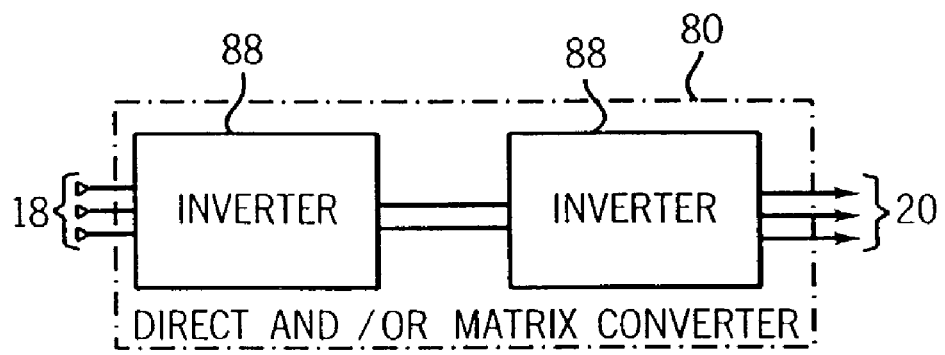

As mentioned above, various circuit configurations may be designed into the power electronics module. The circuit configurations will vary widely depending upon the particular requirements of each individual application. However, certain exemplary circuit configurations are presently envisaged, both of which include power electronic devices which require robust and compact packaging along with thermal management. Two such exemplary circuits are illustrated in FIGS. 7A and 7B. In FIG. 7A, the circuitry includes a rectifier circuit 80 which converts alternating current power from a bus 76 to direct current power for output along a DC bus, corresponding to incoming power lines 18. An inverter circuit 82 receives the direct current power and converts the direct current power to alternating current waveforms at desired frequencies and amplitudes. The alternating current power may then be applied to a load via the outgoing conductors 20. Filter and storage circuitry 84 may be coupled across the direct current bus to smooth and condition the power applied to the bus. A control circuit 86 regulates operation of the rectifier and inverter circuits. In the example of FIG. 7B, a direct and/or matrix converter 90 includes a set of AC switching power devices per phase of power controlled. Inverter 90 receives incoming alternating current power and supplies an outgoing waveform to power switches 88. The set of AC switches effectively convert fixed frequency incoming power 18 to controlled frequency outgoing power 20 for application to a load. The arrangement of FIG. 7B is illustrated in greater detail in FIG. 36C. It should be borne in mind, however, that the particular circuitry of FIGS. 7A and 7B are exemplary only, and any range of power electronic circuits may be adapted for incorporation into a module in accordance with the present techniques.

Figure 8:
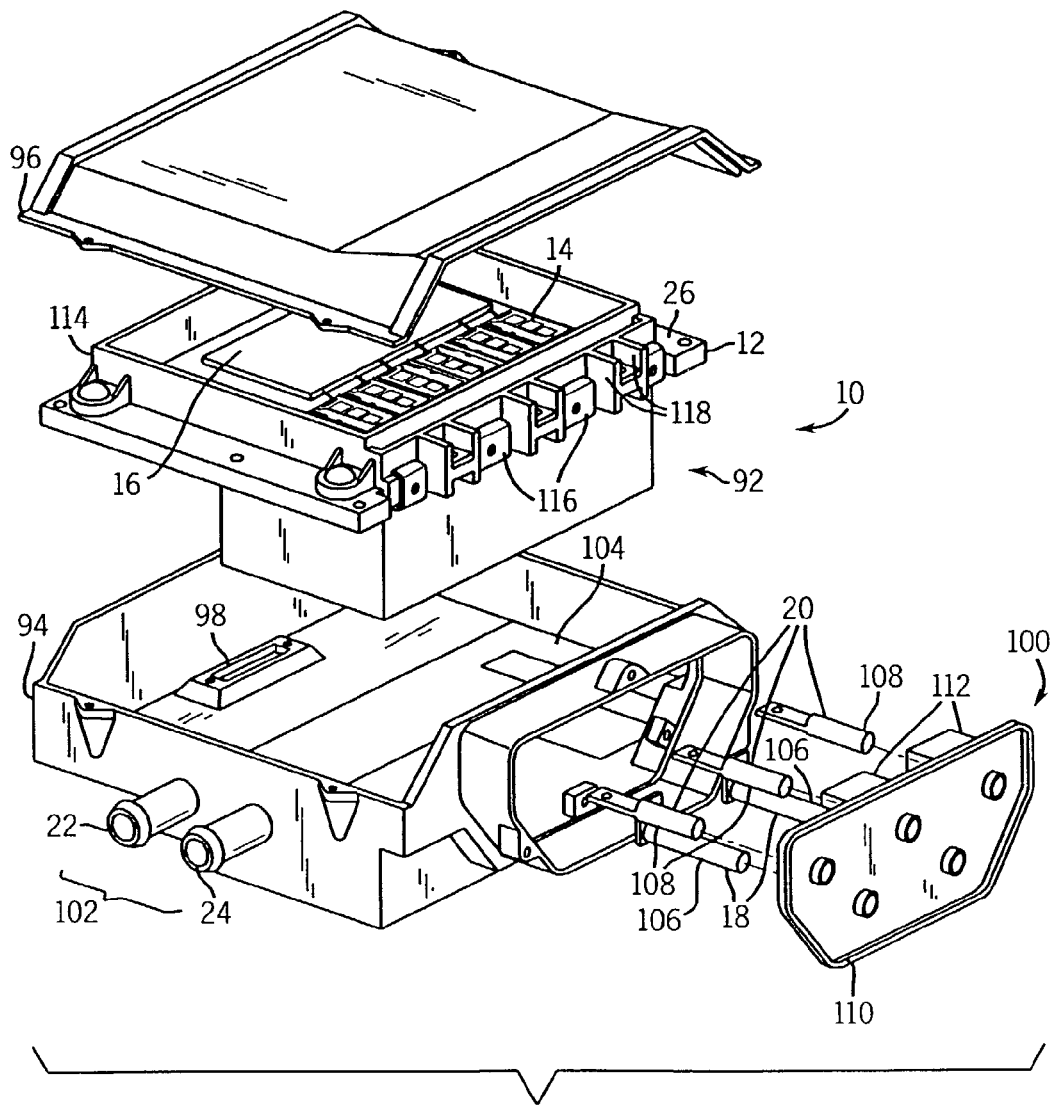
FIG. 8 is an exploded perspective view of an exemplary power electronics module and its associated packaging components.

FIG. 8 illustrates an exemplary physical configuration for a power electronics module 10. In the embodiment of FIG. 8, a circuit assembly 92 is positioned within a housing 94 and enclosed within the housing by a cover 96 fitted to the housing. Circuit assembly 92 includes the components described above, and in the particular embodiment illustrated corresponds generally to the configuration of FIG. 2. As illustrated, thus, the circuit assembly 92 includes a thermal support 12 on which power electronic circuit 14 is disposed. Control and driver circuitry are also disposed on the thermal support for regulating operation of the power electronic circuit with cooling of such circuitry. In the embodiment of FIG. 8, the module is particularly configured for operating as an inverter drive for a vehicle application. Incoming direct current power is received via conductors 18, and converted to three-phase waveforms output via conductors 20.

In the embodiment of FIG. 8, housing 94 presents a control interface 98 which is designed to permit control signals to be received within and transmitted from the housing. As described in greater detail below, the control interface may be provided on a bottom side of the housing as illustrated in FIG. 8, or at other positions on the housing. A power interface, designated generally by reference numeral 100 in FIG. 8, is provided for transmitting power to and from the circuit assembly 92. As described below, various configurations can be provided and are presently envisaged for interfacing the module 10 with external circuitry. In the embodiment of FIG. 8, for example, the power interface 100 permits five conductors two direct current conductors and three alternating conductors, to be directly interfaced from the circuit assembly, such as in a plug-in arrangement. In addition to the control and power interfaces, a coolant interface 102 is provided for receiving and circulating coolant as described more fully below. In present embodiments, the coolant interface may include tubes or specialized fittings adapted to receive conduits for channeling fluid to and from the module. It should be noted, however, that where appropriate, liquids, gases, compressed gases, and any other suitable cooling media may be employed in the present technique. Thus, while in vehicle applications the combination of water and conventional vehicle coolant may be used, other specialized or readily available cooling media may be employed.

In the embodiment of FIG. 8, housing 94 forms a metallic shell, such as of aluminum, which is cast to provide shielding of EMI, both generated by the module circuitry and which may be present in the environment of the module. Cover 96 is made of a similar material to provide shielding on all sides of the module. As described below, connector interfaces may also provide additional shielding, and are particularly useful in applications where high frequency waveforms are generated by the power electronic components, such as inverter drives. Where appropriate, other types of housings and supports may be employed. For example, where sufficient EMI shielding is provided, or where EMI transmissions are sufficiently reduced by proximity of the power electronic components to the thermal support, plastic housings, doped plastic housings, and the like may be employed.

In the illustrated embodiment, housing 94 includes a cavity 104 in which circuit assembly 92 is disposed. Conductors 106 transmit DC power to the circuit assembly 92, while conductors 108 transmit the AC waveforms from the circuit assembly 92 for application to a load. An interface plate 110 is provided through which conductors 106 and 108 extend. Where desired, sensors may be incorporated into the assembly, such as current sensors 112 which are aligned about two of the outgoing power conductors 108 to provide feedback regarding currents output by the module. As will be appreciated by those skilled in the art, other types and numbers of sensors may be employed, and may be incorporated both within the housing, within a connector assembly, or within the circuit assembly itself.

As described more fully below, thermal support 12 may incorporate a variety of features designed to improve support, both mechanical and electrical, for the various components mounted thereon. Certain of these features may be incorporated directly into the thermal support, or may be added, as is the case of the embodiment of FIG. 8. As shown in FIG. 8, a frame 114, made of a non-metallic material in this embodiment, is fitted to the thermal support 12, and components mounted to the thermal support are at least partially surrounded by the frame. The frame serves both as an interface for conductors 106 and 108, and for surrounding circuitry supported on thermal support 12 to receive an insulating or potting medium. In the embodiment of FIG. 8 terminals 116 are formed on frame 114, and may be embedded within the frame during molding of the frame from an insulative material. A preferred configuration for the terminals is described more fully below. Separators 118 partially surround terminals 116 for isolating the conductors coupled to the terminals from one another.

Figure 9:
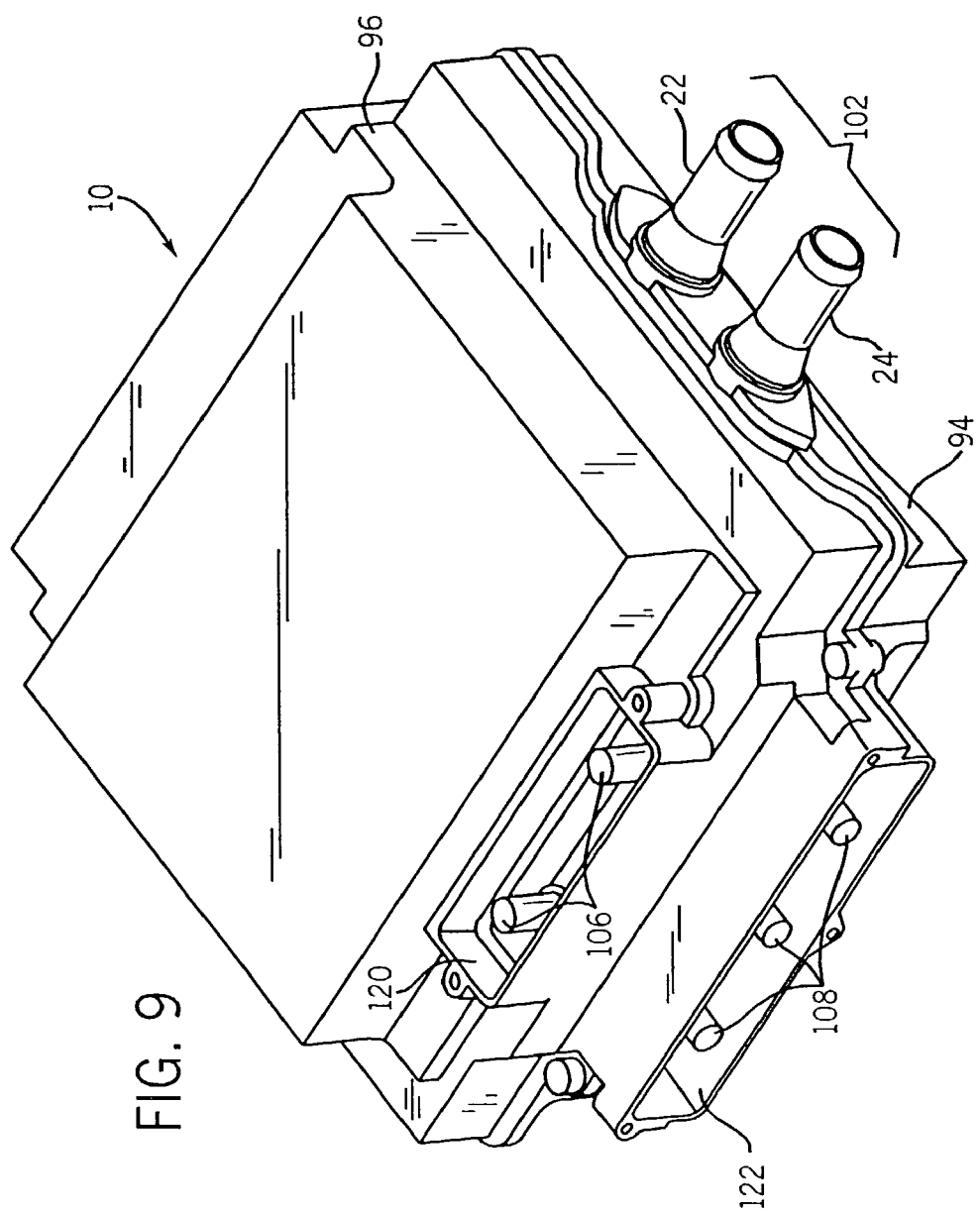
FIG. 9 is a perspective view of the external interfaces of an exemplary package module of the type illustrated in FIG. 8, with slightly different interface connections.
Figure 10:
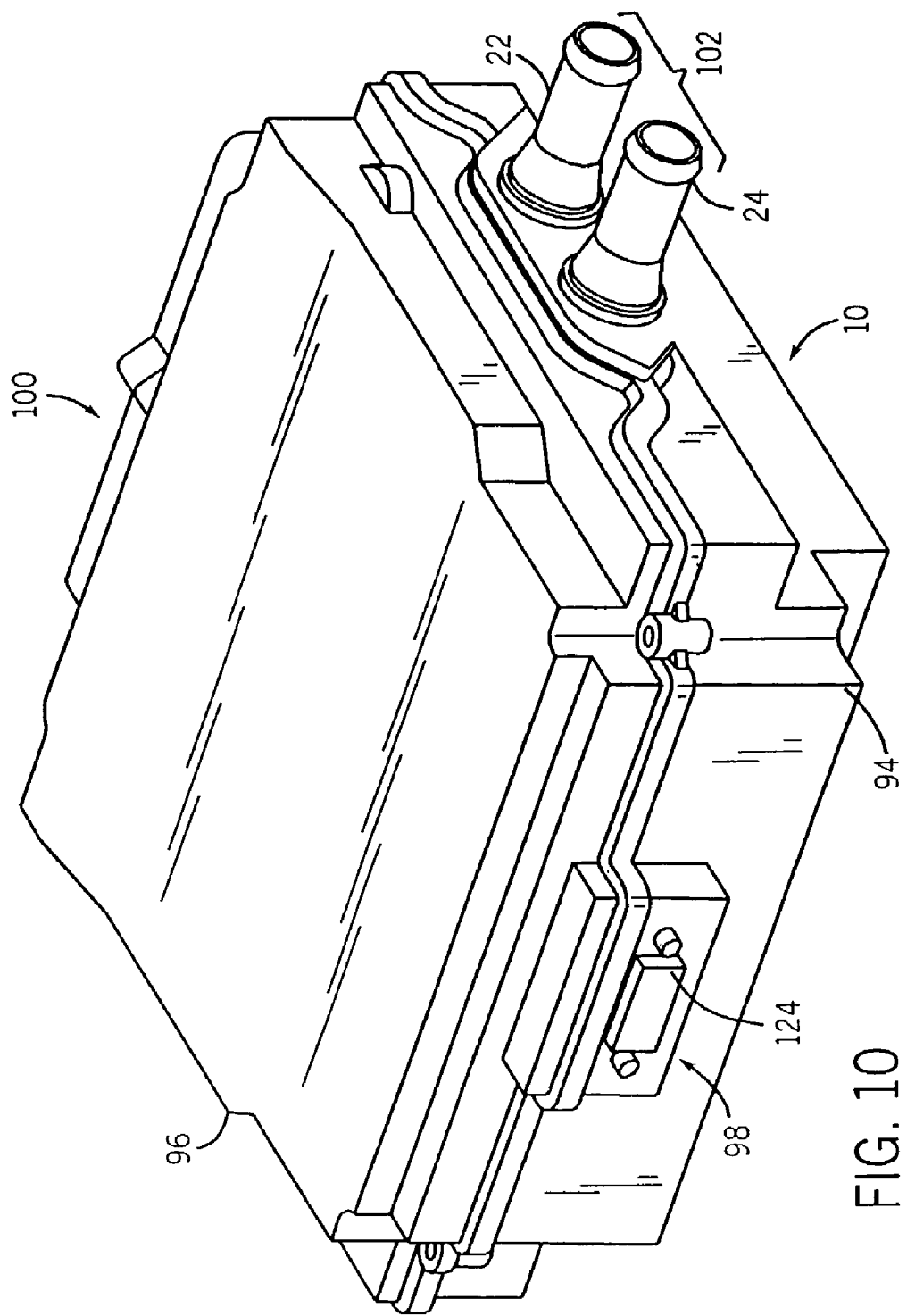
FIG. 10 is a perspective view of the package module of FIG. 9 illustrating additional interfaces on a rear side of the module package.

An alternative configuration for the housing 94 and cover 96 of the module is illustrated in FIGS. 9 and 10. As shown in FIG. 9, the housing may provide for interfaces for power conductors at different locations, such as along topside as illustrated in FIG. 9 for incoming power, and along an edge for outgoing power. Accordingly, an incoming power interface 120 may be specifically adapted to provide connections to conductors 106, such as from a DC power source. An outgoing power interface 122 may provide similar connections for conductors 108 used to transmit controlled AC waveforms to a load. As will appreciated, the interfaces may be provided either in the housing itself or in the cover, or both. The coolant interface 102 may be similarly provided at various locations about the housing and cover, such as along an edge as shown in FIG. 9.

FIG. 10 is a rear prospective or the arrangement of FIG. 9. As shown in FIG. 10, the control interface 98 may be available from various locations on the housing and cover. In the embodiment of FIG. 10 a multi-pin connector 124 is provided for receiving a control cable. Pin designations for the connection may follow any suitable protocol, and in a present embodiment may include pins designated for transmission to an RS232 or other serial or parallel data transmission port. Once closed, the housing and cover may define a water-tight, EMI-shielded package within which the circuit assembly is positioned. Moreover, the packaging may include any suitable handles, tool geometries, and the like for plugging the module into an application, or for otherwise supporting the module in an application. For example, where a handle (not shown) is provided on the package, the handle may be grasped by a user to simply plug the module into a mating interface, such as within a vehicle or enclosure.

Figure 11:
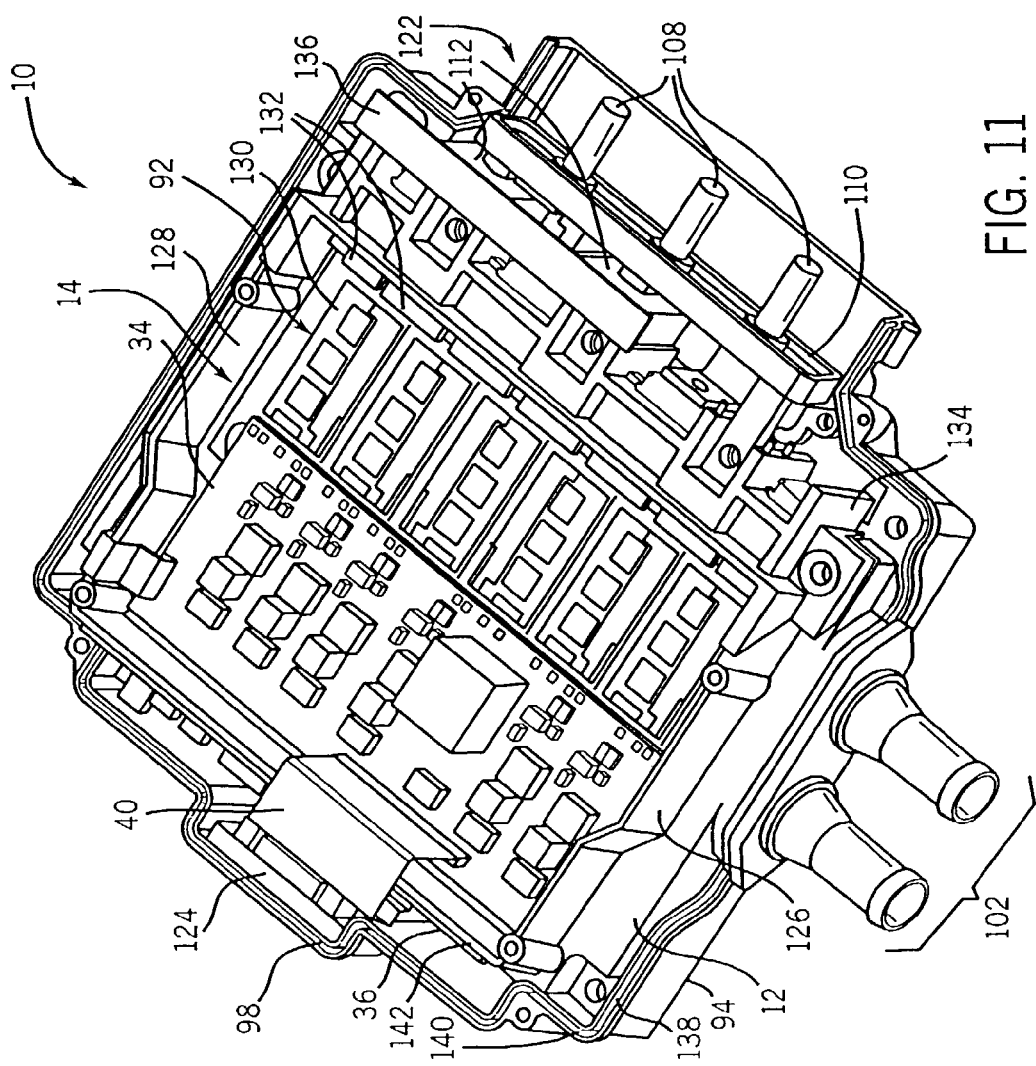
FIG. 11 is a perspective view of the package of FIG. 10 with a housing cover removed to display internal arrangements of power electronics and associated circuitry and components.

FIG. 11 illustrates certain internal configurations of the embodiment of FIGS. 9 and 10 with cover 96 removed. As shown in FIG. 11, the module 10 comprises the housing 94 in which the circuit assembly 92 is disposed. Conductors 108, separated by an interface plate 110 from the surrounding environment, are available for connection within power interface 122. A similar power interface may be provided, as illustrated in FIG. 9, for other power conductors. The control interface 98 is positioned on an opposite side of the housing in the embodiment of FIG. 11, and supports multi-pin connection 124.

In the arrangement of FIG. 11, an integral flange 126 is formed on the thermal support 12 and extends generally upwardly from the plane of the thermal support, partially replacing the removable frame illustrated in FIG. 8. The integral flange serves to support and interface the circuit assembly 92 within the housing (such as by mating with the cover where desired), and surrounds certain of the circuitry, such as to form a cavity 128 within which the circuitry is mounted and within which an insulating or potting medium may be disposed. Power electronic device subassemblies 130 are provided within the cavity, and form the power electronic circuits 14 as described more fully below. In the illustrated embodiment, six such device subassemblies or switching circuits are provided for defining a three-phase inverter circuit. As will be appreciated by those skilled in the art, in practice, two or more such switching circuits may be grouped on each device subassembly, or entire set of circuits may be provided in a single device subassembly. Connection pads 132 are provided adjacent to device subassemblies 130 for interfacing the device subassemblies with incoming and outgoing power conductors. In the illustrated embodiment, a terminal strip 134, described in greater detail below, is provided at an edge of the thermal support 12, and mates with the integral flange 126 to define the cavity within which the circuitry is disposed and within which a potting medium may be placed. The terminal strip may include molded-end features, including the connection pads 132, as well as terminals and conductors as described below.

Within the housing, various other features may facilitate interconnections between the various circuits and components. For example, in the illustrated embodiment sensor cabling 136 is provided for receiving signals from current sensors 112. Such signals may be routed, via the cabling 136 around the housing to drive circuitry 34 or control circuitry 36, so as to monitor operating conditions of the power electronic circuitry. Other types of sensors and placements of such sensors, along with signal transmission cabling may, of course, be incorporated in the arrangement.

Figure 12:
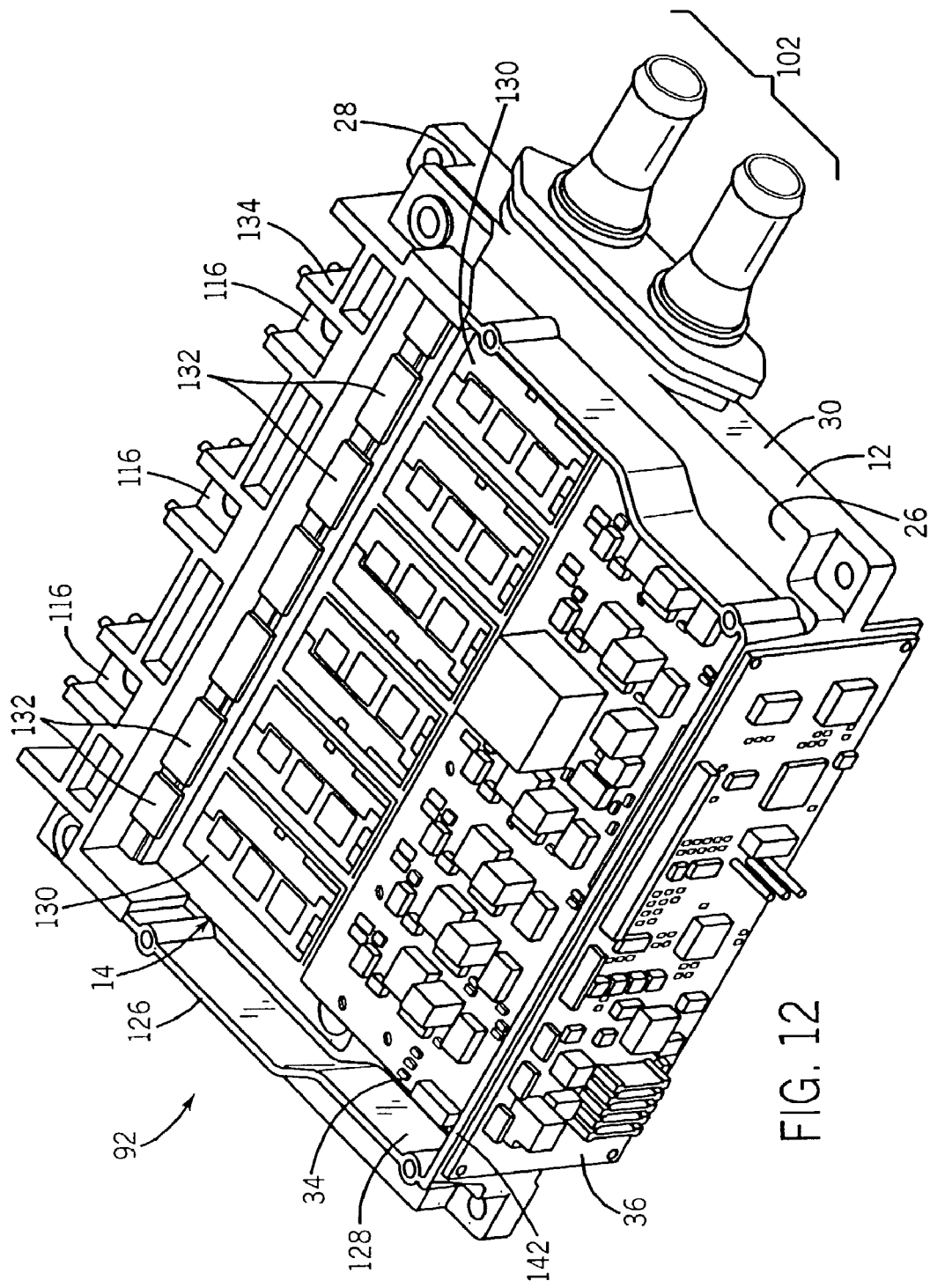
FIG. 12 is a perspective view of the internal power module as shown in FIG. 11 with the module removed from the base housing.

FIG. 12 illustrates the circuit assembly 92 of FIG. 11 removed from housing 94. Again, in the illustrated embodiment the thermal support 12 is provided with an integral flange 26 which partially surrounds the power electronic circuit 14. In the illustrated embodiment, the driver circuitry 34 for the device subassemblies 130 is also provided within the cavity defined by flange 126. The driver circuitry 34 and the control circuitry 36 may be provided on a single printed circuit board or on two or more boards, and may define a single-sided board component arrangement or double sided arrangement. Where a double-sided board is provided, spacers, standoffs, or similar arrangements may be provided for insuring that an insulating or potting material may be provided between the board and the thermal support.

Figure 13:
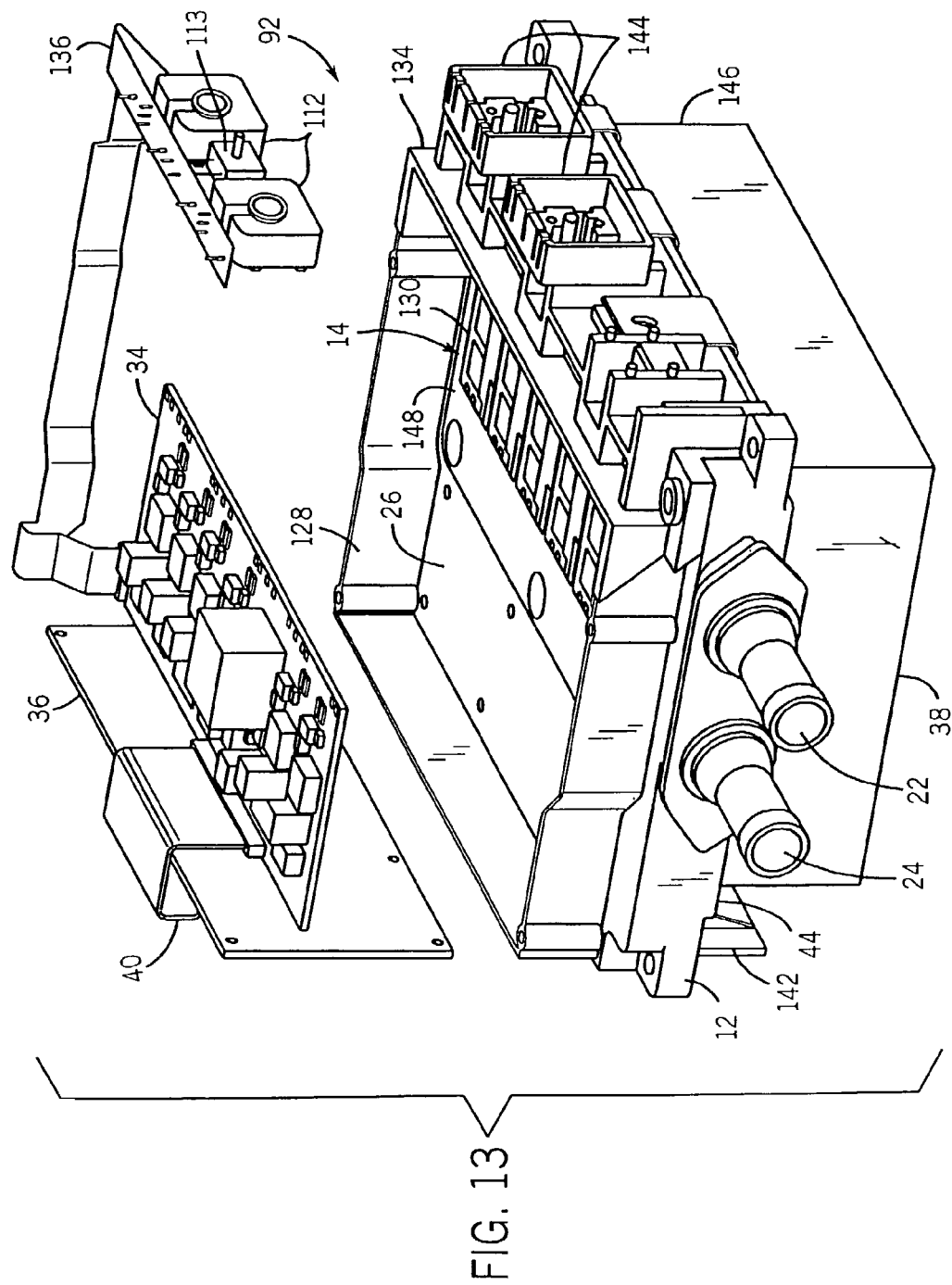
FIG. 13 is an exploded perspective view of the arrangement of FIG. 12 with control and drive circuitry removed.

Returning to FIG. 11, to provide the desired sealing, a peripheral edge 138 may be provided on the housing and cover, with a groove 140, or other interface feature, provided for receiving a seal, a sealing compound or the like. As shown in both FIGS. 11 and 12, while one or more of the circuits may be provided on a top or bottom side of the thermal support as described above, in the present embodiment, a rear board support 142 is provided as an integral feature of the thermal support 12. Thus, the control circuitry 36 may be supported on the rear board support 142 and interfaced directly with the driver circuitry via interconnections 40. These features of the present arrangement are best illustrated in FIG. 13, where the drive circuitry 34 and control circuitry 36 have been exploded from the thermal support to illustrate the manner in which they may be disposed and interconnected along with cabling 136 from sensors 112. As also shown in FIG. 13, housings 144 may be incorporated in the design, such as to support sensors 112.

A variety of interface configurations may be envisaged for mounting the various components on the thermal support 12. In the embodiment illustrated in FIG. 13, for example, an energy storage and conditioning circuitry package 38 is enclosed in a housing 146 which is mounted directly to a lower side of the thermal support 12. Capacitors within the housing 146 are interconnected with the power electronic circuitry as described more fully below. As also shown in FIG. 13, an interface plate 148 is secured to the thermal support 12 and the power electronic device subassemblies 130 are disposed directly on the interface plate 148. Thus, in accordance with aspects of the present technique, the device subassemblies may be formed directly on and processed on the interface plate 148 which is later secured to the thermal support 12. Special processing, therefore, of the components making up device subassemblies 130 is facilitated by separately processing the device subassemblies and interface plate 148, and later assembling the interface plate with the thermal support. FIG. 13 also shows an exemplary connection sensor 113 coupled to cabling 136 for detecting whether appropriate connections have been made to the module (e.g., to prevent operation until such connections are completed), as described below.

Figure 14:
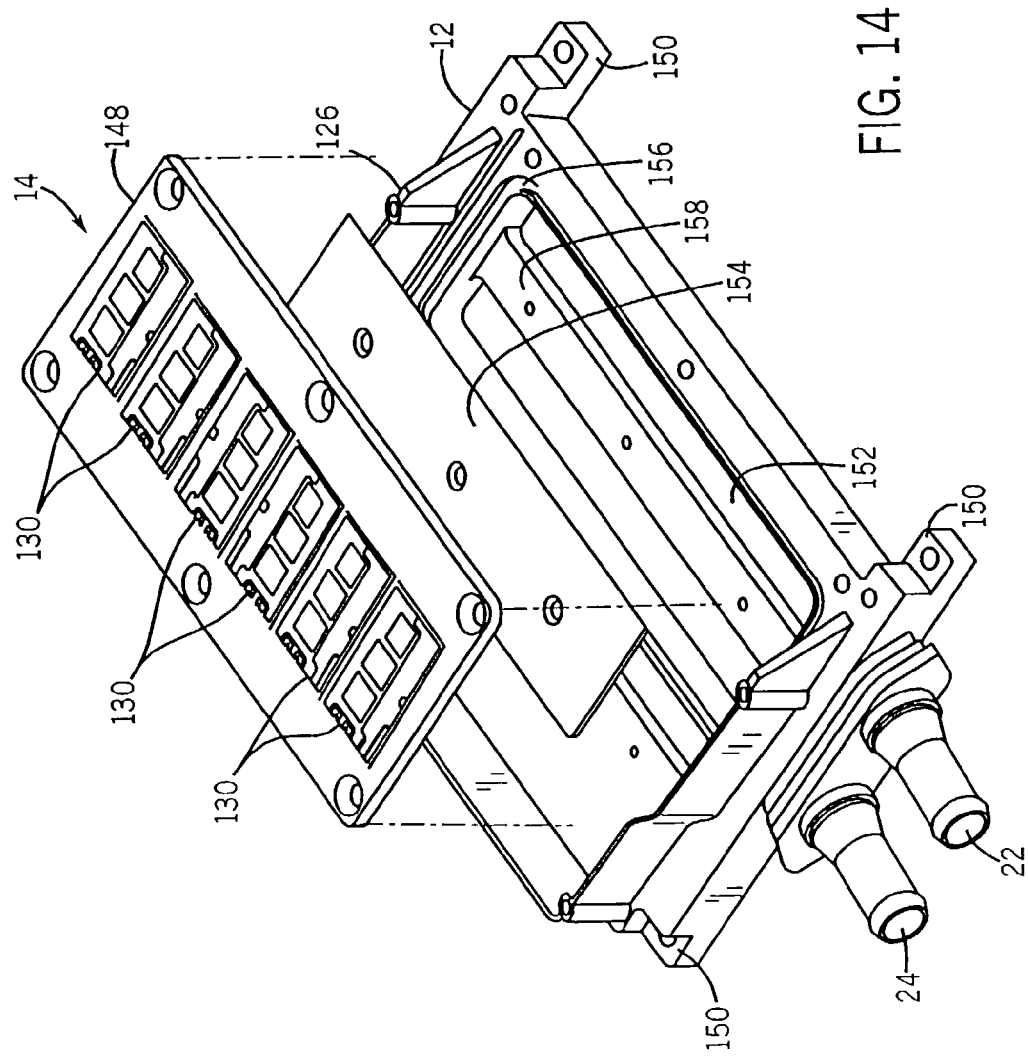
FIG. 14 is a perspective view of a thermal base and power electronics substrate and device subassembly of the type employed in the arrangement of FIG. 13.

As illustrated in FIG. 14, the interface plate 148 is assembled with the thermal support 12 in a present embodiment. Various securement features or pads may be provided on the thermal support 12, such as indicated at reference numeral 150 in FIG. 14. The pads provide locations at which the thermal support may be secured within a housing of the type described above, or another mechanical structure. The thermal support itself is preferably made of a conductive metal, such as aluminum. The support may be formed in any suitable manner, such as by assembly, machining, or, as in a present embodiment, by casting followed by certain machining operations. The support includes features which facilitate circulation of coolant for extracting heat from the power electronic circuit 14. In the embodiment of FIG. 14, these features include a trough or channel 152 formed within the thermal support. The channel extends between the coolant inlet 22 and the coolant outlet 24 for the circulation of coolant. The channel preferably extends at least along an area of the interface plate 148 to remove sufficient heat from the circuitry during operation, and may route coolant through other portions of the thermal support, such as those supporting other circuitry and components. In the illustrated embodiment, channel 152 extends beneath the interface plate 148, adjacent to a lower surface on which the energy storage and conditioning circuitry is mounted.

Features are formed within channel 152 for enhancing the heat transfer from the power electronic circuit. In the embodiment of FIG. 14, a diversion plate 154 is secured within the channel for diverting coolant within the channel. As described in greater detail below, additional heat transfer elements, such as fins or other cooling features may also be positioned within the channel, and may be integral with or separate from the interface plate 148. As also illustrated in FIG. 14, thermal support 12 may include sealing features to ensure isolation of the coolant from the circuitry mounted thereon. A peripheral channel 156 is formed in a present embodiment to receive a seal (not shown) fitted between the thermal support 12 and the interface plate 148. The seal both promotes isolation of the coolant from the circuitry, and allows for some degree of differential thermal expansion and contraction between the interface plate 148 and the support 12. Finally, in the illustrated embodiment, a baffle 158 is formed within channel 152 to further direct coolant through the channel for heat extraction. As will be appreciated by those skilled in the art, various alternative configurations, impingement surfaces, and flow of path-defining elements may be inserted into the thermal support to define desired thermal gradients and produce optimum patterns of turbulence and optimum transitions between turbulent and laminar flow regimes within the support adjacent to the power electronic circuit 14.

FIGS. 15A–15G illustrate certain exemplary configurations of features envisaged for removal of heat via the interface plate 148 and the thermal support 12. As shown first in FIG. 15A, the interface plate 148 may include integral features, such as fins 160, small heat pipes, impingement targets, turbulators. In the present embodiment, plate 148 is made of a material dissimilar to that of which the thermal support itself is comprised. The material may be adapted to the particular electronics and the methods for processing the electronic device subassembly. In a present embodiment, plate 148 is made of aluminum silicon carbide (AlSiC). A seal 162 is positioned adjacent to the interface plate 148 and would be received within a groove of the type illustrated in FIG. 14. Along a lower surface 164 of plate 148, a series of fins 160 are formed, such as during a casting operation. The fins could also be added to the plate in an assembly process. The plate also presents an upper surface 166 on which the power electronic device subassemblies 130 are formed as described in greater detail below.

Where fins 160 extend from plate 148, various types of fins and patterns of arrangement may be provided. As illustrated in FIG. 15B, the fins may be formed as pins 160 which extend from the lower surface of the plate. Again, any desired form of pin may be provided, such as pins having a generally trapezoidal cross section. In the embodiment of FIG. 15B, a straight matrix pattern 168 is provided with the pins being aligned within parallel rows and columns. As illustrated in FIG. 15C, staggered patterns 170 may be provided in which rows or columns of pins are offset with respect to one another. Moreover, as illustrated in FIG. 15D, pins 160 may extend from plate 148, while additional pins or other thermal transfer features 170 may intermesh with the pins of the plate, and extend from other plates, or from the base of the channel 152 formed within the thermal support. The fins, pins, or other thermal conduction extended area enhancements may be staggered in pitch such that when assembled one on top of the other or when inserted from opposite sides of the thermal base the patterns inter-mesh to form optimum arrangement and minimum geometry that cannot be achieved effectively by a single manufactured piece.

Figure 15F:
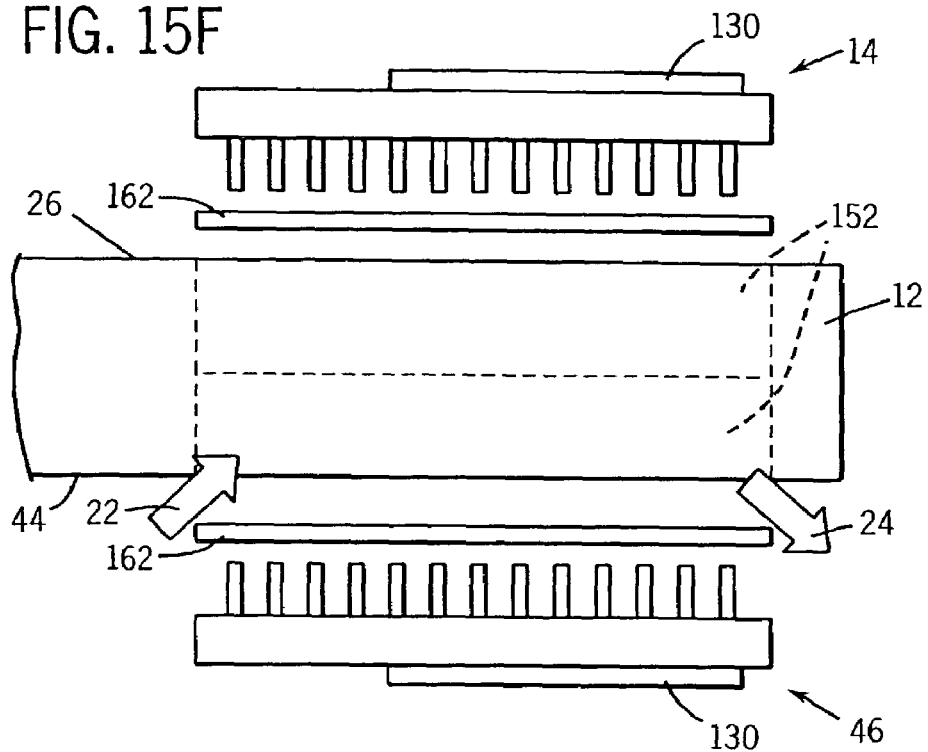
FIGS. 15A–15R are diagrammatical detail views of exemplary arrangements for mounting and removal of heat from the power electronics substrate and thermal base.
Figure 15G:
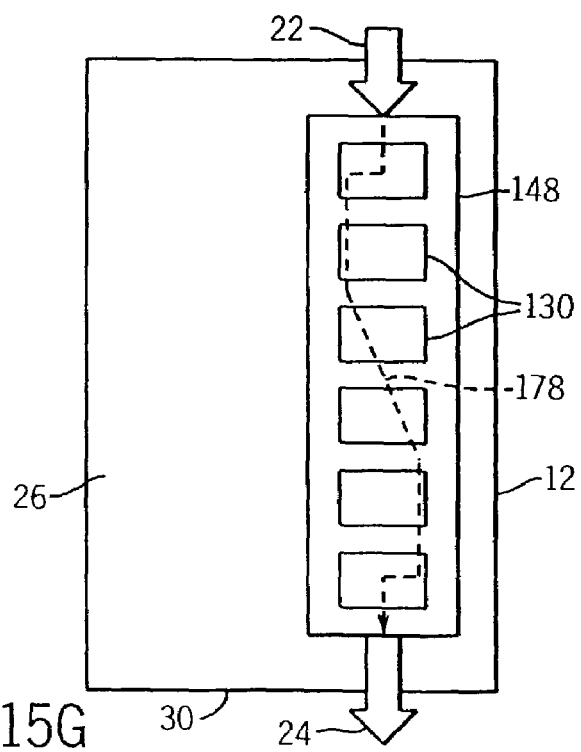

FIG. 15E illustrates an alternative configuration in which the interface plate 148 does not include integral thermal transfer features, but wherein a heat dissipation element 174 is assembled between the interface plate 148 and the base of channel 152. In a present embodiment, element 174 may include a corrugated or bent-fin structure having a plurality of generally parallel sheet-like sections defining a large surface area for heat removal; in addition, many other extended surface enhanced configurations can be accommodated by this mechanical arrangement such as metal foams, metal matrix foams, metal polymer matrix foams, and so forth. As a further alternative configuration, as illustrated in FIG. 15F, thermal transfer features may be formed on additional elements interfaced with the thermal support. In the example of FIG. 15F, power electronic device subassemblies 130 are mounted to a pair of plates on either side of the thermal support. In this case, each of the interface plates includes thermal features which extend into channel 152 for heat removal. It should be noted that where 2-sided arrangements are utilized, channel 152 may define an aperture extending completely through the thermal support, or may form two separate channels with flow paths interconnecting with one another. Alternatively, two completely separate channels may be formed within the support. Finally, as noted above, various alternative flow paths may be provided within the thermal support, as illustrated generally in FIG. 15G. Thus, owing to the form of the channel, any diversion plates and baffles, and the like within the thermal support, a flow path 178 may be defined which routes coolant in a desired path so as to establish the desired temperature gradient within the thermal support.

Figure 15H:
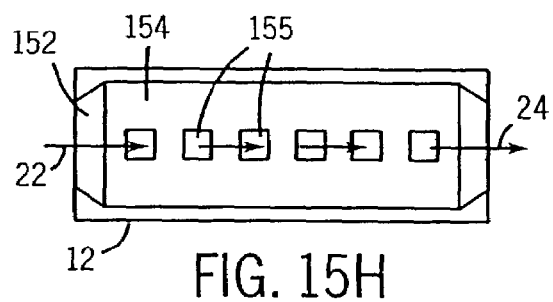
Figure 15I:
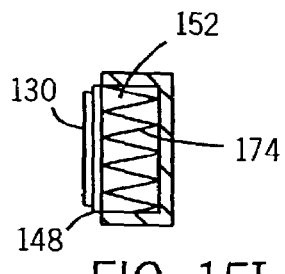
Figure 15J:
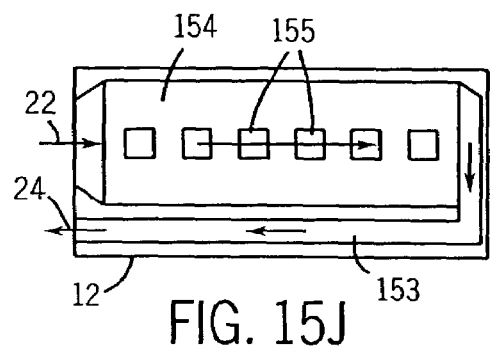
Figure 15K:
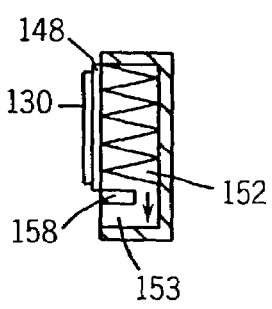
Figure 15L:
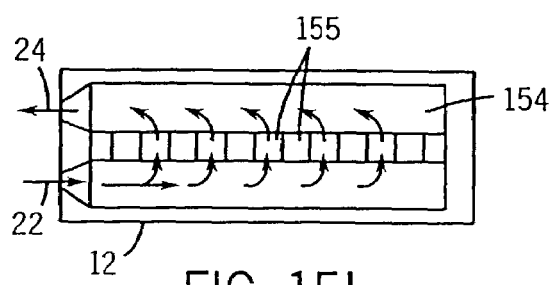
Figure 15M:
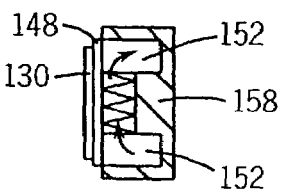
Figure 15N:
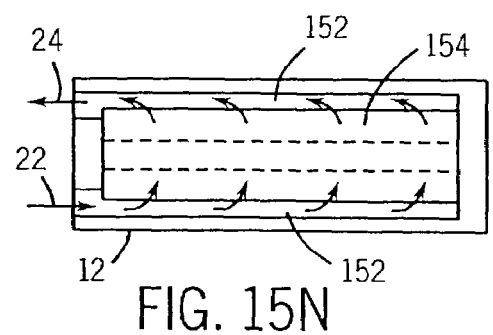
Figure 15O:
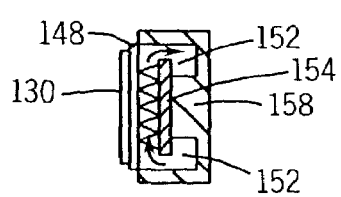
Figure 15P:
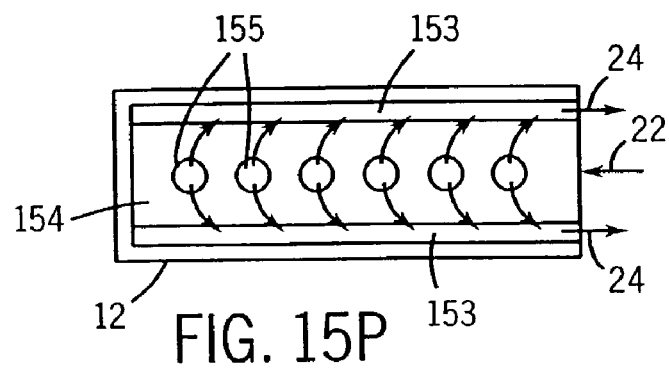
Figure 15Q:
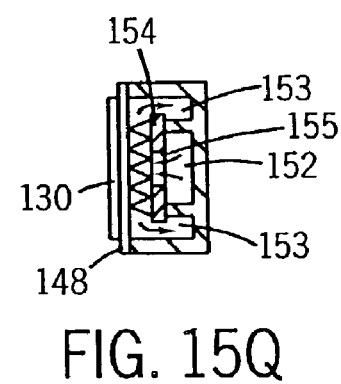
Figure 15R:
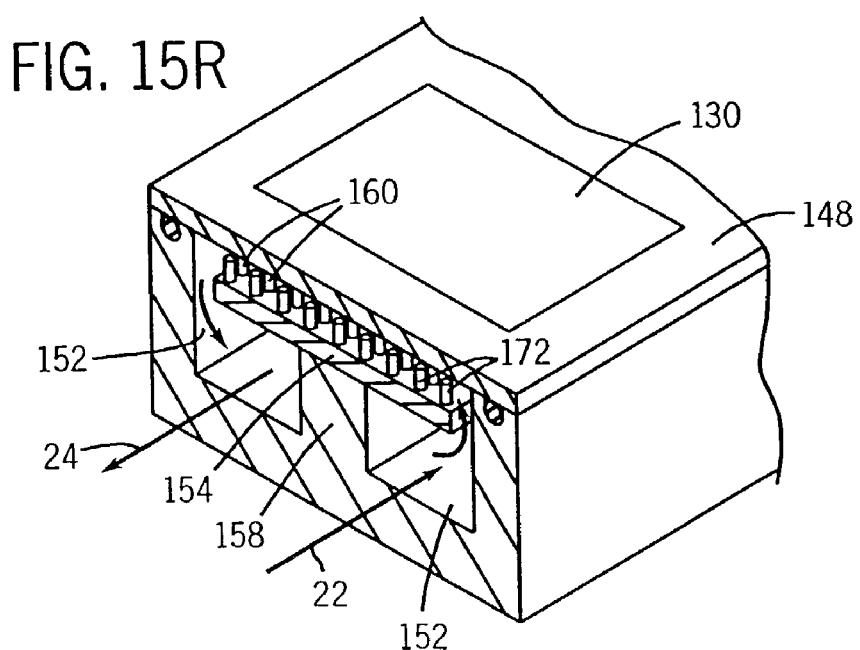

FIGS. 15H–15R represent additional alternative flow and cooling configurations designed to extract heat from the power electronic devices during operation. As illustrated in FIG. 15H, the thermal support 12 may include a diversion plate 154 provided with apertures 155 for directing flow. Flow may thus be directed through the diversion plate between a coolant inlet 22 and a coolant outlet 24. As flow is directed by the diversion plate and through the apertures, it is permitted to flow adjacent to the interface plate 148, and through or around a heat dissipation element 174 as shown in FIG. 15I. In the alternative arrangement of FIGS. 15J and 15K, a diversion plate 154 is again provided with a series of apertures 155. Flow is directed through a coolant inlet 22, around and through the diversion plate, and exits through a return channel 153. As shown in FIG. 15K, the arrangement may make use of a baffle 158 for defining a passageway between channel 152 and channel 153, and for partially partitioning these channels from one another. As shown in FIGS. 15L and 15M, in a further alternative arrangement, coolant inlet and outlets may be provided on the same side of the thermal support 12. Apertures 155 in diversion plate 154 may provide for routing coolant upwardly into close contact with interface plate 154 for flow through or around a heat dissipation element disposed between the pair of channels 152. In FIGS. 15N and 15O a diversion plate 154 is again positioned between the interface plate 148 and an internal baffle 158 to cause flow to rise up above the diversion plate and through or around a heat dissipation element. Again, flow is thus directed adjacent to the interface plate for heat removal. In the alternative of FIGS. 15P and 15Q, apertures 155 are provided in a diversion plate 154 and direct flow from a central channel 152 upwardly and around heat dissipating fins extending from the interface plate 148 as described above. Flow is then directed downwardly and into return channels 153 on either side of the central channel 152. Finally, as shown in 15R, a diversion plate may be provided in a construction similar to that described above with reference to FIGS. 15A–15E. In this embodiment, however, a baffle 158 is provided to define channels 152. Flow is then directed from a coolant inlet 22 upwardly, around the diversion plate, and through heat dissipating elements, such as pins 160 and 172 extending from the interface plate 148 and from the diversion plate 154, respectively. Following flow through the circuitous path defined by the pins, flow is directed downwardly into the opposite channel 152 and outwardly through the coolant outlet 24.

It should be noted that the various alternative configurations described herein for routing coolant can be subject to wide variation and adaptation depending upon the heat dissipating requirements, the configuration of the thermal support, the location and disposition of the power electronic circuits, and so forth. The examples provided are intended to be exemplary only.

Figure 16:
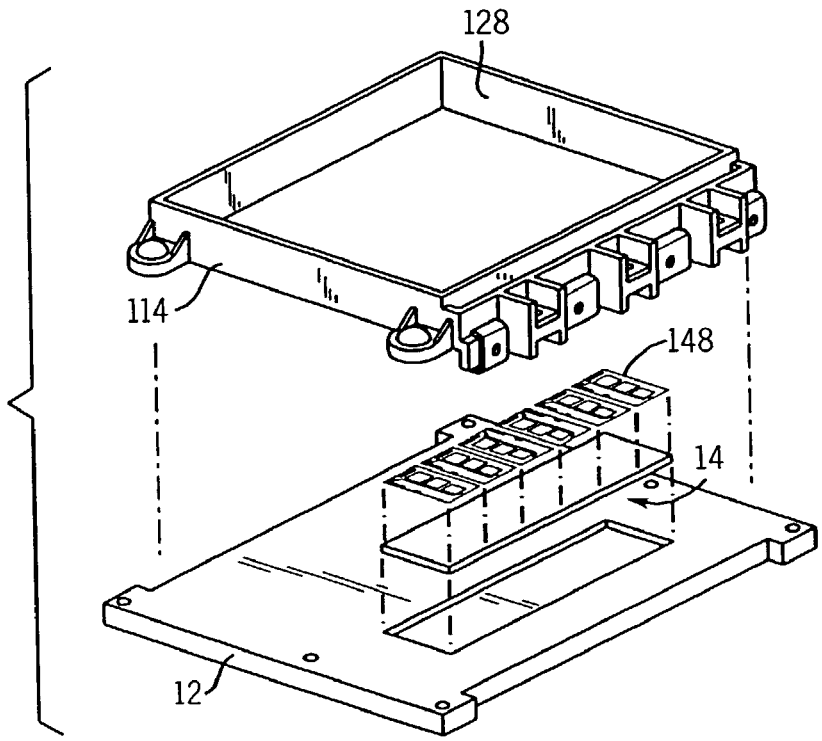
FIG. 16 is an exploded perspective view of one arrangement for providing a switch frame on a thermal base where the switch frame is removable from the base.

As described above, the interface plate 148 may be separately fabricated from the body of the thermal support 12. Moreover, the thermal support 12 may incorporate a substantial number of features useful for extracting heat, mechanically mounting the various circuitry and components, establishing an electrical reference plane for the circuitry, and shielding the surrounding circuitry, at least somewhat, from stray electromagnetic interference generated by operation of the power electronic devices. The thermal support structure may be formed out of a number of materials and manners (e.g., polymers, polymer matrix composites, thermosetting materials and processes, utilizing a number of net shape, forming, discrete machining, fixture bonding, and similar Processes). The number of integrated features that the thermal base may provide may be broken into cellular elements that can be included or excluded by means of settings in the tooling of manufacture so that many power electronic designs, topologies, and configurations can be built to order from the core elements embodied in the tooling and design. Moreover, features may be formed on or added to the thermal support for receiving the interface plate 148 and for defining a volume in which an insulation or potting material may be deposited. In present embodiments, the thermal support may include a partial integral flange 126 (see, e.g., FIG. 14). In alternative arrangements, a frame 114 may be added to the thermal support to accomplish certain of the mounting and insulation and potting functions, as illustrated in FIG. 16. In this embodiment also, however, the thermal support 12 is fabricated separately from the interface plate 148 to permit any special processing of the circuitry disposed on the interface plate.

Figure 17:
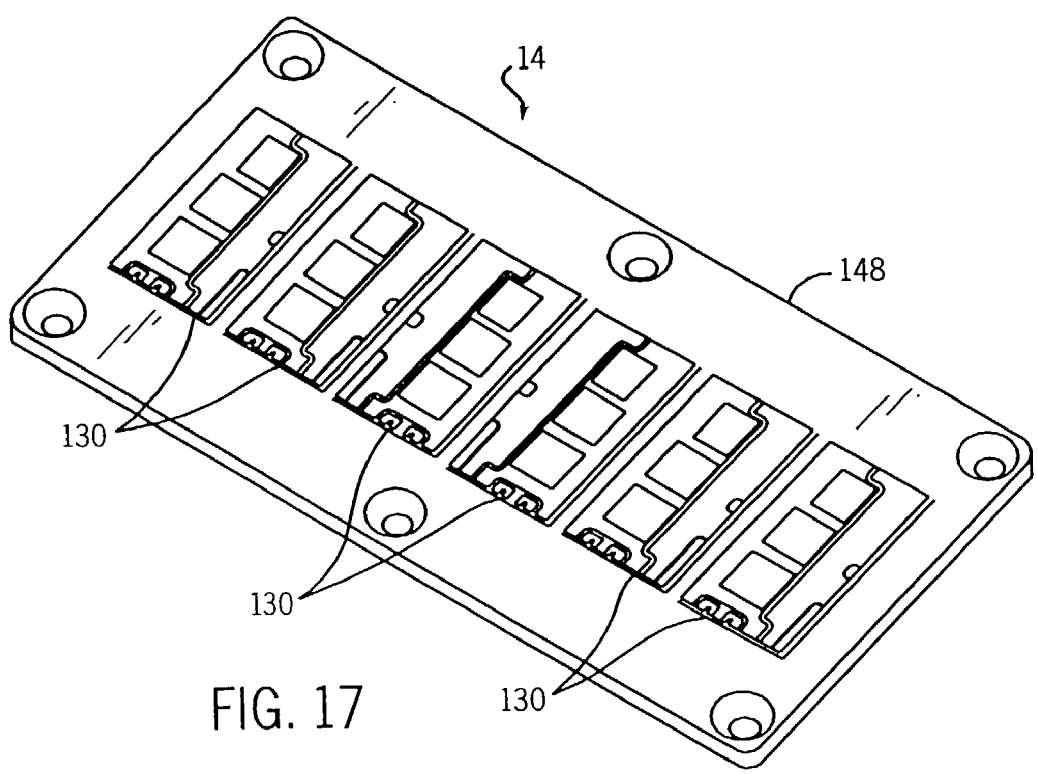
FIG. 17 is a perspective view of a substrate for use with a thermal base and illustrating an exemplary layout of power electronics device subassemblies on the substrate.

FIG. 17 illustrates an exemplary interface plate 148 with power electronic device subassemblies 130 disposed thereon. As noted above, the interface plate forms a substrate on which the power electronic device subassemblies are disposed, and may be made of any suitable material. In a present embodiment, however, the plate is made of AlSiC. The material of which the plate is fabricated is preferably at least partially thermally matched to the materials utilized for the power electronic device subassemblies disposed thereon. Thus, while different coefficients of thermal expansion will be anticipated between the materials, these are preferably kept to a level sufficiently low to reduce stresses between the materials and to prevent or significantly limit delamination of the materials from one another during their useful life.

Figure 18:
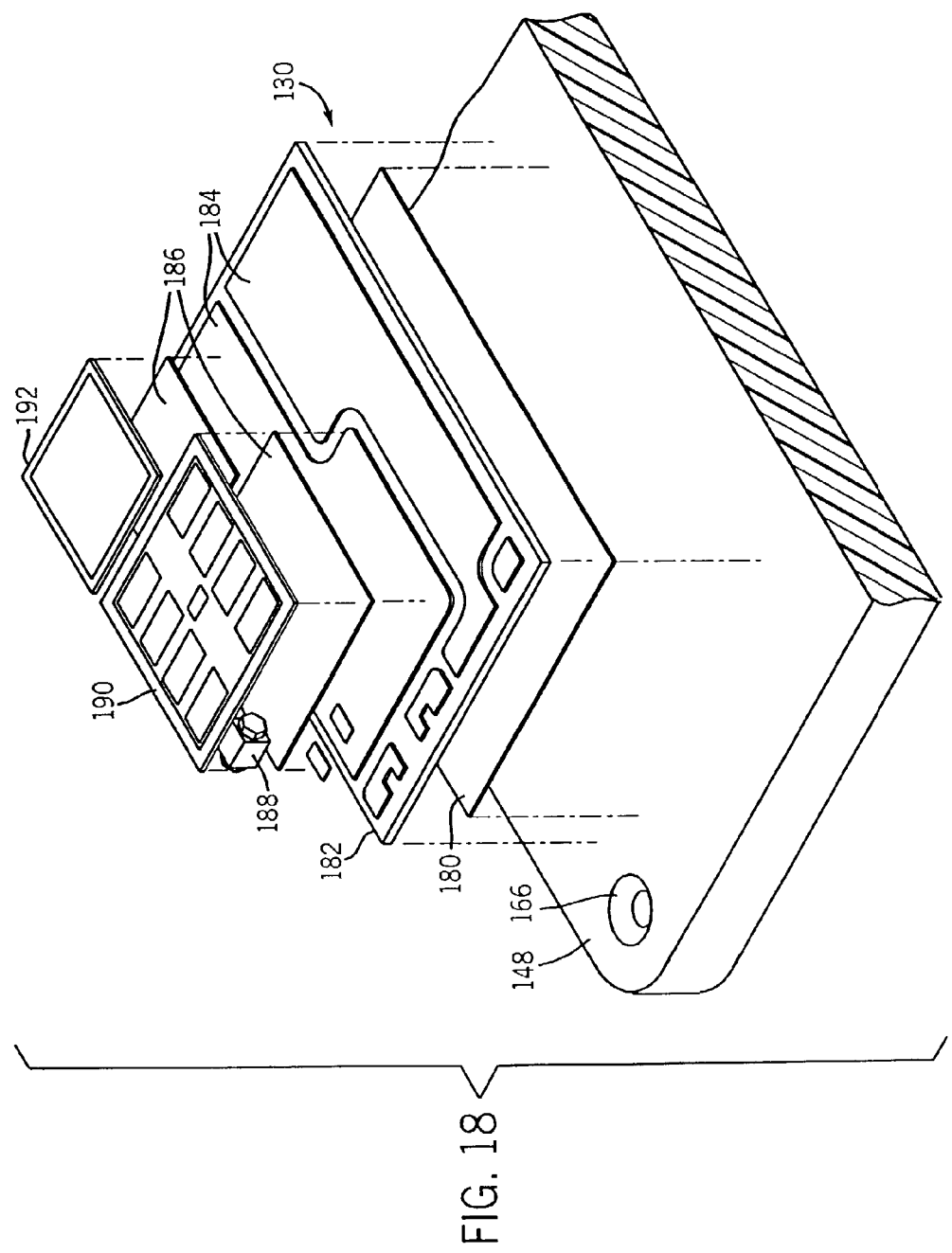
FIG. 18 is an exploded perspective view of one of the exemplary device subassemblies shown in FIG. 17 and a preferred manner of forming the device subassembly on the substrate.

An exemplary electronic device subassembly is illustrated in FIG. 18. As noted above, the electronic device subassembly 130 is placed directly on the interface plate 148 to promote good thermal transfer from the electronics devices to the interface plate. In the embodiment of FIG. 18, a bonding layer 180 is disposed on the plate 148 at a pad location corresponding to the location of the respective device subassembly 130. A substrate 182 is then placed on the bonding layer 180. The substrate includes pad locations for mounting the power electronic circuits and for interconnecting circuits with external circuitry. In the illustrated embodiment, the substrate 182 is a direct bond copper or direct bond aluminum substrate including pads for the electronic devices and pads for wire bonding the interconnections between the devices and the interfacing circuitry. A ceramic electrical insulating layer and a metal layer beneath the ceramic layer may be provided, but are not visible in FIG. 18. Thus, regions of direct bond material 148 are formed directly on the substrate prior to assembly. At locations where the electronic devices are to be placed, additional bonding layers 186 are provided. Bonding layers 186 may be similar to bonding layer 180 interposed between the substrate 182 and the interface plate 148. Where desired, sensors may be incorporated into the device subassembly, such as a temperature sensor 188 in the embodiment illustrated in FIG. 18. The power electronic devices are then placed on the bonding layers 186. In the illustrated example, each device subassembly 130 forms a portion of an inverter circuit, and thus includes a solid state switch assembly 190 (such as an IGBT assembly) and a fly-back diode assembly 192. Again, interconnections between the switch assembly 190 and the diode assembly 192 are made subsequently by wire bonding.

The device subassembly design illustrated in FIG. 18 provides several significant advantages. For example, a grease layer which might otherwise be employed in such arrangements is eliminated by direct bonding of the device subassembly to the interface plate 148. The use of direct bond copper or direct bond aluminum for substrate 182 provides high voltage insulation, good thermal characteristics, and good expansion control during operation of the device. Again, the selection of the particular materials employed in the device subassembly preferably provide for reduced differential thermal expansion and contraction, at least for adjacent components of the device subassembly. Where desired, the material selections may provide for a gradient in thermal expansion and contraction coefficients to further reduce stresses.

Figure 19A:
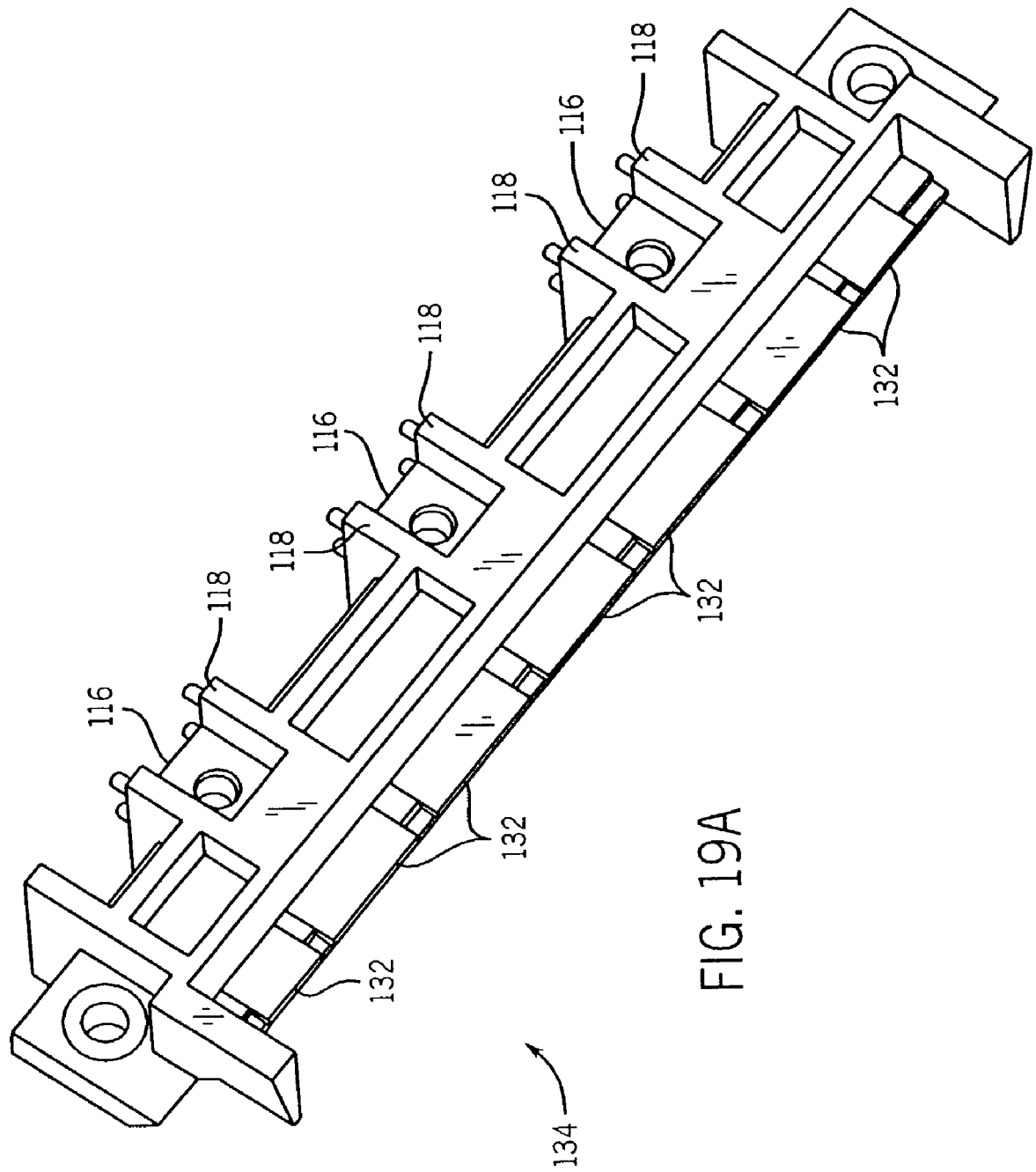
FIGS. 19A and 19B are perspective view of an exemplary terminal strip employed with a thermal base for routing incoming and outgoing power to power electronic devices and their associated circuitry.
Figure 19B:
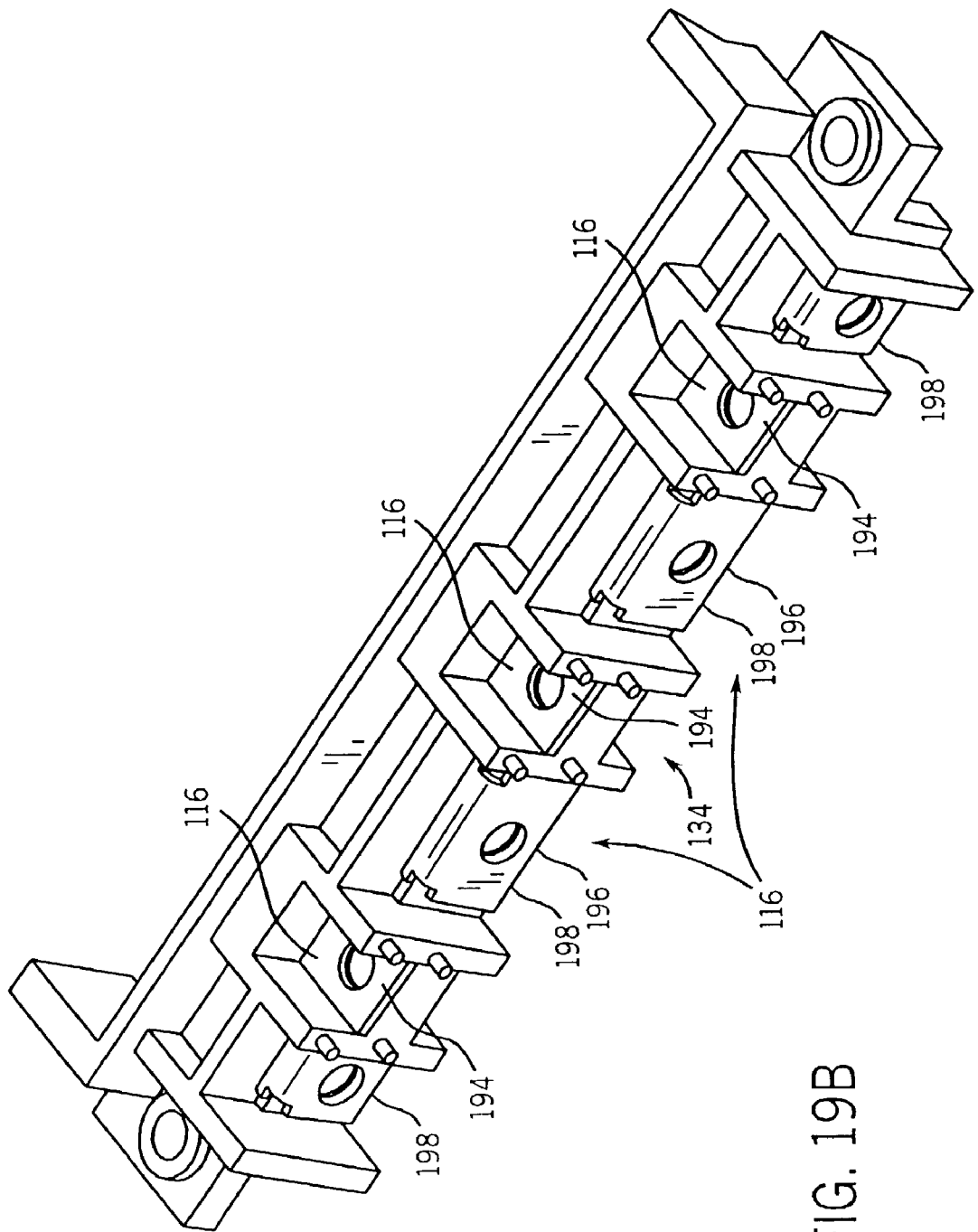

FIGS. 19A and 19B illustrate a present embodiment for a terminal strip used to channel power to and from the power electronic devices described above. The terminal strip is particularly well-suited for use with a thermal support of the type illustrated in FIGS. 11–13. The features of the terminal strip may, however, be incorporated into other types of structures within the device, such as the frame 114 illustrated in FIG. 16. The terminal strip 134 includes features designed to serve as terminal or contact points for the conductors described above. The strip also provides conductive elements or straps which communicate between the power electronics circuitry and energy storage and conditioning circuitry, thereby eliminating the need for a DC bus as in conventional devices. Thus, as illustrated in FIG. 19A, terminals 116 are provided for the outgoing power conductors (not shown in FIG. 19A). Terminals 116 are separated from one another and from conductors for the incoming DC power by insulative separator 118. On a back side of the terminal strip 134 a series of connection pads 132 are provided and are integral with the terminal conductors as described below.

As shown in FIG. 19B, on a connection side of the terminal strip, terminals include elements designed to interface with conductors for the incoming DC power in the embodiment shown. It should be borne in mind, however, that where other power types and ratings are provided, such as for incoming and outgoing AC power as in converter circuits, the configuration of the terminal strip can be adapted accordingly.

The terminal strip illustrated in FIGS. 19A and 19B is particularly well-suited for fabrication via molding operations, being itself made of an insulative material. The various conductors and conductive elements of the terminal strip may be molded in place within the insulative material so as to be easily retained within the material for later installation and connection. As shown, in FIG. 19B, power terminal conductors 194 are embedded within the insulative material of the terminal strip for connection to leads or conductors interfacing the terminal strip with outgoing power lines. Additional terminals 196 are provided for similar leads for coupling the terminal strip to incoming power conductors. In the embodiment illustrated in FIG. 19B, the terminals 196 are formed as conductive straps which permit connection of the incoming power, typically direct current power in an inverter application, with elements on both sides of the thermal support as described below. In particular, because in applications requiring energy storage and conditioning circuitry conductive paths may be required between the power electronic devices and a capacitor bank, the arrangement of FIG. 19B permits such connections to be easily made without the need for a DC bus. Accordingly, it has been found that the arrangement reduces the incidence of parasitic inductance within the assembly. In the embodiment of FIG. 19B, similar conductive straps 198 are provided at ends of the terminal strip to further facilitate connection to the power electronic devices as described more fully below. The molded (or net shaped) interconnects can be made of various combinations of thermally conductive but electrically insulating materials or elements. These may include but are not limited to: thermally conductive polymers, polymer combinations with direct bond copper, direct bond aluminum, ceramic metal sprayed systems, sheet electrical insulators, fluid coolant ports and passages, and so forth. By using thermally conductive polymers (which may, however be electrically insulating) for the support structure of the conductors in terminal strip 134, a direct thermal path between the conductors 116 and 198 and the thermal support 12 allows for cooling of those conductors and interconnections with them. This provides a major cooling path for the conductors and reduces heat flow into any components connected to them. This also allows for reduced heating of the energy storage and conditioning circuitry package attached to the terminal strip, as well as any connector circuitry also attached to the terminal strip. The reduced heating, in turn, promotes greater reliability of the circuit components as well as a higher electrical rating. A further benefit of the arrangement is to reduce stress on external, interconnecting components and circuitry.

Figure 20:
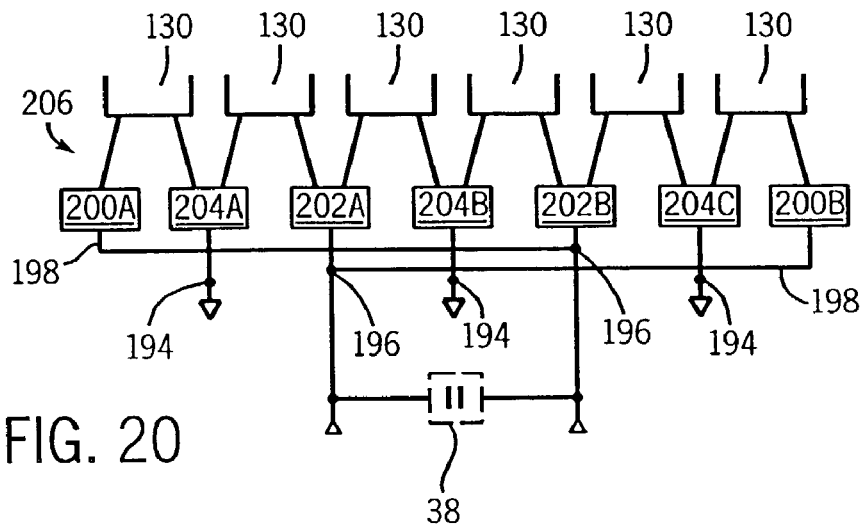
FIG. 20 is a diagrammatical representation of a preferred layout of terminals and conductors in a terminal strip of the type illustrated in FIG. 19.

As shown in FIG. 20, the arrangement of the terminal strip of FIGS. 19A and 19B facilitate interconnection of the power electronic device subassemblies 130, the energy storage and conditioning circuitry 38, and the terminals of the device. In particular, the arrangement of FIG. 20 provides power electronic device subassemblies 130 arranged in a row of six device subassemblies. In a typical inverter application, two such device subassemblies will be associated with each output phase so as to provide positive and negative lobes of a simulated AC waveform. In the arrangement shown, first end pads, which may be referred to as DC end pads 200A and 200B, are provided adjacent to each end of the terminal strip. End pads 200A and 200B correspond to the end pads 132 adjacent to ends of the terminal strip illustrated in FIG. 19A. Additional pads 202A and 202B are provided spaced from pads 200A and 200B at locations corresponding to the incoming power terminals 196 (see, e.g., FIG. 19B). Finally, pads 204A, 204B and 204C are provided at locations corresponding to the outgoing power terminals 194. Pads 200A and 202B, and pads 200B and 202A are interconnected as illustrated in FIG. 20 so as to electrically couple the pads adjacent to ends of the terminal strip to the pads adjacent to terminals 196 as shown in FIG. 20. These same interconnected pads are then electrically coupled to high and low sides of the energy storage and conditioning circuitry 38 as illustrated diagrammatically in FIG. 20. The device subassemblies 130 are then electrically coupled to pads 200A, 200B, 202A, 202B, 204A, 204B and 204C as illustrated in FIG. 20 such as by wire bonding connections 206. This wire bonding, it will be noted, effectively couples each device subassembly both with a pad electrically coupled to the energy storage and conditioning circuitry 38, and to a pad associated with an outgoing power terminal 194. Many alternative methods of bonding the device subassemblies to the power terminations may be envisioned in the present technique; for example: tape bonding, metal braid resistance welding, brazing, mechanical attachment, laminated thin metal tapes, soldered or brazed metal straps with intrinsic strain relief, flexible metal straps with gas tight pressure connections, and so forth. Each pair of device subassemblies then, defines a portion of the inverter circuit for each phase of outgoing power.

Figure 21:
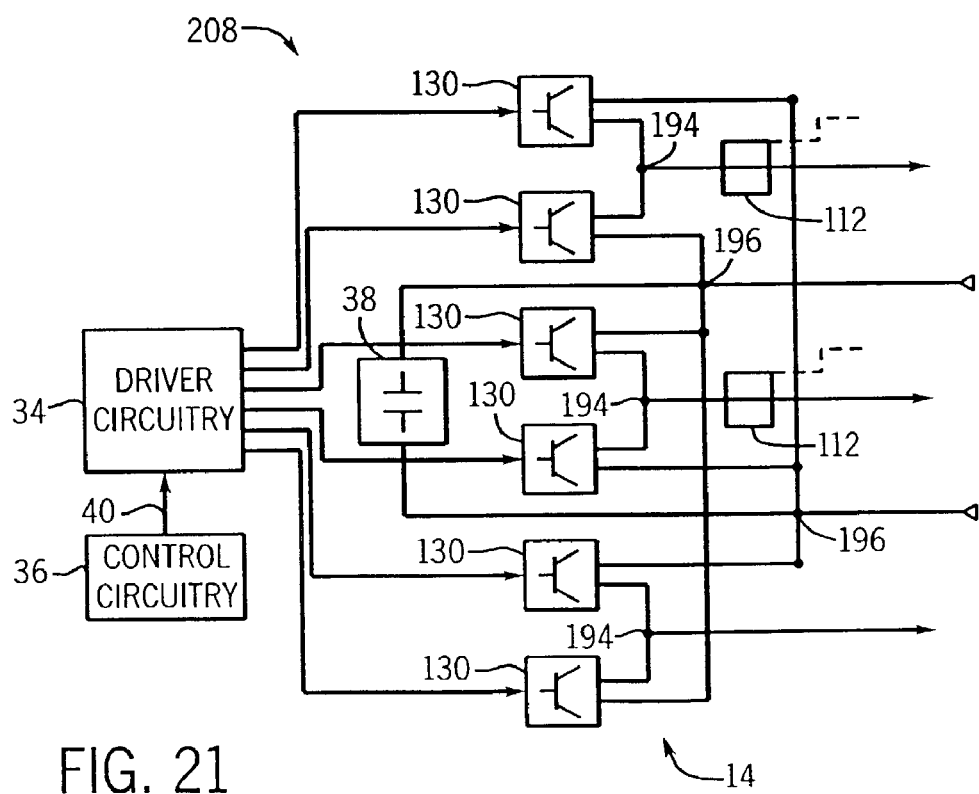
FIG. 21 is a circuit diagram illustrating the signal flow offered through the layout of FIG. 20.

FIG. 21 illustrates diagrammatically the electrical circuit established through the terminal and interconnection arrangement of FIG. 20. As shown in FIG. 21, control circuitry 36 is interconnected with driver circuitry 34 in a typical inverter drive application, such as via interconnections 40. The driver circuitry 34, which may be mounted on the same side of the thermal support described above as the power electronics devices forming the inverter circuit itself, is interconnected with the device subassemblies 130 via additional wire bonding 208. Each device subassembly 130, then, is electrically coupled to an output terminal 194 positioned at alternate locations along the terminal strip illustrated in FIGS. 19A and 19B. The device subassemblies 130 are also electrically coupled to the incoming power terminals 196, and circuitry 38 is similarly coupled to the terminals via the straps 98 illustrated in FIG. 19B. Also in the example illustrated in FIG. 21, sensor circuitry 112 is associated with at least two of the outgoing power lines.

Figure 22A:
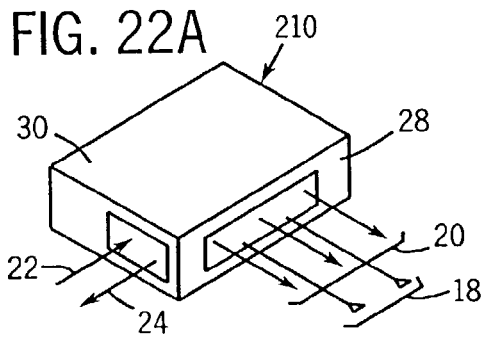
FIGS. 22A–22F are diagrammatical perspective views of an exemplary power electronics module illustrating various possible routing orientations for incoming power, outgoing power, and coolant.
Figure 22B:
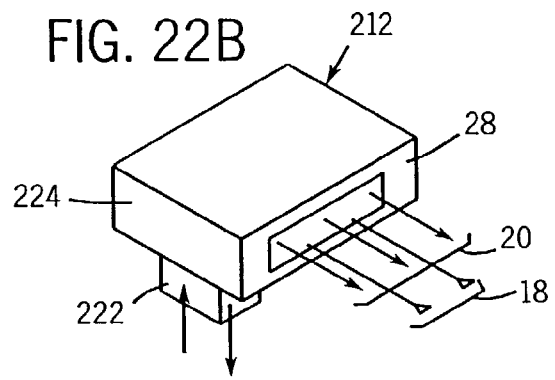
Figure 22C:
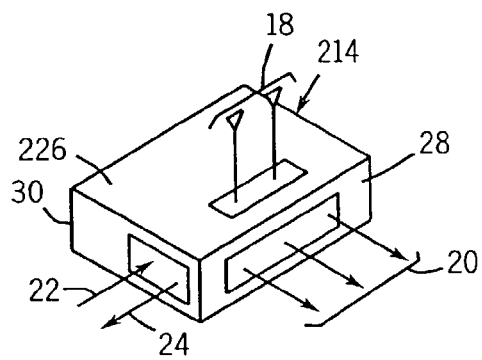
Figure 22D:
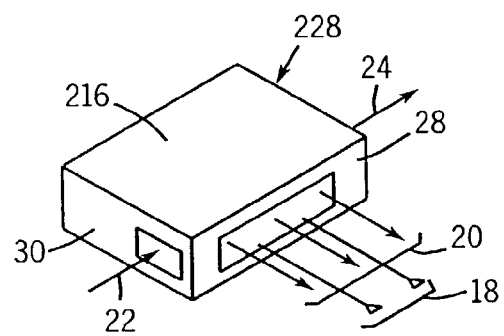
Figure 22E:
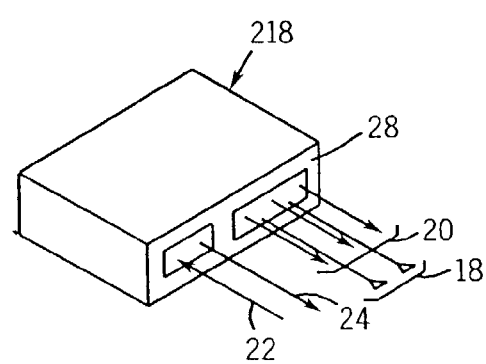
Figure 22F:
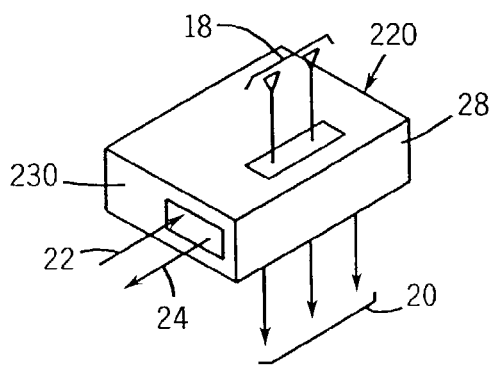

As noted above, the packaging and configuration of the module 10 may be arranged so as to permit incoming power and outgoing power to be routed in a variety of manners depending upon the arrangement of interface circuitry and components. The packaging may also permit various routing arrangements for coolant. FIGS. 22A–22F illustrate exemplary arrangements for such routing options. As shown in FIG. 22A, a first configuration 210 corresponds generally to that illustrated in FIG. 8. That is, incoming power conductors 18 are provided along an edge 28 of the module, along with outgoing power conductors 20. Incoming coolant line 22 is provided along an adjacent edge offset from edge 28, along with outgoing coolant line 24. In an alternative configuration 212 shown in FIG. 22B, the incoming power conductors 18 and outgoing power conductors 20 are again provided along edge 28. However, coolant is supplied and returned via a manifold 222 provided along a bottom side 224 of the module. In an other alternative configuration 214 shown in FIG. 22C, incoming power conductors 18 enter through a top side 226 of the module. Outgoing power conductors 20 are still provided along edge 28, and coolant lines 22 and 24 are provided along edge 30. In another configuration 228 of FIG. 22D, incoming power lines 18 enter through edge 28, as do outgoing power lines 20. In this embodiment, however, coolant enters through an edge 30 of the module as indicated at line 22, and is extracted from the module along an opposite edge at line 24. As will be appreciated by those skilled in the art, such arrangements may be useful for establishing desired temperature gradients through the module as defined by coolant flow and the positioning of heat-generating elements within the assembly. In a further alternative configuration 218 shown in 22E, all lines, incoming power 18, outgoing power 20, and coolant lines 22 and 24, are accessed along edge 28. Thus, arrangement 218 of FIG. 22E may facilitate one-sided or plug-in mounting of the module. As a further example of alternative interconnections, the configuration 220 of FIG. 22F provides incoming power lines 18 along a top side of the module. Outgoing power lines 20 are provided along an opposite bottom side. Coolant may be routed through another surface, such as edge 230 as indicated for lines 22 and 24 in FIG. 22F.

Figure 23:
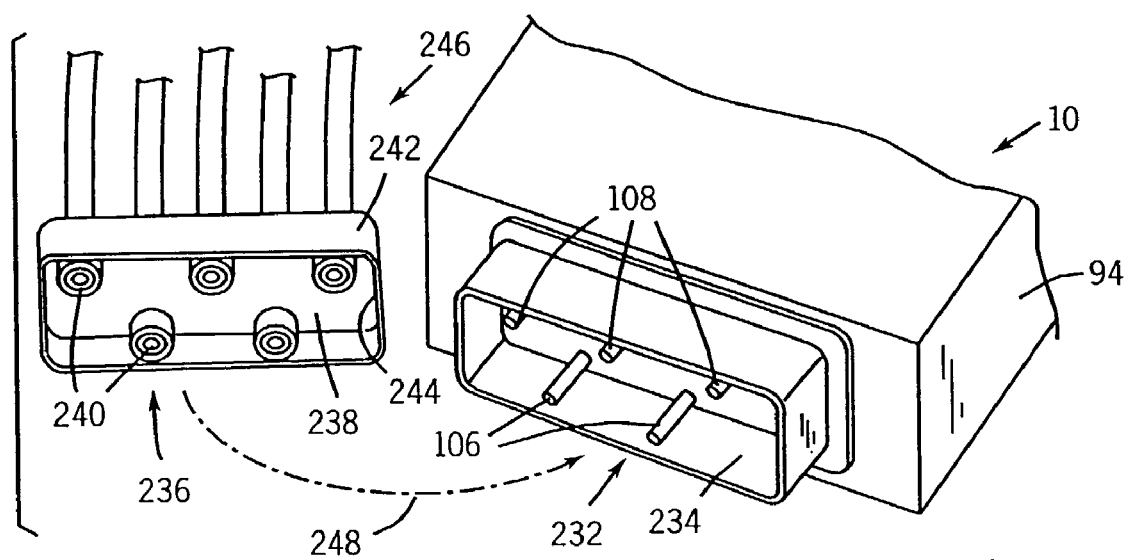
FIG. 23 is a perspective view of an exemplary connector interface for use in a power electronics module in accordance with aspects of the present technique.
Figure 24:
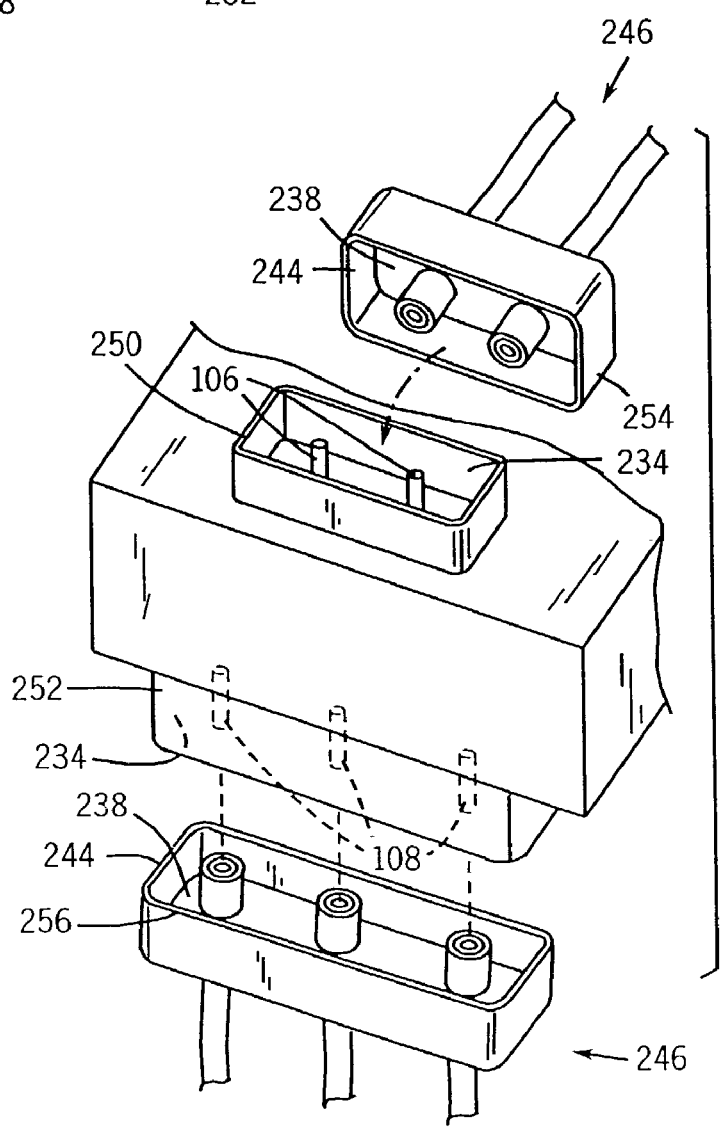
FIG. 24 is a perspective view of an alternative connector interface arrangement designed to achieve various orientations of the type illustrated in FIG. 22.

As noted above, various connector configurations can be provided in the present technique for routing power and coolant to and from the module. FIGS. 23 and 24 illustrate exemplary configurations for plug-in connections to the module. As illustrated in FIG. 23 where multiple connections are provided on one surface of the module, a ganged-type connector may be employed. A connection interface, designated in FIG. 23 by reference numeral 232 may thus include a plurality of conductors extending from the module 10. In FIG. 23 connectors 106 and 108 have a generally circular or cylindrical shape. Other forms may, of course, be employed, such as flat conductors, plate-like conductors, angled conductors, and so forth. The connector interface 232 in FIG. 23 is surrounded by a peripheral flange 234 which serves both to align a mating connector 236 and to extend shielding of the conductors beyond the housing of the module. Accordingly, flange 234 may, where desired, be a metallic extension of the housing. The mating connector 236 preferably includes an insulation plate 238 which forms a rear wall of the connector and which at least partially surrounds interface sockets 240. The housing 242 of the mating connector 236 supports the insulation plate and interface sockets, and interconnections between the sockets and leads 246 are made within the connector. A peripheral wall 244 may extend around the sockets to provide protection for the sockets, alignment with flange 234 of interface 232, and extension of shielding to the sockets and connections once made.

The connections are made to the module, then, by simply plugging the mating connector 236 into the interface 232 as indicated by arrow 248. As will be appreciated by those skilled in the art, various locking features, securement features, straps, fasteners, or the like may be provided to ensure that the connector is fully and securely installed. Moreover, a sensor or switch assembly (not shown) may be provided in either the connector interface 232 or the mating connector 236 to sense whether the connection is appropriately completed. Feedback signals from such devices may be used by the controller to prevent or limit application of power to the module until appropriate interconnections are made.

In configurations employing more than one entry location for conductors, multiple connectors may be provided as indicated in FIG. 24. The arrangement of FIG. 24 provides two incoming power conductors 106 along a top surface of the module, with three outgoing power conductors 108 along a bottom surface as in the arrangement of FIG. 22F. As shown in FIG. 24, a first connection with the incoming power conductors from leads 246 is made at an incoming power connection interface 250. The incoming power connector 254, in the illustrated embodiment, may include a peripheral flange 244 as in the previous example, with an insulation plate 238 protecting connections between the leads and interface sockets. The connector 254 is then simply plugged into the incoming power connector interface 250. Outgoing power connections are made in a similar manner via an outgoing power connector interface 252. This interface, similarly, is surrounded by a peripheral flange 234. A connector 256, similarly surrounded by a peripheral flange 244 and having an insulation plate 238, is connected into the outgoing power connector interface 252. Again, shielding may be provided at one or both locations by the cooperation of the peripheral flanges. Also, securement devices may be provided at each location to ensure that the connectors are appropriately made. As in the previous example, sensors or switches may be provided in both connectors to ensure that the appropriate connections are made prior to application of power to the module.

Figure 25:
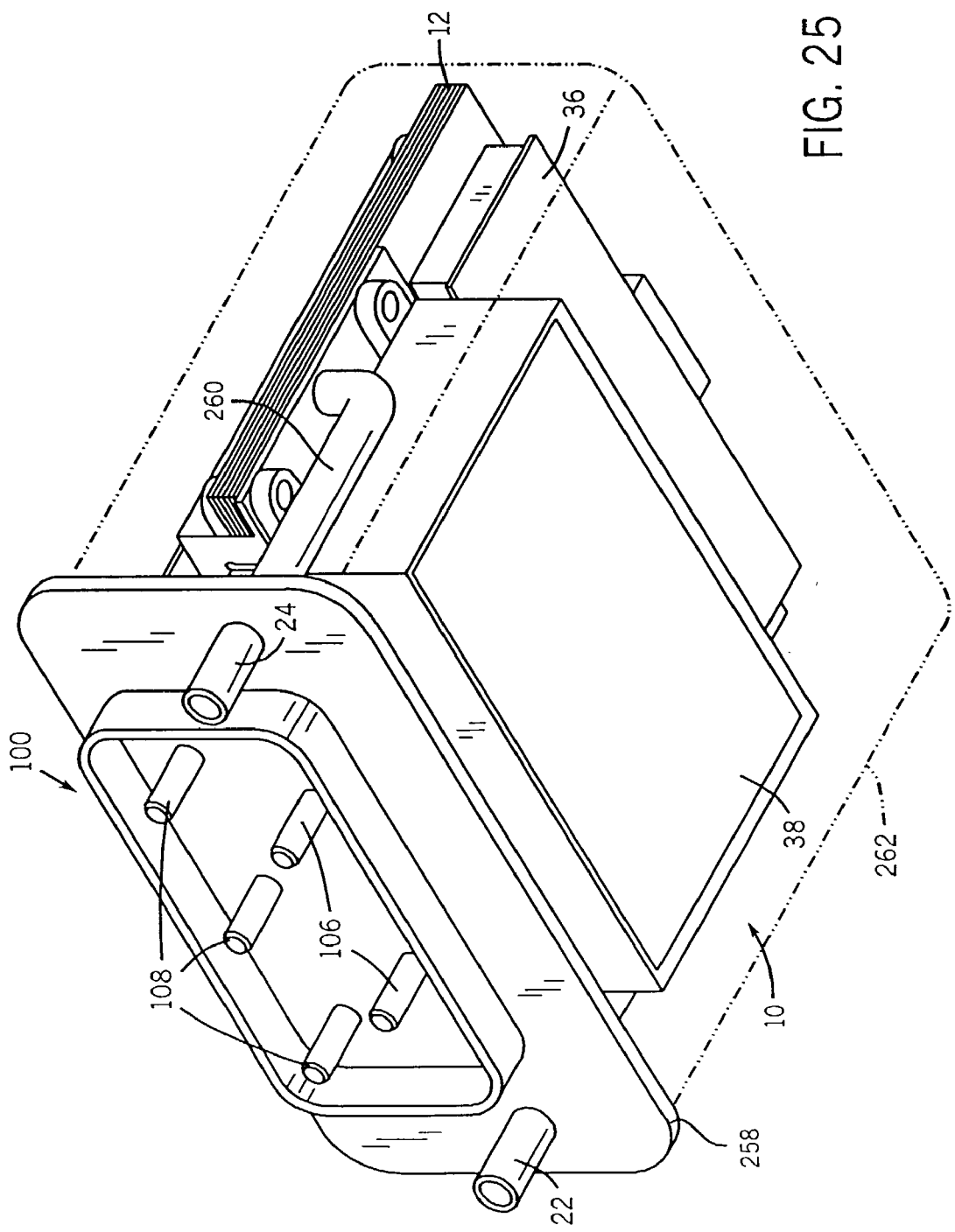
FIG. 25 is a perspective view of an alternative configuration for power electronics module wherein a canister is provided for mounting and shielding of the module components.
Figure 26:
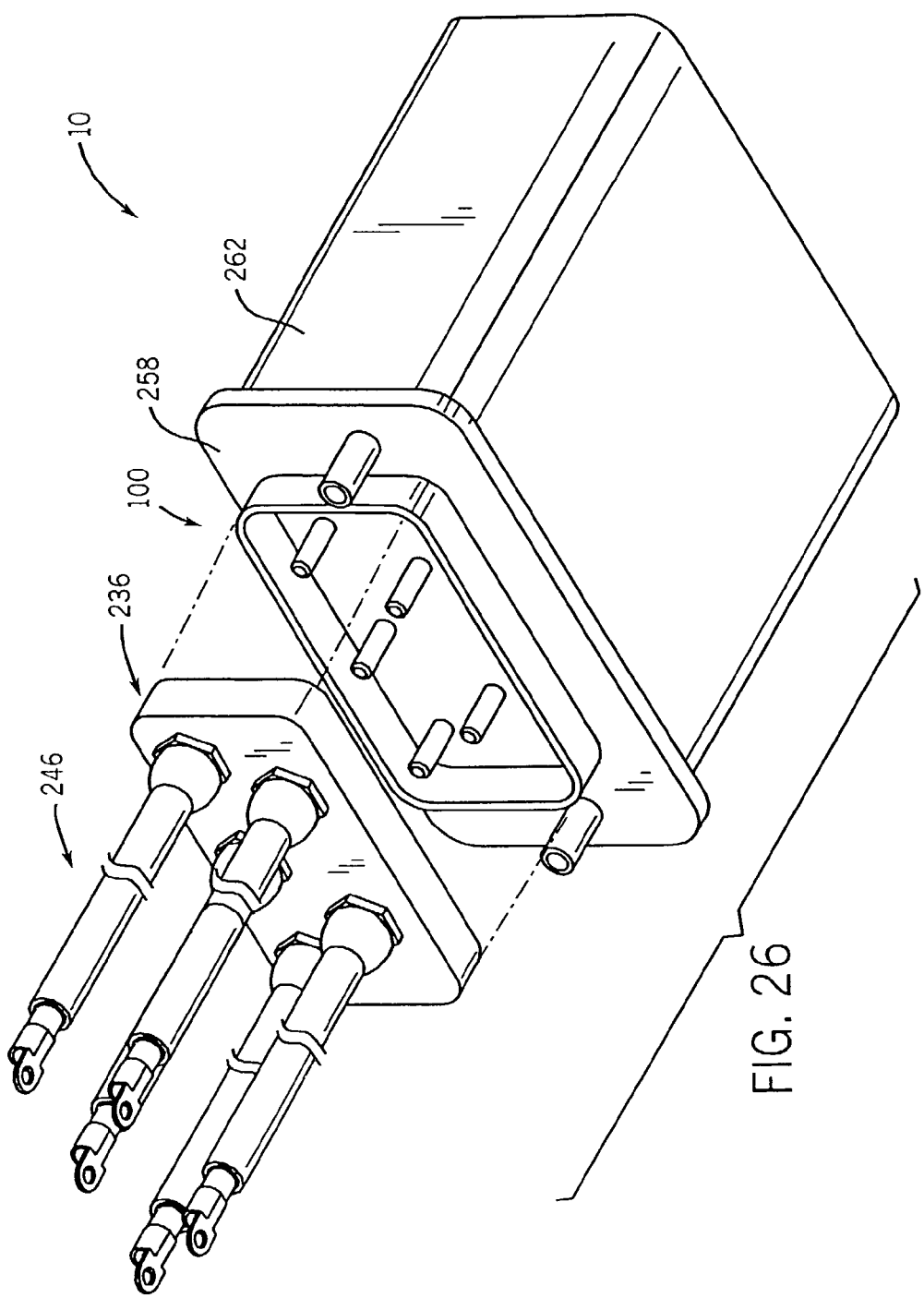
FIG. 26 is a perspective view of the elements of FIG. 25 after mounting an assembly.

As mentioned above, various alternative configurations may be envisaged for the particular external packaging of the module, as well as for its shielding from stray EMI. FIGS. 25 and 26 illustrate exemplary alternative configurations based upon a drop-in design. As shown in FIG. 25, an interface plate 258 may be provided, as an example, with interconnections made directly to a rear surface of the interface plate. The configuration of the module 10 may generally follow the lines described above including fabrication about a thermal support 12. Coolant conduits 260 may be provided for routing coolant to and from the thermal support. In such cases, the coolant conduits may be routed directly through the interface plate 258. A canister-type housing 262 (see particularly FIG. 26, is provided which connects to interface plate 258 to surround, support and shield the module. Interconnections with the interface plate may then be made via a ganged-type connector 236 as illustrated in FIG. 26.

FIGS. 27A–27D represent exemplary techniques for joining the contacts with terminal strip 134 to circuits formed in the power electronic device subassembly 130. In the exemplary embodiment of FIG. 27A, stamped or similar contact members 266 are soldered or otherwise bonded to the device subassemblies 130 and extend to the terminal strip 148. The connective elements 166 may be soldered, welded, brazed, laser or E-beam welded, conductively adhesively bonded, or electrically coupled in any other way to the device subassemblies 130 and to the terminal strip 134. Strain reliefs may be formed within stamped, coined, cut, or molded conductive elements of this type to provide an optimal section for the transmission of current. In the alternative illustrated in FIG. 27B, metal laminates, plastic metal tapes, multiple such tapes, electrical braids, ribbons, and the like, denoted generally by reference numeral 268 similarly extend between the circuits formed on the device subassembly 130 and the terminal strip 134. Electrical contact may also be provided via power assembly gas-tight pressure contact structures. Where desired, the separate elements of such tapes, ribbons or braids may be joined through a portion or their entire length, such as by resistance welding. In the further alternative illustrated in FIG. 27C, separate contact members 270 and 272 are provided on the device subassembly 130 and the terminal strip 134, and are joined to one another during assembly of the module. Each of the contact members may be formed by any appropriate method, such as by stamping or coining, and bonding or otherwise securing the contact members electrically and mechanically to the device subassembly and terminal strip. Finally, as illustrated in FIG. 27D, an extension 274 of a thermally conductive layer of the device subassemblies themselves may be provided for connection to the terminal strip 134. For example, in modules employing direct bond copper or direct bond aluminum, a conductor may be extended from an output terminal to the terminal strip. Stress relief may be provided as in the aforementioned arrangements, as well as selective patterning of the conductive layer of the device subassembly, where desired.

FIGS. 28A–28D illustrate alternative terminal and terminal assembly cooling arrangements. As mentioned above, both incoming and outgoing current may be passed through terminal strip 134. In use, heating within the terminal strip may occur and may be extracted through any appropriate arrangement, such as the arrangements illustrated in FIGS. 28A–28D. In a first exemplary arrangement shown in FIG.

28A, the terminal strip comprises one or more sections 276 and 278 which may be made of a thermally conductive, electrically insulating material that surrounds and supports the various conductive elements described above of the terminal strip. Examples of such materials might include ceramic-filled thermoplastics or liquid crystal polymers.

In the arrangement illustrated in FIG. 28B, a manifold 280 is formed for receiving a coolant, such as by interconnection with the coolant passages formed within the thermal support 12 as described above. The manifold serves to feed channels 282 which route coolant into and out of the terminal strip for cooling purposes. In the arrangement of FIG. 28C, a thermal extension 284 is provided which adds surface area to contact between the thermal support 12 and the terminal. The thermal extension 184 is designed to interface with a corresponding and similarly formed recess or groove 286 formed within the terminal strip 134. As will be appreciated by those skilled in the art, any suitable configuration or cross-sectional shape for the extension and recess may be provided. Similarly, as shown in FIG. 28D, an extension 288 may be formed in the terminal strip 134 and designed to interface with a corresponding groove or recess 290 formed within a portion of the thermal support 12.

FIGS. 29A and 29B represent alternative configurations for terminal plugs and connections useful in the various connection configurations described above. As shown in FIG. 29A, housing 94 is designed to surround conductor 108, while conductor 108 receives lead conductor 246 when the connector is made up. Housing 242 is provided on the mating connector 236 and at least partially surrounds the lead conductor 246. An electrically insulating body 292 is provided within the housing 94 around the conductor 108. A wire shield and ground connection 294 is provided within the housing 242, while an insulating member 295 is provided between the connection 294 and the lead conductor 246. The resulting assembly provides for both a good electrical connection of the conductor of the module and the mating connector, as well as the offering EMI shielding and continuity of shielding between the connector and the module. FIG. 29B represents a similar arrangement, but wherein a conductive receptacle shell 298 is formed to interface with the flange 244 of the connector housing 242.

FIGS. 30A–30C illustrate alternative power device substrate mounting and heat exchanging configuration for use in a module of the type described above. In the embodiment of FIG. 30A, an interface 300 is provided as described above for transmitting thermal energy from the power electronic device subassembly 130 through the interface plate 148. As shown in FIG. 30B, various arrangements may be provided for installing two or more power electronic device subassemblies 130 on a common thermal support 12. For example, two such arrangements are illustrated in FIG. 30B, including channels 152 for conveying cooling fluid through the support. In one exemplary configuration, pins 160 extend from an interface plate 148 and are cooled by fluid flowing through one of the channels 152. In another exemplary configuration shown in FIG. 30B, a heat dissipation element 174 is disposed in a channel for similarly removing heat. The plate 148 may be attached by any suitable method, such as soldering, brazing, welding, or via adhesive and gaskets to provide adequate sealing. The heat exchanger base module defined by the support may be made of any conductive metal or polymer or can be made of a variety of non-conductive materials such as thermoplastics, thermoset plastics, epoxy cast structures, and so forth. Also shown in FIG. 30B, an insert molded seal flange 302 may be provided for enhancing the seal between the interface plate and the thermal support 12. Such seal flanges may be made by any suitable process, such as injection, compression, casting, vacuum casting, adhesive attachment, and so forth. The flange may be bonded during molding or as a secondary step into the thermal base, such as at an edge, flange or lip so as to seal against the opening provided in the thermal support for this purpose. As shown in FIG. 30C, a specially adapted interface surface 304 may be provided for receiving a device subassembly and interface plate assembly. Where provided, pins 160 or similar heat dissipation elements may extend through especially provided apertures 306 within the thermal support. Again, a sealing element 162 may be provided around the interface plate for sealing against the thermal support.

Figure 31A:
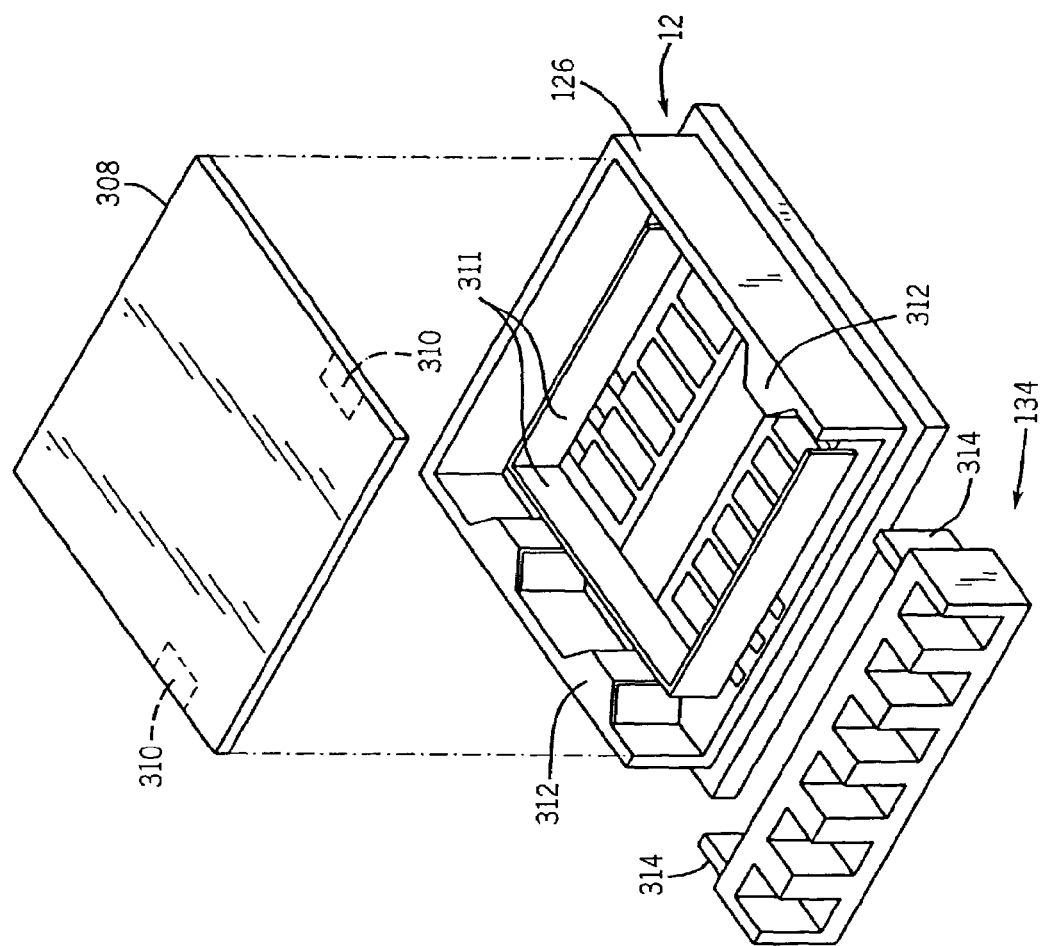
Figure 31B:
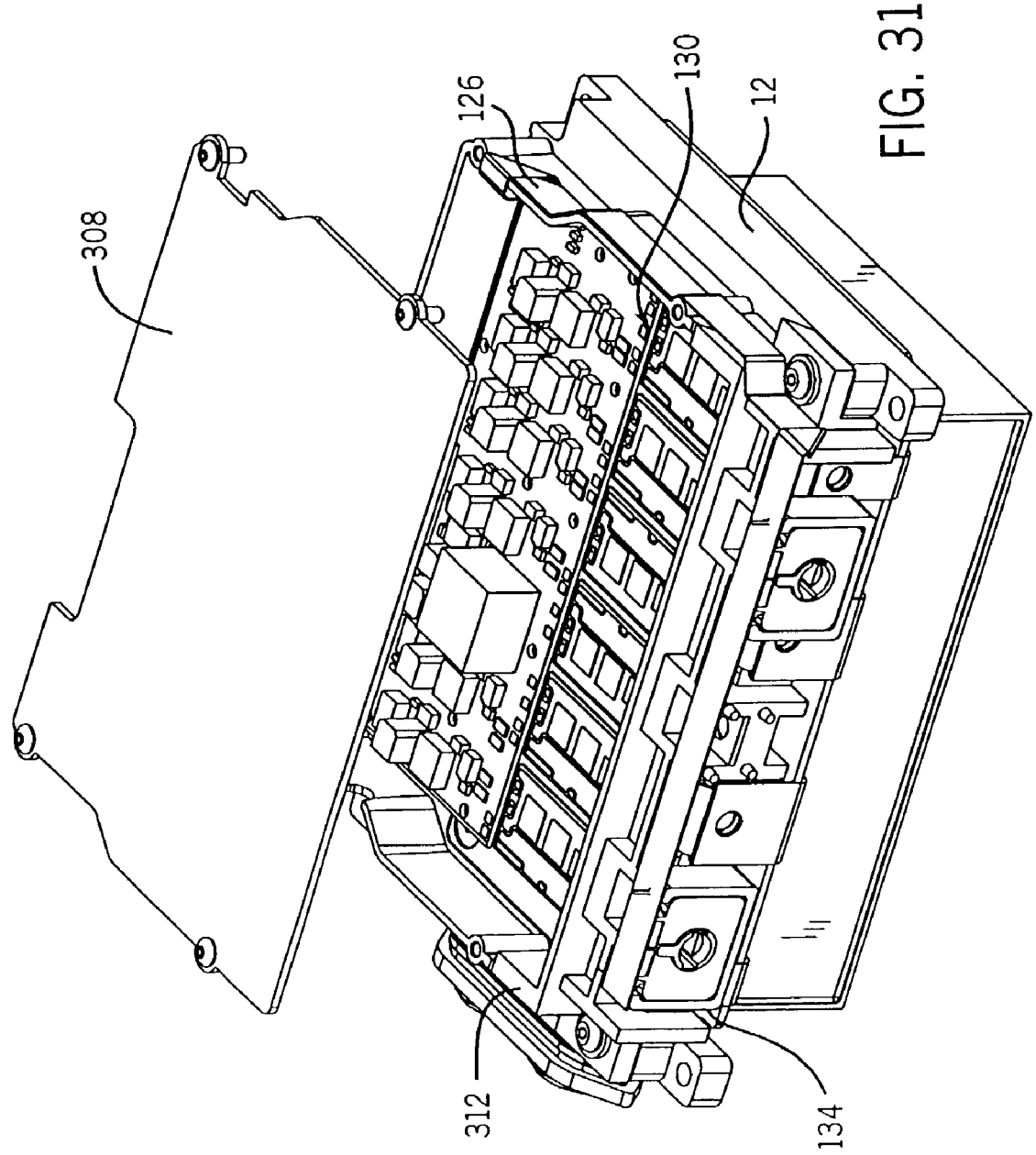
FIG. 31B is an exploded perspective view of an exemplary implementation of such an arrangement.

FIGS. 31A and 31B represent exemplary configurations for a low inductance shield and ground arrangement for use in a module of the type described above. In the arrangement shown in FIG. 31A, a thermal support 12 includes a partial peripheral flange 126 as described above. Low inductance paths for metal shielding may be formed as indicated at reference numerals 310, 312 and 314, with the paths 310 being provided on a cover 308 designed to be fitted to the thermal support. The ground paths may be made of any suitable material, such as metallized polymers or may comprise metal or other conductive elements molded into polymeric materials at specific locations as desired. The paths may be defined from intrinsic thinning of metal sections of castings and by shaping contact areas for low inductance. Moreover, the paths may be specifically shaped to provide high frequency power ground contacts, and the paths may be brought into areas adjacent to the switch substrates. Laminated bus sections 311 may be provided that defines connections between the high frequency capable conduction paths. Bonding tabs 313 may provide for connection between the bus and the device substrates. Through the use of such shielding approaches, the shell or housing for the overall module may be made of metals, plastics (including thermoplastics), or any other suitable material or combination of materials.

FIG. 31B illustrates the power electronic device subassemblies 130 disposed within an exemplary arrangement of the type shown in FIG. 31A. The cover 308, which acts as an EMI shield plate is placed over the subassemblies, which constitutes combined gate driver circuitry and control board circuitry in the illustrated embodiment. Mechanical connection and electrical paths are defined by fasteners used to secure the cover to the support 12.

Figure 32A:
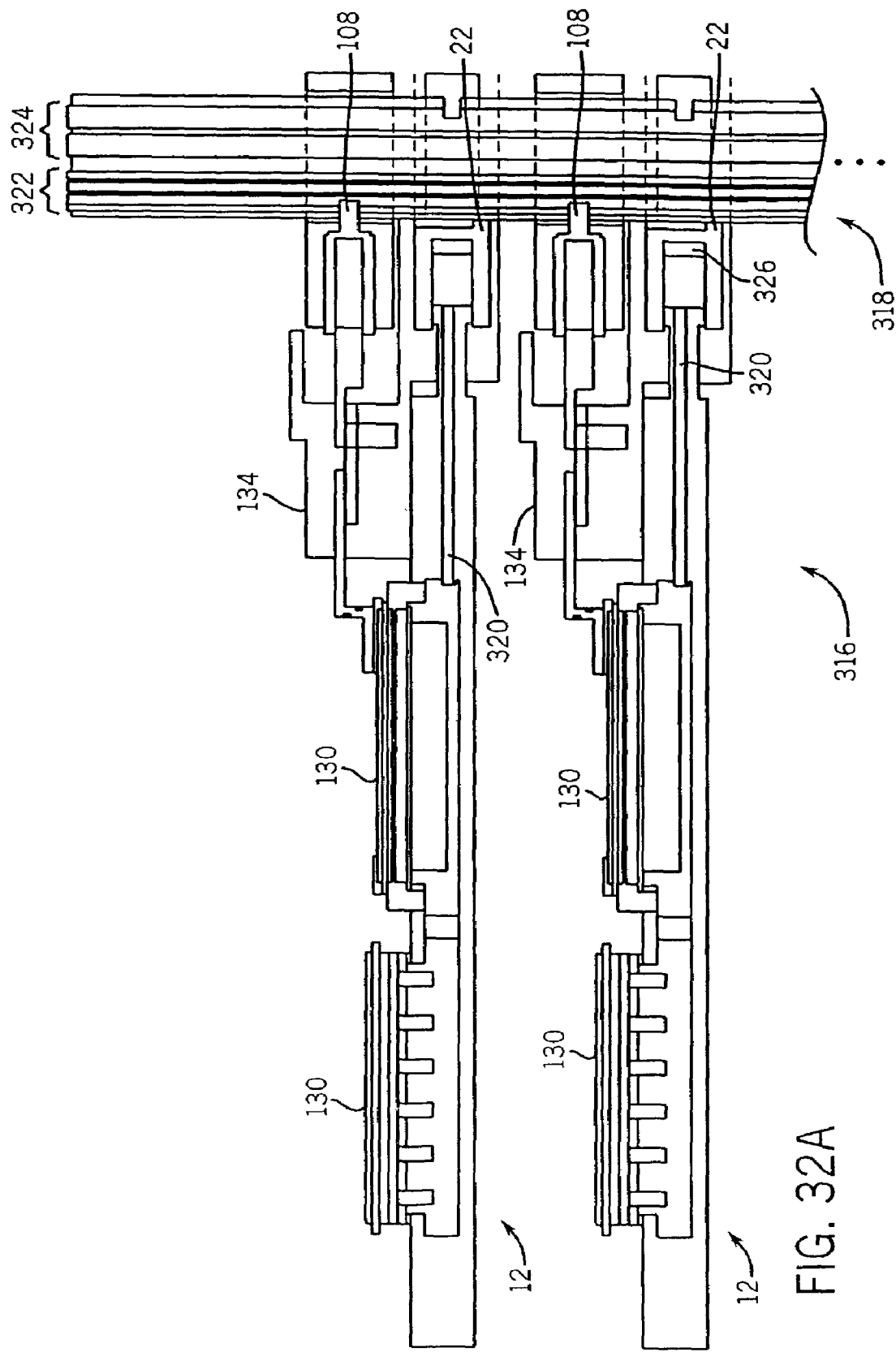
Figure 33:
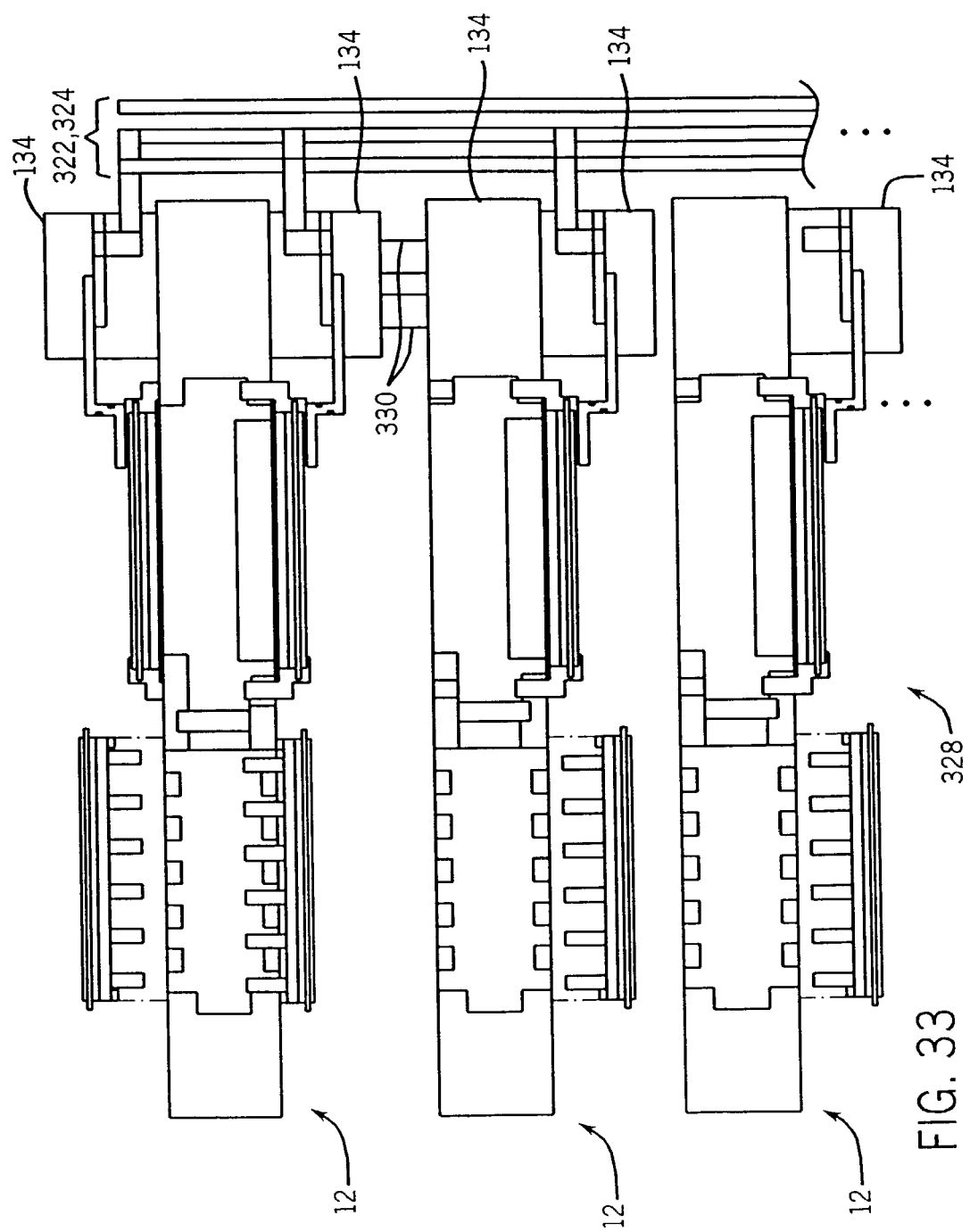
FIG. 33 is a further alternative plug-in arrangement incorporating such modules.

FIGS. 32A and 32B, and FIG. 33 illustrate alternative exemplary configurations for plug-in modules in arrangements accommodated by backplane configurations. As shown in FIG. 32A, modules comprised of thermal supports 12 and power electronic device subassemblies 130 are coupled to terminal strips 134, with conductors 108 being electrically coupled to parallel backplane conductors represented generally at reference numeral 322. The backplane conductors may route power to and from the modules once these are plugged into or otherwise coupled to the backplane. The backplane represented generally by reference numeral 318 in FIG. 32A, may also provide for connections to coolant streams. In the embodiment illustrated in FIG. 32A, for example, a coolant backplane connection adapter 326 serves to interface the inlet and outlet ports of the thermal supports with coolant supply lines 324 provided in the backplane. The individual modules, then, may be plugged into the backplane and connected for independent or joint operation in a larger system. An exemplary physical implementation of a modular unit for such backplane configurations is shown in FIG. 32B, based generally upon the arrangement shown in FIG. 25. Handles may be provided on the package for facilitating insertion and removal, while connections may be provided on a single side for completing all necessary interconnects to external circuitry. Moreover, sealed coolant conduits may be provided for interconnecting to the coolant supply lines of the backplane. The connections may be extended at different lengths or designed in alternative manners, such as to ensure making or breaking of certain connections before or after others during installation or removal. These might include, but are not limited to, ultra-fast turnoff and ultra-fast "crowbar" function.

In the embodiment illustrated in FIG. 33, three such modules are provided in a similar arrangement and are similarly coupled to the backplane conductors 322 and coolant supply lines 324. However, as shown in FIG. 33, fluid connections may also be provided between the modules as represented at reference numeral 330 to facilitate parallel or series flow of coolant among the various modules mounted on the backplane.

Figure 34:
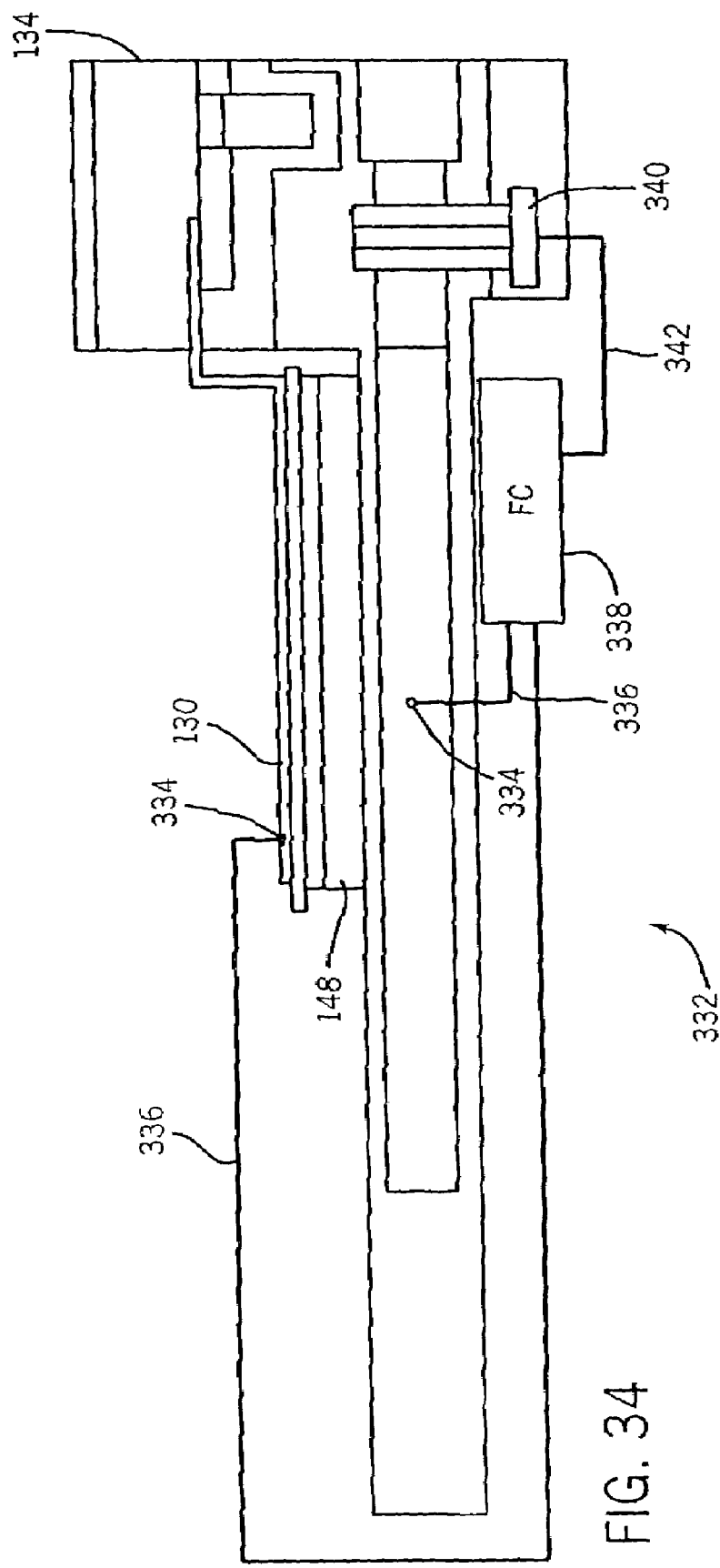
FIG. 34 is a diagrammatical representation of a module of the type illustrated in the previous Figures incorporating flow control circuitry for regulating the flow of coolant into and from the module.

To enhance thermal control in modules of the type described above, various fluid flow controls may be incorporated into the structures as illustrated generally in FIG. 34. The flow control system, indicated generally by reference numeral 332, may include various sensors 334 which detect local temperatures at various locations around the power electronic device subassembly 130 and at other locations in the system. Input lines 336 feed signals representative of the temperatures to a flow control circuit 338. The flow control circuit 338 regulates the flow of coolant to and from the module via a flow control valve 340 coupled to the flow control circuit via an output line 342. Thus, closed-loop temperature control may be provided in the module so as to optimize coolant flow and to minimize variations in thermal cycling, thereby enhancing the life of the power electronic components within the device subassembly 130.

Figure 35B:
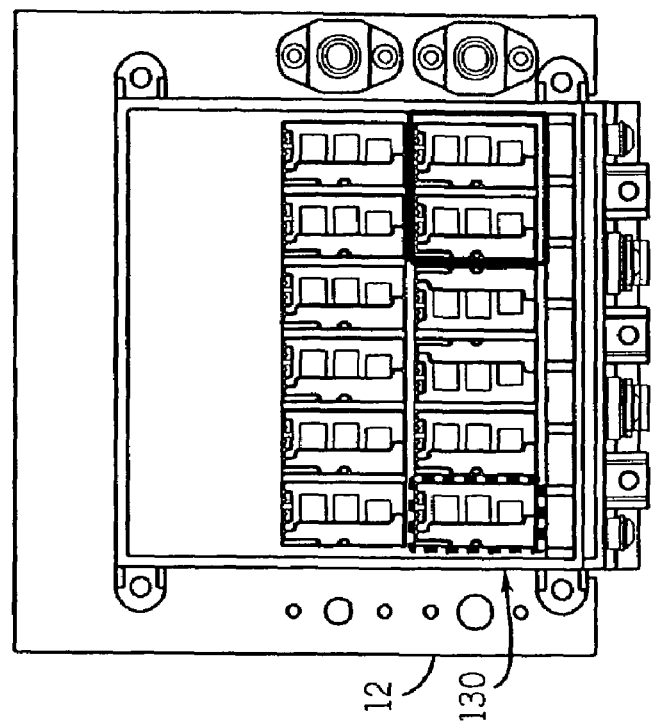
FIGS. 35A–35C are diagrammatical views of circuits and physical layouts of components for a converter arrangement employing aspects of the present technique.
Figure 35A:
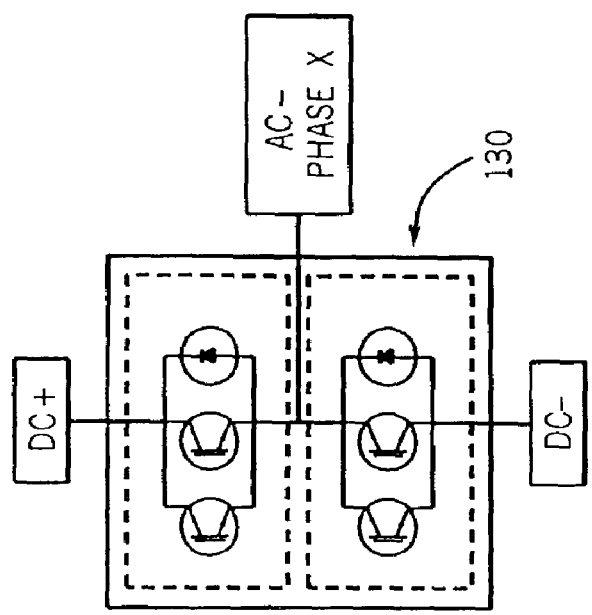
Figure 35C:
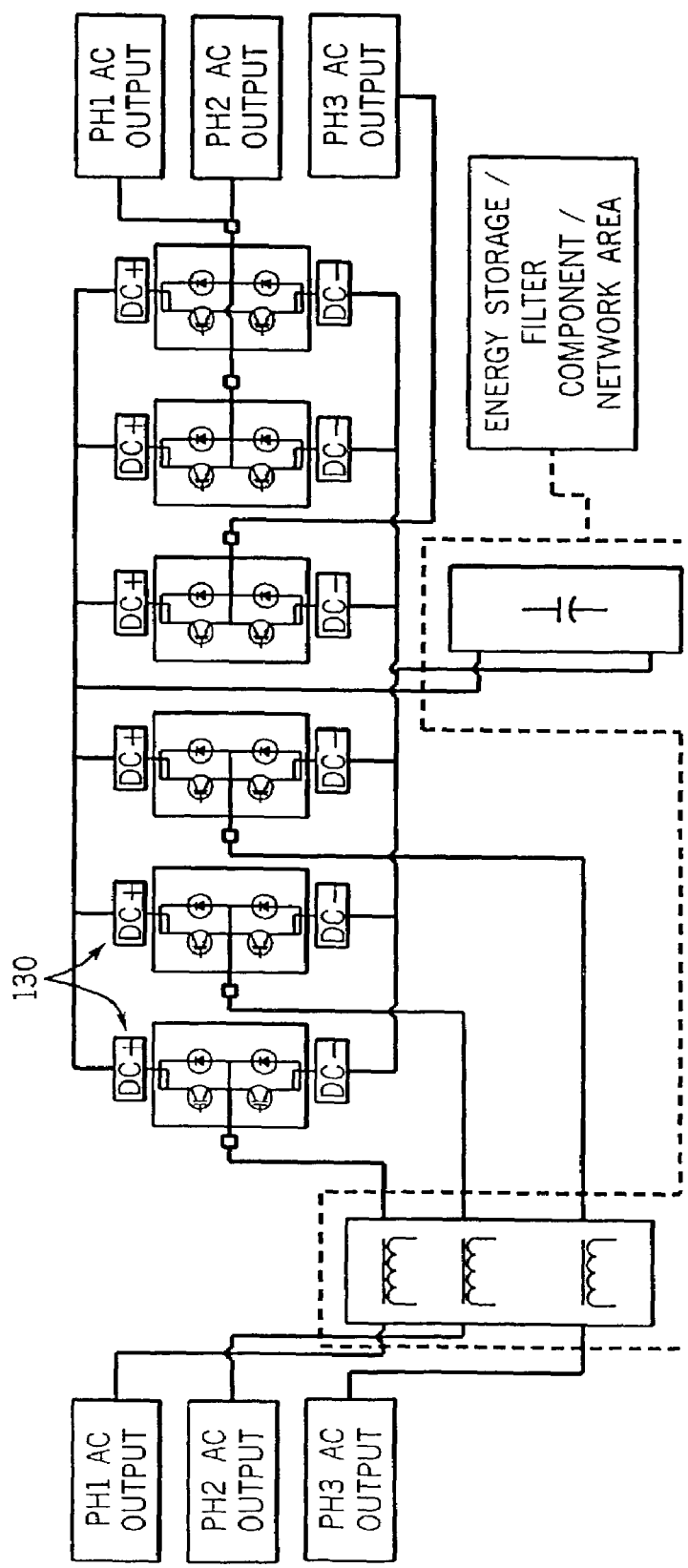

As noted above, a wide range of circuits may be accommodated that may benefit from the various configurations described above. In particular, as mentioned above, various types of converter circuits may be supported on the thermal support and connected, cooled, shielded and so forth as described. FIGS. 35A–35C illustrate exemplary configurations for circuitry which may define AC-AC converters, voltage source converters, synchronous rectifiers and similar topologies. In FIG. 35A, a device subassembly 130 comprises a series of solid state switches and diodes coupled to a DC source in half bridges. The individual subassemblies 130 are mounted on a thermal support 12 as described above, and as shown in FIG. 35B. Electrically, the subassemblies 130 may be connected to circuitry for producing controlled AC output signals, as illustrated in FIG. 35C.

Figures 36A, 36C:
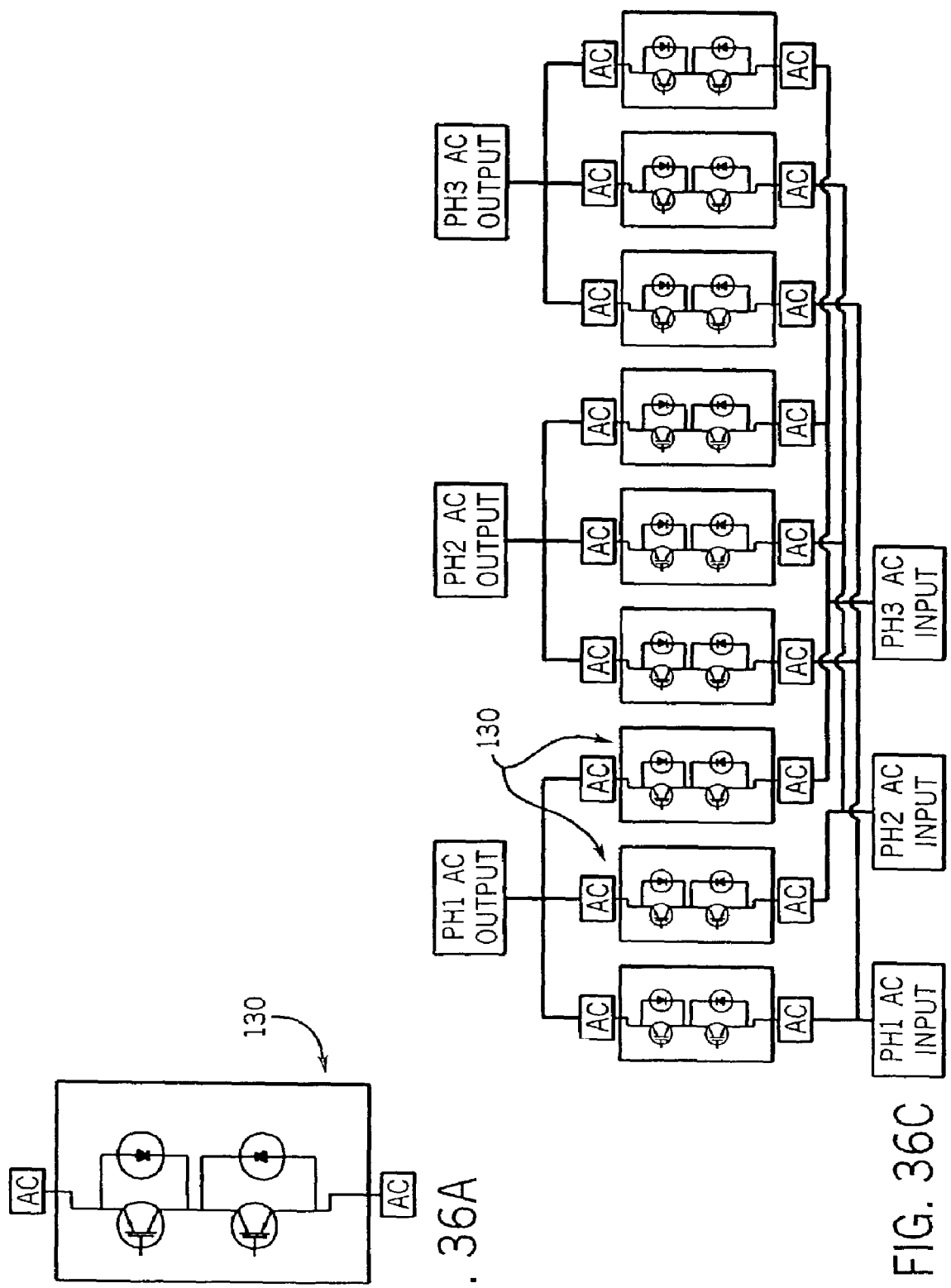
FIGS. 36A–36C are diagrammatical views of circuits and physical layouts of components for a matrix switch topology implementation of aspects of the present technique.
Figure 36B:
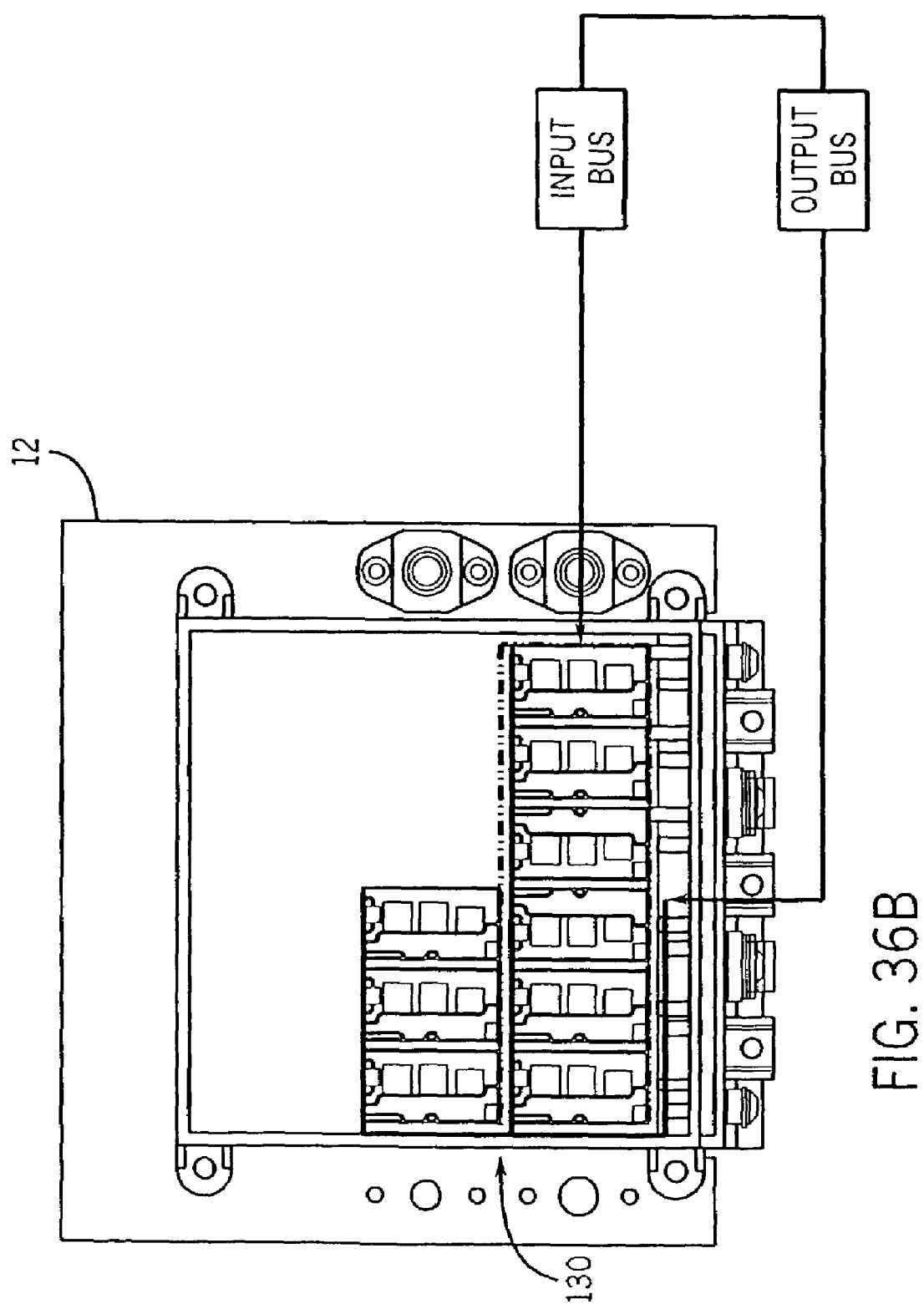

Also as noted above, another type of circuitry which may be accommodated in the arrangements described are AC-AC converters, matrix switch topologies of the type illustrated in FIGS. 36A–36C. As shown, in such topologies each device subassembly includes a pair of switch and diode sets coupled to an AC power source. FIG. 36B illustrates a three phase implementation of such subassemblies mounted to a thermal support 12 as described above. An input bus and an output bus are coupled to the subassemblies for routing of input and output power signals. As shown in FIG. 36C, in the three phase implementation, phase inputs and outputs are electrically coupled to the subassemblies to produce the desired power output.

It should be noted that, while certain three-phase topologies are discussed herein, the present technique may extend to single phase and other arrangements. Such arrangements may accommodate applications such as mid-frequency welding applications. Such applications may incorporate a high frequency transformer rather than certain of the capacitors disposed on the thermal support. The circuitry supported on and thermally serviced by the support then becomes somewhat modular between application-specific designs.

Figure 37:
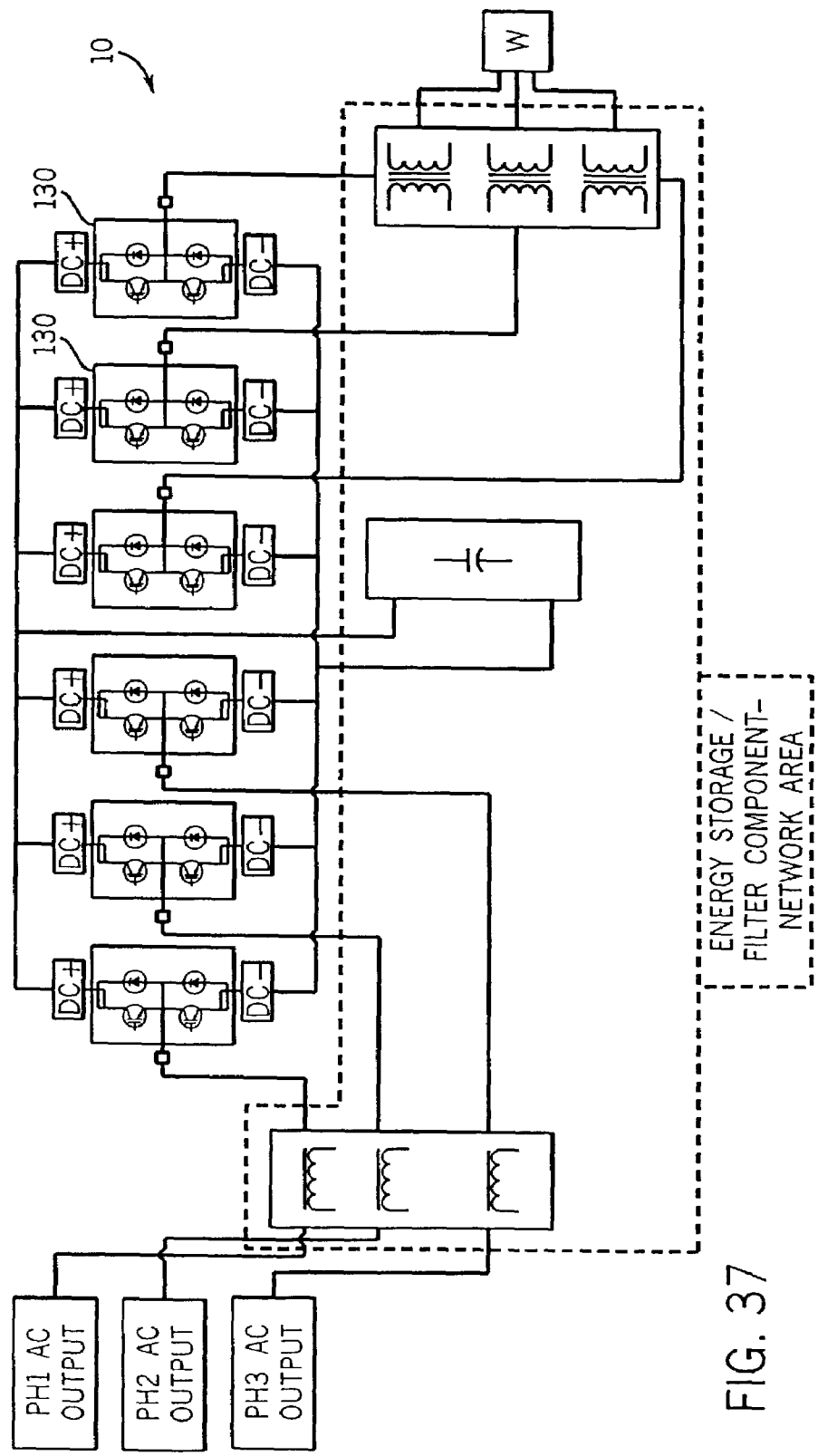
FIG. 37 is a further diagrammatical view of a circuit in accordance with the passing technique adapted for supply of power for a mid-frequency welding application.

FIG. 37 illustrates an exemplary circuit for one such application, in this case a mid-frequency welding implementation. As will be appreciated by those skilled in the art, in such applications, circuits 130 include pairs of solid state switches and diodes. The circuits are coupled through sources of power by the intermediary of transformers. Additional transformers are provided for output, such to a welding head. As in the previous examples, both the circuits and the energy storage and transforming circuitry may be supported and cooled by the thermal support and related techniques described above.

Figure 38A:
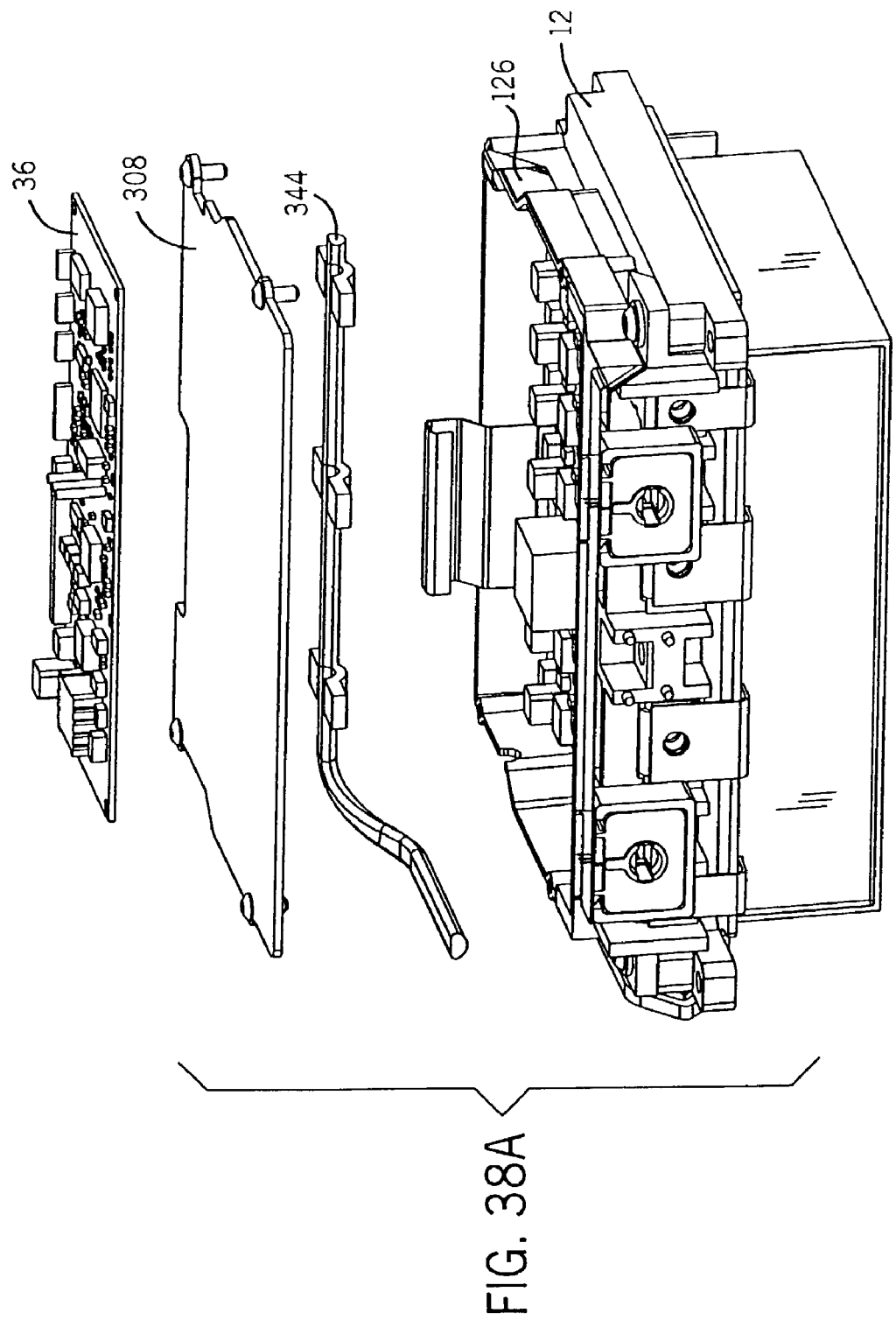

FIGS. 38A and 38B represent further alternative configurations in which cooling may be provided at locations removed from the thermal support itself. As shown in FIG. 38A thermal support 12 supports circuitry within a peripheral flange 126 as described above. Circuitry may be mounted to both sides of the thermal support 12 as previously described. Moreover, a cover 308 is provided, such as for providing the EMI shielding as described above. In the embodiment illustrated in FIG. 38A, a circuit board is mounted outside the primary cavity in which other circuitry is mounted. In the illustrated embodiment, the circuit board comprises a control circuit board 36. Because the cooling requirements of certain of the circuitry, such as the control circuit board 36, may be less stringent than those of the other circuitry, such components may be mounted remote from the thermal support 12. However, additional cooling for such circuitry can nevertheless be provided, such as the heat pipes of the type illustrated in FIG. 38A and designated generally by the reference numeral 344. As will be appreciated by those skilled in the art, such heat pipes will typically comprise thermally conductive materials which are extended into contact with the inlet and/or outlet of the coolant stream. Conduction of heat along the heat pipe 344 then permits removal of heat from the circuitry mounted on board 36. FIG. 38B illustrates the same arrangement following assembly. An appropriate jumper cable 346 may be provided for channeling signals and power to and from the circuit board 36.

While the invention may be susceptible to various modifications and alternative forms, specific embodiments have been shown in the drawings and have been described in detail herein by way of example only. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A modular power converter comprising:
   a power electronics circuit configured to generate controlled output power; and
   an electrical and thermal subassembly to which the power electronics circuit is directly mounted, the subassembly including a fluid diverting means to direct cooling fluid into contact with a interface on which the power electronics circuit is supported and a flow regulating element to provide regulation of temperature of the power electronics circuit in a closed-loop manner.

2. The modular power converter of claim 1, wherein the power electronics circuit includes solid state switches configured to bi-directionally or uni-directionally convert incoming power to controlled outgoing power.

3. The modular power converter of claim 2, wherein a first portion of the power electronics circuit is supported on a first side of the subassembly and a second portion of the power electronics circuit is supported on a second side of the subassembly opposite the first side.

4. The modular power converter of claim 1, wherein the subassembly includes inlet and outlet ports for a cooling fluid and an internal fluid conduit for directing flow of cooling fluid adjacent to the power electronics circuit for removal of heat.

5. The modular power converter of claim 4, comprising an interface on which the power electronics circuit is secured, the interface contacting cooling fluid flowing through the internal fluid conduit during operation to convectively and conductively remove heat from the power electronics circuit.

6. The modular power converter of claim 5, wherein the interface includes a plate supporting a plurality of solid state switches or power conversion devices directly secured thereto.

7. The modular power converter of claim 6, wherein the solid state switches or power conversion devices are bonded to the plate.

8. The modular power converter of claim 6, wherein the solid state switches or power conversion devices are mechanically mounted to the interface.

9. The modular power converter of claim 5, wherein the interface includes a plurality of heat exchange surfaces extending into the internal fluid conduit.

10. The modular power converter of claim 9, wherein the heat exchange surfaces are generally pin shaped.

11. The modular power converter of claim 5, wherein the fluid diverting means includes a diverter disposed within the internal fluid conduit to control flow of cooling fluid.

12. The modular power converter of claim 5, further comprising a heat exchanging element disposed in the internal fluid conduit.

13. The modular power converter of claim 12, wherein the heat exchanging element is secured to the interface.

14. The modular power converter of claim 5, wherein the interface is removably secured to the subassembly.

15. The modular power converter of claim 1, further comprising a flow control valve for regulating flow of cooling fluid through the internal fluid conduit.

16. The modular power converter of claim 15, further comprising at least one sensor for detecting temperature of a portion of the converter, and wherein the sensor is coupled to the flow control valve for closed loop control of flow of cooling fluid through the internal fluid conduit.

17. A modular power converter support, the support comprising:
a substrate having inlet and outlet ports and a circulation path coupled between the inlet and outlet ports, the inlet and outlet ports being configured to transmit a coolant for circulation through the circulation path, the substrate being made of a first material;
an interface plate configured to directly support a power electronics circuit and to be secured to the substrate, the interface plate having integral heat dissipation elements extending therefrom configured to extend into the coolant circulation path when the interface plate is mounted to the substrate for extraction of heat from the interface plate during operation, the interface plate being made of a second material different from the first material;
a flow control valve for regulating flow of cooling fluid through the coolant circulation path; and
at least one sensor for detecting temperature, wherein the sensor is coupled to the flow control valve for closed loop control of flow of cooling fluid through the coolant circulation path.

18. The support of claim 17, comprising a plurality of interface plates configured to be secured to the substrate and to contact coolant circulating therethrough during operation.

19. The support of claim 18, wherein the substrate is configured to receive the interface plates on different sides thereof.

20. The support of claim 19, wherein the different sides include mutually opposed sides of the substrate.

21. The support of claim 17, wherein the interface plate supports a plurality of solid state switches bonded thereto.

22. The support of claim 17, wherein the interface plate includes a plurality of heat exchange surfaces extending into the internal fluid conduit.

23. The support of claim 22, wherein the heat exchange surfaces are generally pin shaped.

24. The support of claim 22, wherein the substrate includes a plurality of heat exchange surfaces configured to cooperate with the heat exchange surfaces of the interface plate for heat transfer.

25. The support of claim 24, wherein the heat exchange surfaces of the interface plate and of the substrate are generally pin shaped.

26. The support of claim 17, further comprising a diverter disposed within the coolant circulation path to control flow of cooling fluid therethrough.

27. The support of claim 26, wherein the diverter directs flow of cooling fluid into toward the interface plate.

28. The support of claim 17, further comprising a heat exchanging element disposed in the coolant circulation path.

29. The support of claim 28, wherein the heat exchanging element is secured to the interface plate.

30. The support of claim 17, wherein the interface plate is removably secured to the substrate.

31. A modular power converter comprising:
a controlled power electronics circuit including solid state switches configured to convert incoming power to controlled outgoing power;
a fluid cooled support for supporting at least the power electronics circuit, the fluid cooled support including inlet and outlet ports for a cooling fluid and an internal fluid conduit for directing flow of cooling fluid adjacent to the power electronics circuit for removal of heat therefrom; and
an interface on which the power electronics circuit is secured, the interface contacting cooling fluid flowing through the internal fluid conduit during operation to convectively remove heat from the power electronics circuit; and wherein the fluid cooled support includes a fluid diverting means to direct cooling fluid into contact with the interface.

32. The modular power converter of claim 31, wherein the interface includes a plate supporting a plurality of solid state switches bonded thereto.

33. The modular power converter of claim 31, wherein the interface includes a plurality of heat exchange surfaces extending into the internal fluid conduit.

34. The modular power converter of claim 33, wherein the heat exchange surfaces are generally pin shaped.

35. The modular power converter of claim 33, wherein the support includes a plurality of heat exchange surfaces configured to cooperate with the heat exchange surfaces of the interface for heat transfer.

36. The modular power converter of claim 35, wherein the heat exchange surfaces of the interface and of the support are generally pin shaped.

37. The modular power converter of claim 31, wherein the fluid diverting means includes a diverter disposed within the internal fluid conduit to control flow of cooling fluid therethrough.

38. The modular power converter of claim 33, further comprising a heat exchanging element disposed in the internal fluid conduit.

39. The modular power converter of claim 38, wherein the heat exchanging element is secured to the interface.

40. The modular power converter of claim 33, wherein the interface is removably secured to the support.

41. The modular power converter of claim 33, further comprising a flow control valve coupled to the support for regulating flow of cooling fluid through the internal fluid conduit.

42. The modular power converter of claim 41, further comprising a sensor for detecting temperature of a portion of the converter, and wherein the sensor is coupled to the flow control valve for closed loop control of flow of cooling fluid through the internal fluid conduit.

43. A modular power converter comprising:
a plurality of controlled power electronics circuits including solid state switches configured to convert incoming power to controlled outgoing power;
a fluid cooled support for supporting at least the power electronics circuits, the fluid cooled support including inlet and outlet ports for a cooling fluid and an internal fluid conduit for directing flow of cooling fluid adjacent to the power electronics circuits for removal of heat therefrom;
a plurality of interfaces on which the respective power electronics circuits are secured, the interfaces contacting cooling fluid flowing through the internal fluid conduit during operation to convectively remove heat from the power electronics circuit; and
a diverter disposed within the internal fluid conduit to control flow of cooling fluid therethrough.

44. The modular power converter of claim 43, wherein the power electronic circuits are supported on opposing sides of the support.

45. The modular power converter of claim 44 wherein each interface includes a plate supporting a plurality of solid state switches bonded thereto.

46. The modular power converter of claim 44, wherein each interface includes a plurality of heat exchange elements extending into the internal fluid conduit.

47. The modular power converter of claim 46, wherein the heat exchange elements are generally pin shaped.

48. The modular power converter of claim 43, further comprising a heat exchanging element disposed in the internal fluid conduit.

49. The modular power converter of claim 43, wherein each interface is removably secured to the support.

50. The modular power converter of claim 43, further comprising a flow control valve coupled to the support for regulating flow of cooling fluid through the internal fluid conduit.

51. The modular power converter of claim 43, further comprising at least one sensor for detecting temperature of a portion of the converter, and wherein the sensor is coupled to the flow control valve for closed loop control of flow of cooling fluid through the internal fluid conduit.

52. A modular power converter comprising:
a controlled power electronics circuit including solid state switches configured to convert incoming power to controlled outgoing power;
a fluid cooled support for supporting at least the power electronics circuit, the fluid cooled support including inlet and outlet ports for a cooling fluid and an internal fluid conduit for directing flow of cooling fluid adjacent to the power electronics circuit for removal of heat therefrom;
an interface on which the power electronics circuit is secured, the interface contacting cooling fluid flowing through the internal fluid conduit during operation to convectively remove heat from the power electronics circuit;
a flow control valve coupled to the support for regulating flow of cooling fluid through the internal fluid conduit; and
a diverter disposed within the internal fluid conduit to control flow of cooling fluid therethrough.

53. The modular power converter of claim 52, further comprising a sensor for detecting temperature of a portion of the converter, and wherein the sensor is coupled to the flow control valve for closed loop control of flow of cooling fluid through the internal fluid conduit.

54. The modular power converter of claim 52, wherein the interface includes a plate supporting a plurality of solid state switches bonded thereto.

55. The modular power converter of claim 52, wherein the interface includes a plurality of heat exchange surfaces extending into the internal fluid conduit.

56. The modular power converter of claim 55, wherein the heat exchange surfaces are generally pin shaped.

57. The modular power converter of claim 52, wherein the diverter directs flow of cooling fluid into contact with the interface.

58. The modular power converter of claim 52, further comprising a heat exchanging element disposed in the internal fluid conduit.

59. The modular power converter of claim 58, wherein the heat exchanging element is secured to the interface.

60. The modular power converter of claim 52, wherein the interface is removably secured to the support.

61. A modular power converter comprising:
a substrate having inlet and outlet ports and a circulation path coupled between the inlet and outlet ports, the inlet and outlet ports being configured to transmit a coolant for circulation through the circulation path, the substrate being made of a first material;
an interface plate configured to support a power electronics circuit and to be secured to the substrate, the interface plate having integral heat dissipation elements extending therefrom configured to extend into the coolant circulation path when the interface plate is mounted to the substrate for extraction of heat from the interface plate during operation, the interface plate being made of a second material different from the first material, the interface plate further including a plurality of heat exchange surfaces extending into the internal fluid conduit; and
a diverter disposed within the coolant circulation path to control flow of cooling fluid therethrough.

62. The modular power converter of claim 61, wherein the heat exchange surfaces are generally pin shaped.

63. The modular power converter of claim 61, wherein the substrate includes a plurality of heat exchange surfaces configured to cooperate with the heat exchange surfaces of the interface plate for heat transfer.

64. The modular power converter of claim 63, wherein the heat exchange surfaces of the interface plate and of the substrate are generally pin shaped.

65. The modular power converter of claim 61, comprising a plurality of interface plates configured to be secured to the substrate and to contact coolant circulating therethrough during operation.

66. The modular power converter of claim 65, wherein the substrate is configured to receive the interface plates on different sides thereof.

67. The modular power converter of claim 66, wherein the different sides include mutually opposed sides of the substrate.

68. The modular power converter of claim 61, wherein the interface plate supports a plurality of solid state switches bonded thereto.

69. The modular power converter of claim 67, wherein the diverter directs flow of cooling fluid into toward the interface plate.

70. The modular power converter of claim 61, wherein the interface plate is removably secured to the substrate.

71. The modular power converter of claim 61, further comprising a flow control valve for regulating flow of cooling fluid through the coolant circulation path.

72. The modular power converter of claim 71, further comprising at least one sensor for detecting temperature, and wherein the sensor is coupled to the flow control valve for closed loop control of flow of cooling fluid through the coolant circulation path.

* * * * *